United States Patent
Maeno

(10) Patent No.: US 6,420,896 B1
(45) Date of Patent: Jul. 16, 2002

(54) SEMICONDUCTOR INTEGRATED CIRCUIT

(75) Inventor: Hideshi Maeno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/827,928

(22) Filed: Apr. 9, 2001

(30) Foreign Application Priority Data

Jul. 24, 2000 (JP) ........................................ 2000-222169

(51) Int. Cl.$^7$ ............................................ H03K 19/003
(52) U.S. Cl. ................................. 326/9; 326/10; 326/14
(58) Field of Search ................................. 326/9, 10, 14, 326/16, 38, 40, 46; 714/726, 729, 733, 719

(56) References Cited

U.S. PATENT DOCUMENTS 5,815,512 A * 9/1998 Osawa et al. ............. 371/22.31

FOREIGN PATENT DOCUMENTS

JP        8-094718       4/1996

* cited by examiner

Primary Examiner—Michael Tokar
Assistant Examiner—Anh Q. Tran
(74) Attorney, Agent, or Firm—Oblon, Spivak, McClelland, Maier & Neustadt, P.C.

(57) ABSTRACT

To provide a semiconductor integrated circuit having a redundancy-relieved data output function which can carry out a pass/fail test of a selecting operation of a redundancy-relieved output selecting circuit for redundancy-relieved output data. Data inputs D of scan flip-flops SFFC <i+3>, SFFC <i+2>, SFFC <i+1> and SFFC <i> are connected to redundancy-relieved output data XDO <i+3>, XDO <i+2>, XDO <i+1> and XDO <i> in place of output data DO <i+3>, DO <i+2>, DO <i+1> and DO <i> of a conventional RAM 211, respectively. An AND gate 21 receives a serial output SO <i+4> at one of inputs and receives a selector test signal PFIN at the other input, and an output thereof is sent to the other input of an AND gate 223. AND gates 221 to 223 to be connected in series receive serial outputs SO <i+1> to SO <i+3> of the SFFC <i+1> to the SFFC <i+3> at inputs, respectively.

13 Claims, 51 Drawing Sheets

F I G . 1
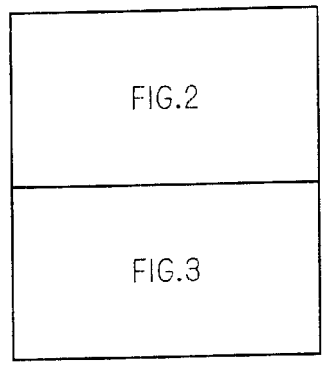
F I G . 2
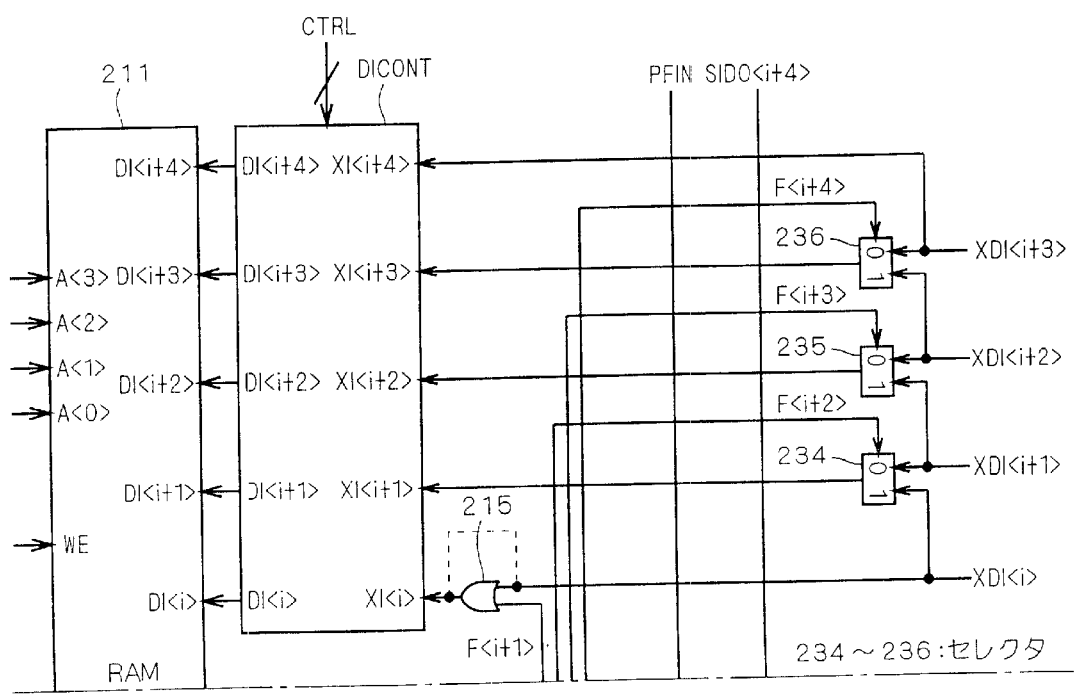

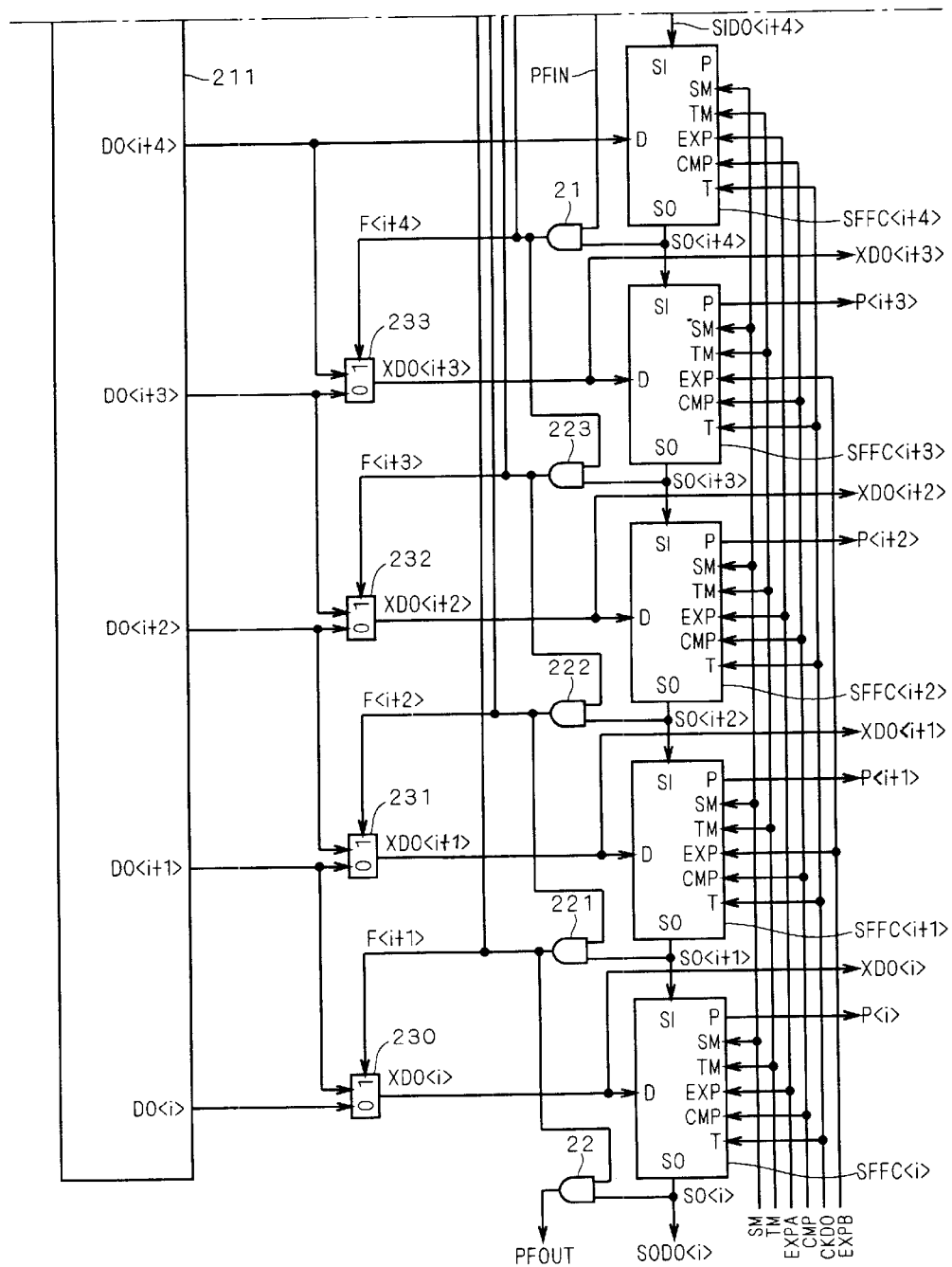
F I G . 3

F I G . 6
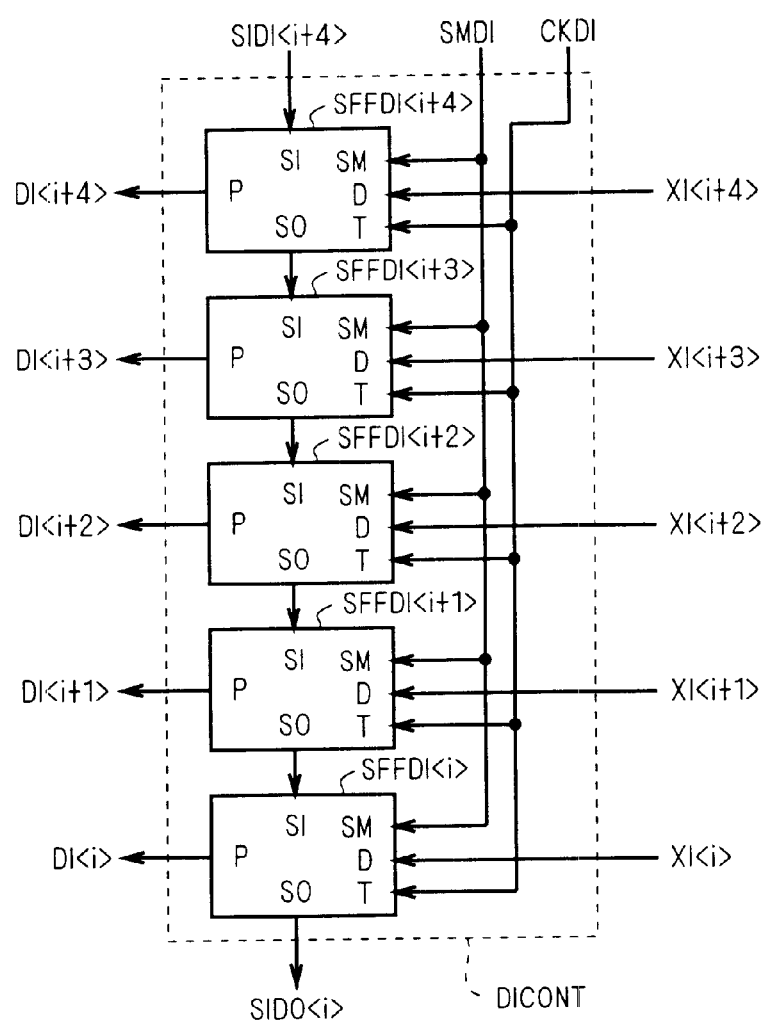

F I G . 1 0
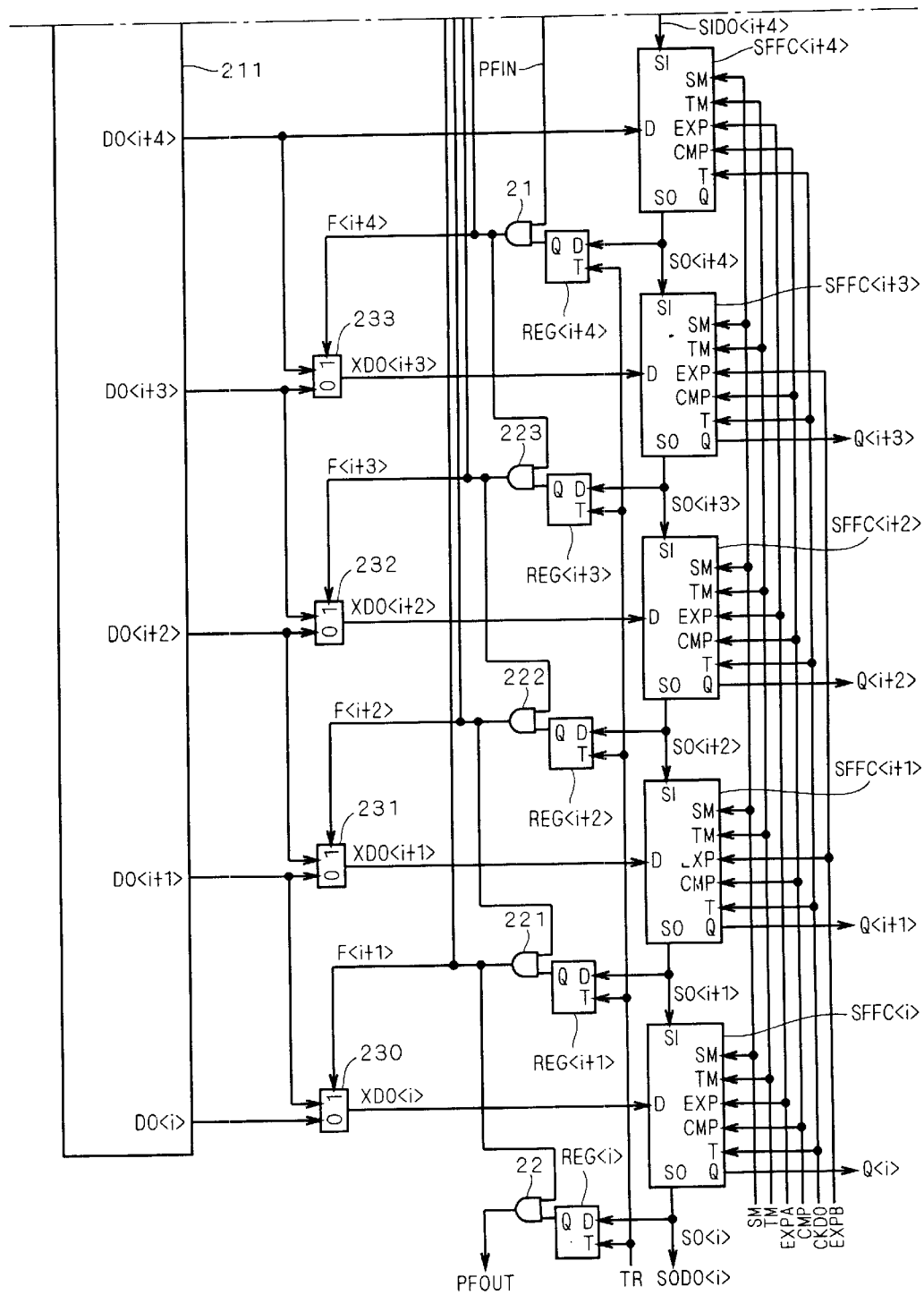

F I G . 1 3
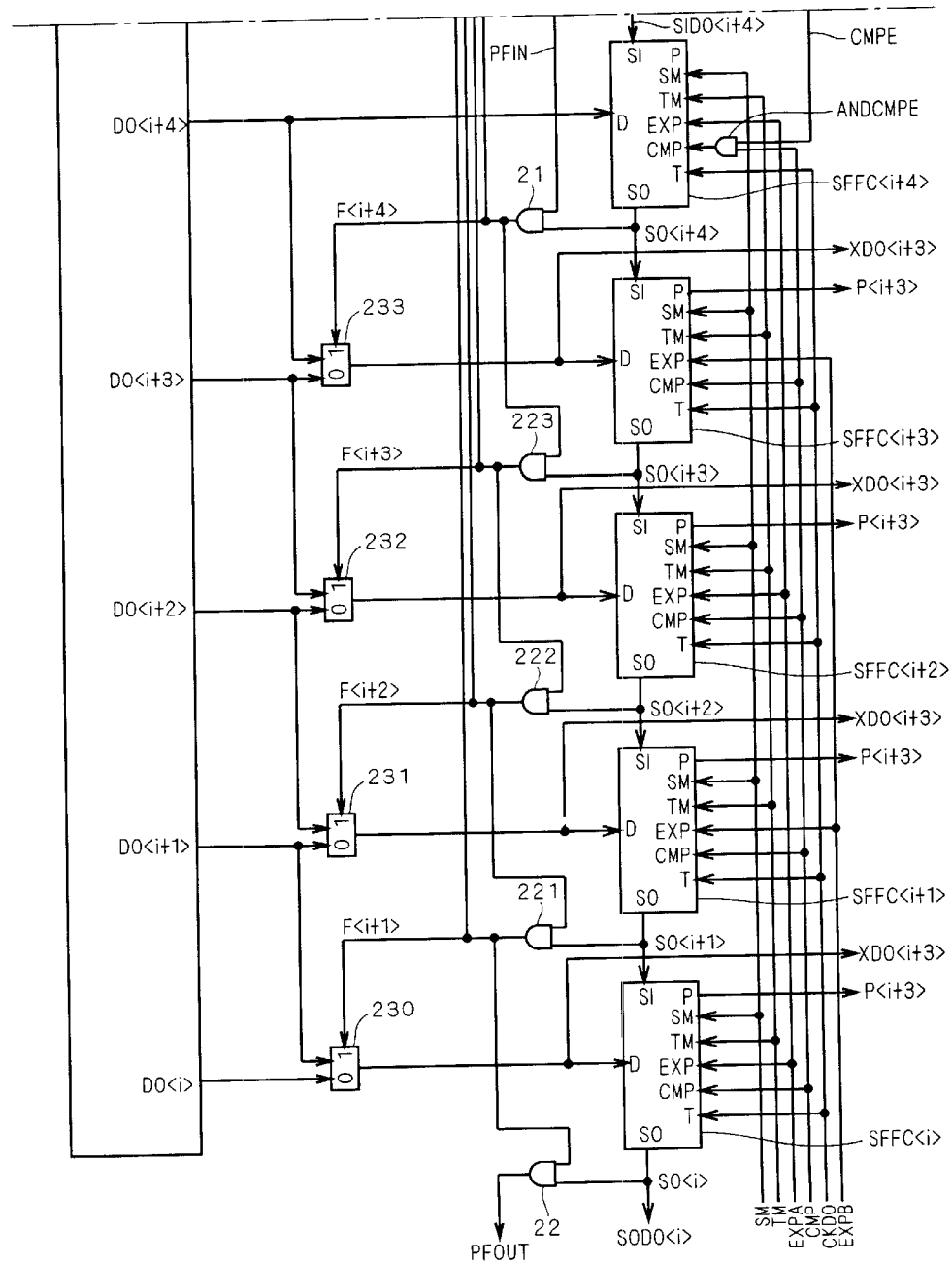

F I G. 17

| Mode | SM | TM | CMP | EXPA | ANDSI | EXPB | TMSI | TMFB | CMP0LA | CMP1LA | CMP0LB | CMP1LA |
|---|---|---|---|---|---|---|---|---|---|---|---|---|
| Normal | 0 | 0 | 0 | 0 | 0 | 0 | 1 | 1 | 1 | 0 | 1 | 0 |
| Shift | 1 | 0 | 0 | 0 | 0 | 0 | 0 | 1 | 1 | 1 | 1 | 1 |
| Hold | 1 | 1 | 0 | 0 | 0 | 0 | 1 | 0 | 1 | 1 | 1 | 1 |
| Compare | 1 | 1 | 1 | expa | 0 | expb | 1 | 0 | expa | $\overline{expa}$ | expb | $\overline{expb}$ |
| Shifting-Compare | 1 | 1 | 1 | expa | 1 | expb | 0 | 0 | expa | $\overline{expa}$ | expb | $\overline{expb}$ |
| Compare-Once | 1 | 0 | 1 | expa | 0 | expb | 1 | 1 | expa | $\overline{expa}$ | expb | $\overline{expb}$ |
| Set1 | 1 | 0 | 0 | 0 | 1 | 0 | 1 | 1 | 1 | 1 | 1 | 1 |

F I G . 2 4
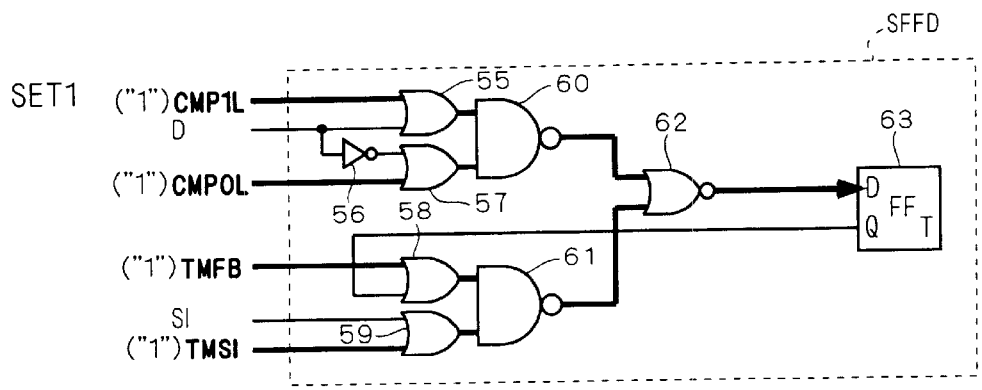

F I G . 2 8
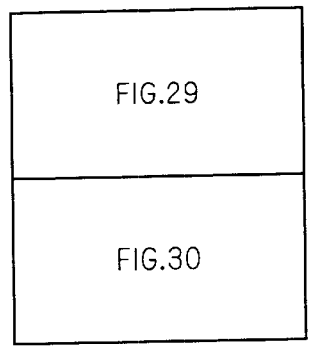
F I G . 2 9
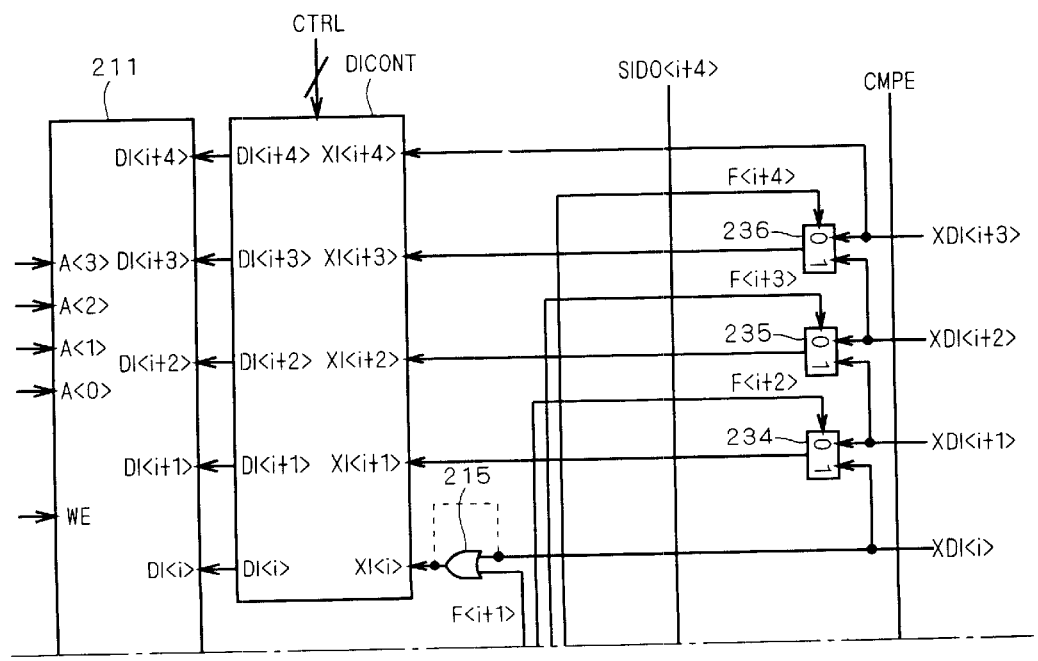

F I G . 4 7
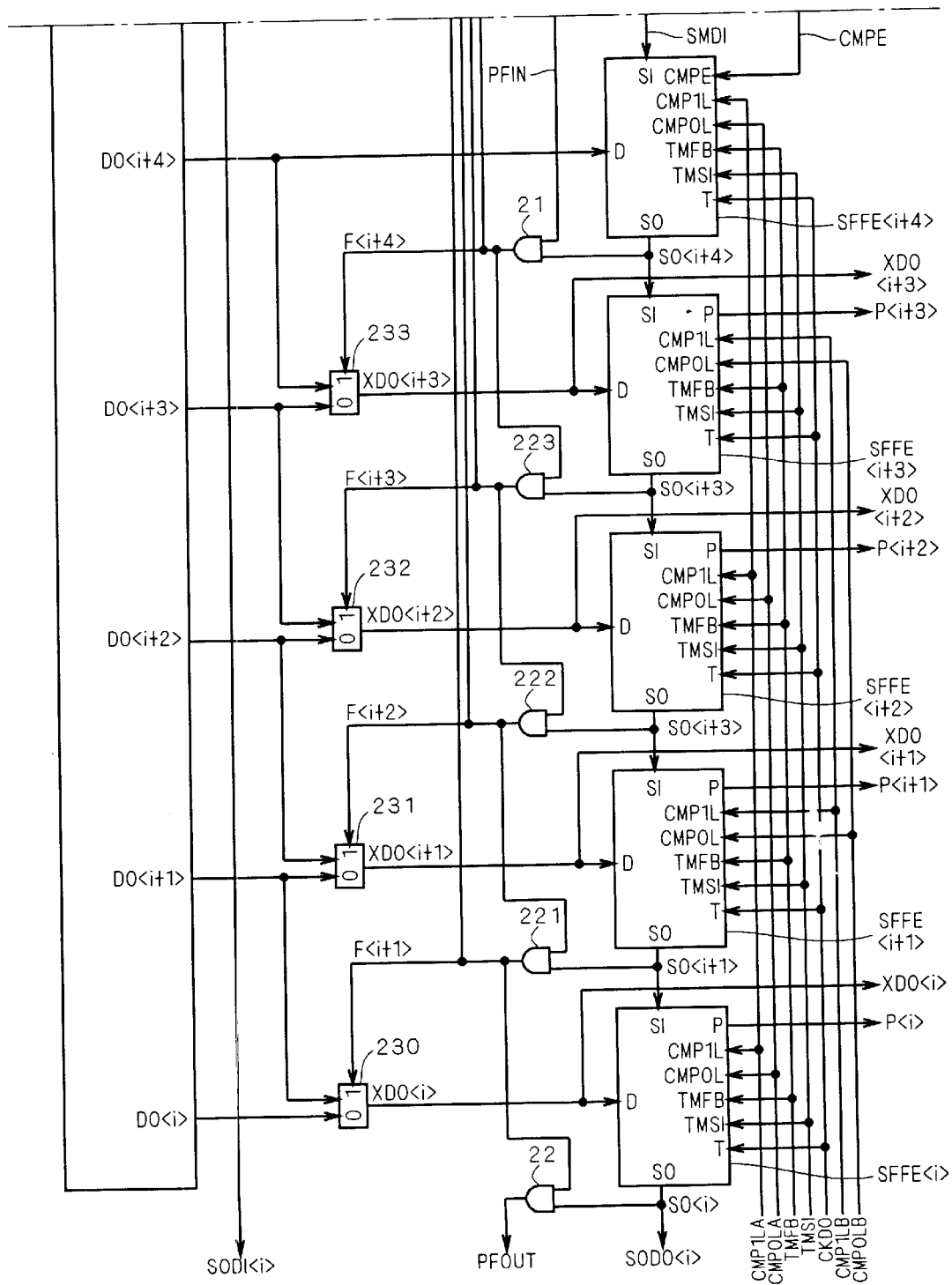

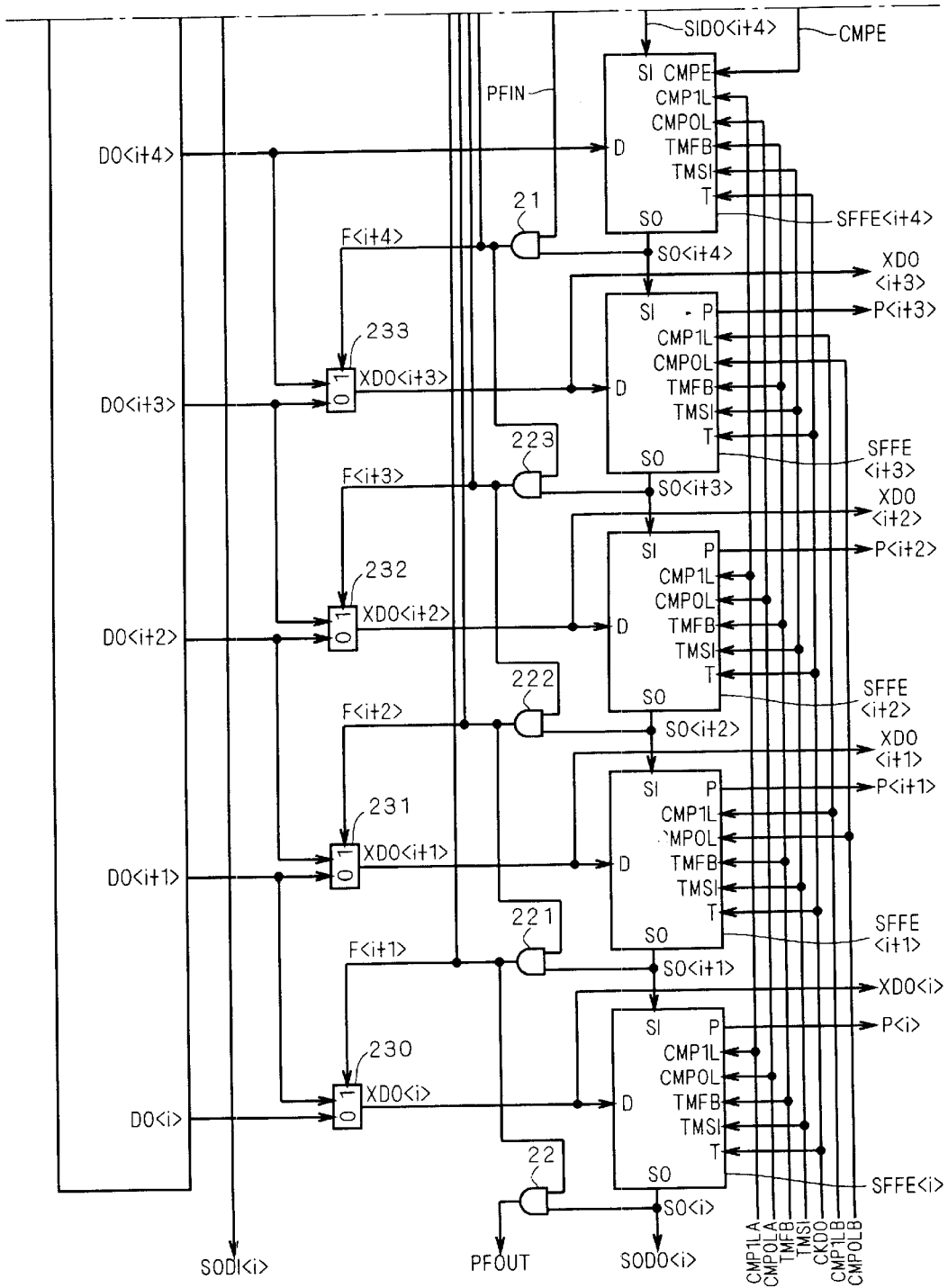
F I G . 5 0

F I G . 7 3
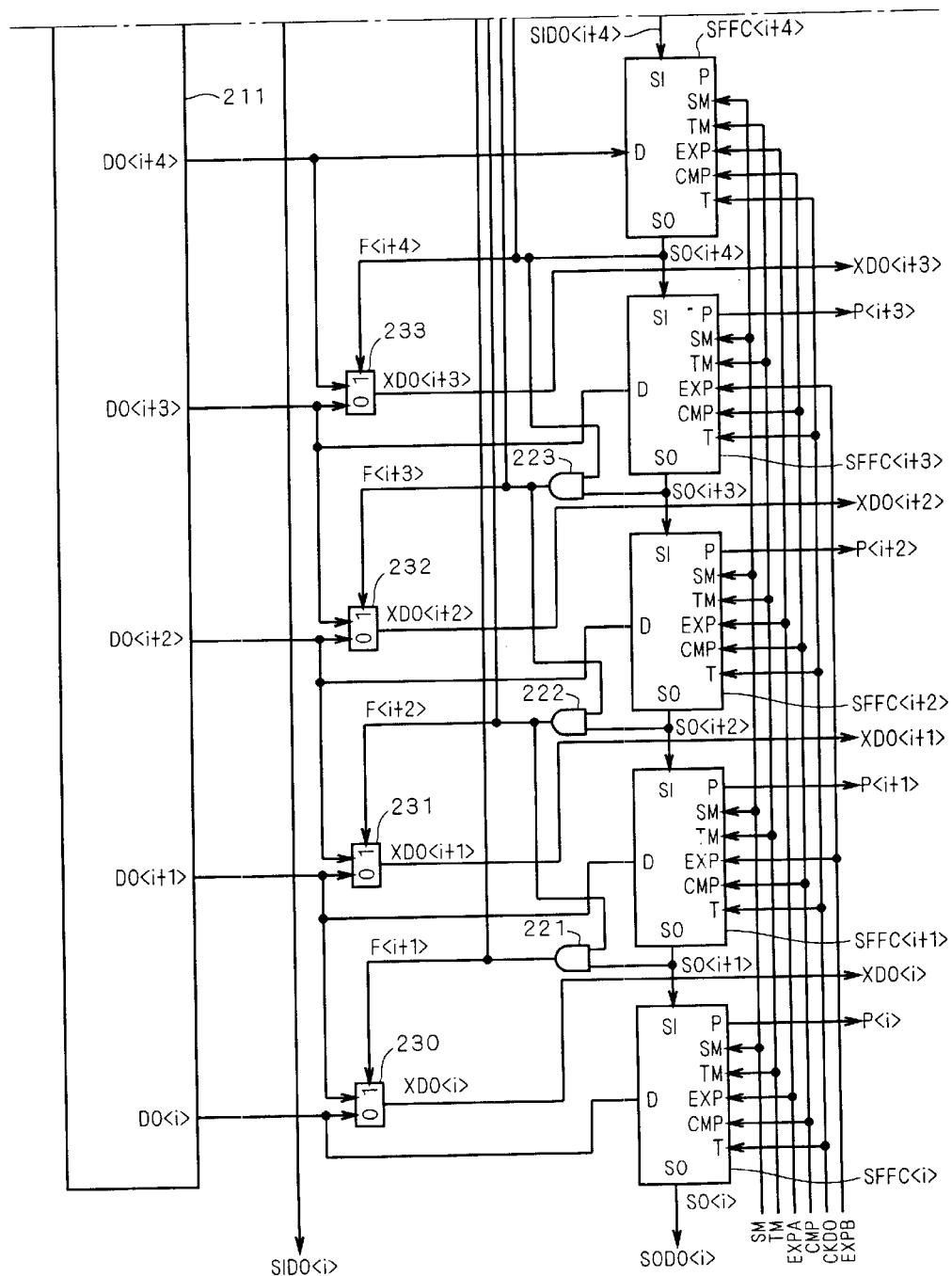

F I G . 7 4
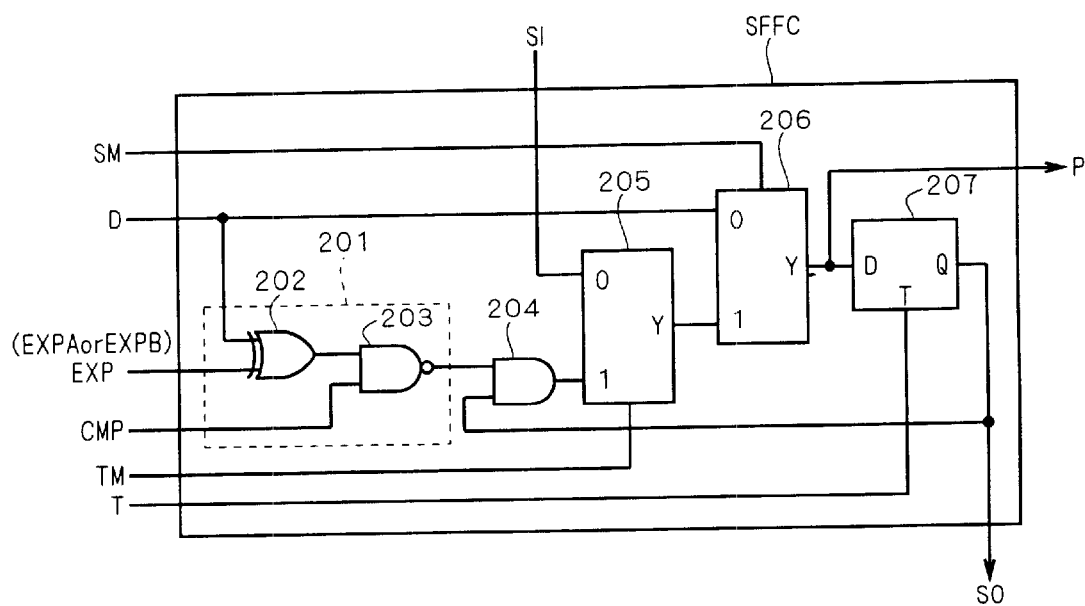

SEMICONDUCTOR INTEGRATED CIRCUIT

BACKGROUND OF THE INVENTION

1. Field of the Invention

The present invention relates to a test circuit and a redundancy circuit for a storing circuit section of a semiconductor integrated circuit device.

2. Description of the Background Art

For example, Japanese Patent Application Laid-Open No. 8-94718 (1996) (U.S. Pat. No. 5,815,512) has disclosed a conventional test circuit and redundancy circuit for a storing circuit section of a semiconductor integrated circuit device.

FIGS. 71 to 74 are diagrams showing a conventional semiconductor integrated circuit constituted by an RAM comprising a test circuit and a redundancy circuit. FIG. 71 is a diagram showing a positional relationship between FIGS. 72 and 73, and FIGS. 72 and 73 are circuit diagrams showing a circuit structure of a conventional RAM. FIG. 74 is a circuit diagram showing an internal structure of each of scan flip-flops SFFC <i> to SFFC <i+4> having comparing circuits illustrated in FIGS. 72 and 73.

As shown in FIG. 74, a comparator 201 is constituted by an EX-OR gate 202 and an NAND gate 203. The EX-OR gate 202 receives input data D and expectation data EXP at one of inputs and the other input respectively, and the NAND gate 203 has one of inputs connected to an output of the EX-OR gate 202 and receives a comparison control signal CMP at the other input. An output of the NAND gate 203 is sent as an output of the comparator 201.

An AND gate 204 has one of inputs connected to the output of the comparator 201, and a selector 205 has a "0" input for receiving a serial input (data) SI, a "1" input connected to an output of the AND gate 204 and a control input for receiving a test mode signal TM. Then, the selector 205 outputs, from an output section Y, a signal obtained from the "1" input/"0" input based on "1"/"0" of the test mode signal TM.

A selector 206 has a "0" input for receiving the input data D, a "1" input connected to the output section Y of the selector 205 and a control input for receiving a shift mode signal SM. Then, the selector 206 outputs, from the output section Y, a signal obtained from the "1" input/"0" input based on "1"/"0" of the shift mode signal SM. A signal obtained from the output section Y of the selector 206 is sent as output data P.

A D-FF (D flip-flop) 207 has a D input to which the output section Y of the selector 206 is connected, and receives a timing signal (clock signal) T at a toggle input T. A signal obtained from a Q output section is output as a data output Q and a serial output (data) SO to the outside and is fed back to the other input of the AND gate 204.

As shown in FIGS. 72 and 73, five scan flip-flops SFFC <i> to SFFC <i+4> having a circuit structure shown in FIG. 74 are connected in series to have a scan path for an RAM test. In some cases, the scan flip-flop SFFC < > will be hereinafter referred to as an SFFC < >.

More specifically, the SFFC <i+4> receives serial input data SIDO <i+4> as a serial input SI and has a serial output SO connected to a serial input SI of the SFFC <i+2>. Similarly, the SFFC <i+2>, the SFFC <i+1> and the SFFC <i> are connected in series, and the serial output SO of the SFFC <i> in a last stage is output as serial output data SODO <i>.

The SFFC <i> to the SFFC <i+4> receive a shift mode signal SM, a test mode signal TM, a comparison control signal CMP and a timing control signal CKDO in common (the timing control signal CKDO is input as the timing signal T), and receive data outputs DO <i> to DO <i+4> of an RAM 211 as respective input data D of the SFFC <i> to SFFC <i+4>. Respective data outputs P of the SFFC <i> to the SFFC <i+3> are sent as data outputs P <i> to P <i+3>.

Moreover, the SFFCs <i>, <i+2> and <i+4> receive expectation data EXPA as the expectation data EXP, and the SFFCs <i+1> and <i+3> receive expectation data EXPB as the expectation data EXP. In other words, an expectation of a comparing operation can be set to include even and odd bits having different values.

Selectors 230 to 233 constituting a redundancy-relieved output selecting circuit receive the data outputs DO <i> to DO <i+3> at respective "0" inputs, receive data outputs DO <i+1> to DO <i+4> at respective "1" inputs, and receive output data F <i+1> to F <i+4> at respective control inputs. Then, outputs of the selectors 230 to 233 constituting a redundancy-relieved input selecting circuit are sent as redundancy-relieved data outputs XDO <i> to XDO <i+3>.

Each of AND gates 221 to 223 receives each of serial outputs SO <i+1> to SO <i+3> at one of inputs. The AND gate 221 receives an output of the AND gate 222 at the other input, the AND gate 222 receives an output of the AND gate 223 at the other input, and the AND gate 223 receives a serial output SO <i+4> at the other input. Then, the outputs of the AND gates 221 to 223 are sent as the output data F <i+1> to F <i+2> and the serial output SO <i+4> is sent as the output data F <i+4>.

On the other hand, an OR gate 215 receives a redundancy-relieved data input XDI <i> at one of inputs, and receives the output data F <i+1> at the other input. Selectors 234 to 236 receive redundancy-relieved data inputs XDI <i+1> to XDI <i+3> at respective "0" inputs, receive the redundancy-relieved data inputs XDI <i> to XDI <i+2> at respective "1" inputs, and receive the output data F <i+2> to F <i+4> at respective control inputs. The selectors 230 to 236 output the signals to be received at the "0"/"1" inputs based on "0"/"1" of the signal received at the control inputs. Moreover, the OR gate 215 does not need to be essential.

Then, a scan path circuit DISCAN inputs an output of the OR gate 215 as input data XI <i>, the outputs of the selectors 234 to 236 as input data XI <i+1> to <i+3>, and a redundancy-relieved data input XDI <i+4> as input data XI <i+4>.

The scan path circuit DISCAN receives a control signal CTRL including serial input data SIDI <i+4> and outputs serial output data SIDO <i>, and outputs input data DI <i> to DI <i+4> to a 5-bit input section for the input data DI <i> to DI <i+4> of the RAM 211.

FIG. 75 is a circuit diagram showing an internal structure of the scan path circuit DISCAN. As shown in FIG. 75, scan flip-flops SFFDI <i> to SFFDI <i+4> are connected in series. In some cases, the scan flip-flop SFFDI < > will be hereinafter referred to as an SFFDI < >.

FIG. 76 is a circuit diagram showing an internal structure of the scan flip-flop SFFDI < > illustrated in FIG. 75. As shown in FIG. 76, the SFFDI < > is constituted by a selector 241 and a D-FF 242, and the selector 241 receives input data D at a "0" input, receives a serial input SI at a "1" input and receives a shift mode signal SM at a control input. A signal obtained from an output section Y of the selector 241 is given to a D input of the D-FF 242 and is output as a data output P. The D-FF 242 receives a timing signal T at a toggle input T and sends a data output Q and a serial output SO from a Q output.

Returning to FIG. 75, the SFFDI < > is sequentially connected in series in order of the SFFDI <i+4> to the SFFDI <i>, and the SFFDI <i+4> receives the serial input data SIDI <i+4> as a serial input SI and the SFFDI <i> outputs serial output data SIDO <i> as a serial output SO.

Shift mode input data SMDI are input as the shift mode signal SM of the SFFDI <i> to the SFFDI <i+4> in common, and clock data CKDI are input as the timing signal T in common. The redundancy-relieved data inputs XI <i> to XI <i+4> are sent as the input data D of the SFFDI <i> to SFFDI <i+4>. The serial input data SIDI <i+4>, the shift mode input data SMDI and the clock data CKDI are equivalent to the control signal CTRL in FIG. 72.

When the RAM 211 is to be tested, write data are set by using the scan path circuit DISCAN. In the examples of FIGS. 72 and 73, the RAM 211 has address inputs A <0> to <3> for 4 bits, a write control signal WE for 1 bit, data output signals DO <i> to DO <i+4> for 5 bits and data input signals DI <i> to DI <i+4>.

Next, an RAM test operation using the above-mentioned structure will be described.

(1) Before the RAM test is carried out, "1" is shifted in from an SIDO terminal (SIDO <i+4>) in a state of "TM1=0, SM=1" (5 clocks are required for a 5-bit scan path as in this example).

As a result, respective serial outputs SO are set to be "SO <i>=1, SO <i+1>=1, SO <i+2>=1, SO <i+3>=1, SO <i+4>=1" at the SFFC <i> to the SFFC <i+4>.

(2) In a state of "TM1=1, SM=1", the RAM test is carried out for all addresses. While data for the test are written or read, an expectation EXP (EXPA, EXPB) and a comparison control signal CMP (comparison with CMP=1) are controlled appropriately.

As a result, if there are failures (the expectations EXPA and EXPB are different from the data output DO < > of the RAM), an output of the comparator 201 of the SFFC < > is set to be "0" and the D-FF 207 is reset to be "0" synchronously with a clock signal T.

For example, in the case in which a failure is detected at the SFFC <i+2> corresponding to the data output DO <i+2> of the RAM 211, the serial output SO <i+2>="0" is obtained (SO <i>, SO <i+1>, SO <i+2> and SO <i+4> are maintained to be "1").

(3) In a state of "TM1=0, SM=1", a test result is shifted out from an SODO terminal (SODO <i>).

In the case in which an RAM redundancy relief operation is to be carried out, the RAM test operations (1) and (2) are executed and a control signal F < > of the selector is then kept.

For example, in the case in which a failure is detected at the SFFC <i+2> corresponding to the output data DO <i+2> of the RAM, the SO <i+2>="0" is obtained as described above (SO <i>, SO <i+1>, SO <i+3> and SO <i+4> are maintained to be "1").

Accordingly, the control signals of the selectors 230 to 233 are set to be "F<i+4>=1, F <i+2>=1, F <i+2>=0, F <i+1>=0". As a result, the selection control data of the selectors 230 to 233 are determined, and the output data DO <i+4>, DO <i+3>, DO <i+1> and DO <i> are connected to redundancy-relieved data outputs XDO <i+3>, XDO <i+2>, XDO <i+1> and XDO <i> respectively, and the output data DO <i+2> having a failure are not used. Similarly, the selection control data of the selectors 234 to 236 are determined, and the redundancy-relieved data input XDI <i+3>, XDI <i+2>, XDI <i+1> and XDI <i> are connected to the data inputs DI <i+4>, DI <i+3> and DI <i+2>, DI <i+1>, and DI <i> respectively.

By the above-mentioned connection switching, even if a memory circuit corresponding to the output data DO <i+2> has a failure in the RAM 211, it normally operates as an RAM having a 4-bit input and output.

Referring to the data input and output, if the same circuit is provided for two systems (in the above-mentioned example, i=0 (data outputs DO <0> to DO <4>), i=5 (data outputs DO <5> to DO <9>), it is also possible to constitute the RAM 211 capable of relieving 1 bit for i=0 and 1 bit for i=5, that is, 2 bits in total. In this case, a 10-bit RAM is used for an 8-bit input and output in a normal operation.

The RAM comprising the conventional test circuit has the following problems (1) to (3).

(1) The normal and abnormal operations of the selectors 230 to 233 for the redundancy-relieved data output XDO < > cannot be tested.

(2) When the test results are shifted out from the SFFC <i> to SFFC <i+4> in order to judge pass/fail of redundancy relief, the contents of the redundancy control data F <i> to F <i+4> to be the test results are eliminated.

(3) Since the test result compressed as a serial output SO is shifted out, it is hard to carry out failure analysis using a memory test device.

SUMMARY OF THE INVENTION

A first aspect of the present invention is directed to a semiconductor integrated circuit comprising a storing circuit for outputting output data having a first number of bits, a redundancy-relieved output selecting circuit for selecting output data having a second number of bits which are smaller than the first number of bits from the output data having the first number of bits in accordance with selection control data and for outputting redundancy-relieved output data having the second number of bits, the selection control data are switched based on a redundancy control signal during a redundancy relief operation, and a flip-flop group for inputting the redundancy-relieved output data having the second number of bits, the redundancy control signal being determined based on keeping data in the flip-flop group.

A second aspect of the present invention is directed to the semiconductor integrated circuit according to the first aspect of the present invention, further comprising a selection content setting device for forcibly setting the selection control data of the redundancy-relieved output selecting circuit during a redundancy-relieved output selecting circuit test.

A third aspect of the present invention is directed to the semiconductor integrated circuit according to the second aspect of the present invention, wherein the flip-flop group includes the first number of flip-flops capable of executing a comparing operation for obtaining a result of comparison by comparing one of the redundancy-relieved output data and the output data with expectation data, the first number of flip-flops includes the second number of flip-flops setting redundancy-relieved output data having the second number of bits to be the keeping data respectively and a third number of flip-flops setting the output data having a third number of bits out of the output data having the first number of bits to be the keeping data respectively, and the third number has a number obtained by subtracting the second number from the first number.

A fourth aspect of the present invention is directed to the semiconductor integrated circuit according to the third aspect of the present invention, wherein the comparing operation is revoked during the redundancy-relieved output selecting circuit test in the third number of flip-flops.

A fifth aspect of the present invention is directed to the semiconductor integrated circuit according to any of the first to fourth aspects of the present invention, further comprising a switching information storing device provided between the flip-flop group and the redundancy-relieved output selecting circuit for storing a switching information.

A sixth aspect of the present invention is directed to the semiconductor integrated circuit according to the first aspect of the present invention, wherein the storing circuit has the first number of data input sections for fetching input data having the first number of bits, the semiconductor integrated circuit further comprising a redundancy-relieved input selecting circuit for receiving a redundancy-relieved input data having the second number of bits and for giving the redundancy-relieved input data having the second number of bits to the second number of data input sections out of the first number of data input sections based on the redundancy control signal during the redundancy relief operation.

A seventh aspect of the present invention is directed to the semiconductor integrated circuit according to the sixth aspect of the present invention, further comprising a selection content setting device for forcibly setting the selection control data of the redundancy-relieved input selecting circuit during a redundancy-relieved input selecting circuit test.

An eighth aspect of the present invention is directed to the semiconductor integrated circuit according to the sixth or seventh aspect of the present invention, further comprising the first number of data holding sections provided between the storing circuit and the redundancy-relieved input selecting circuit corresponding to the first number of data input sections, the first number of data holding sections being brought into a hold state in which the redundancy-relieved input selecting circuit holds its own keeping data when the selection control data of the redundancy-relieved input selecting circuit is a predetermined selection control data.

A ninth aspect of the present invention is directed to the semiconductor integrated circuit according to the sixth or seventh aspect of the present invention, wherein the flip-flop group includes the first number of scan flip-flops provided corresponding to the output data having the first number of bits, the first number of scan flip-flops are connected in series from a first stage to a last stage so that a shift operation of serial data can be carried out, the semiconductor integrated circuit further comprising the first number of data holding sections provided corresponding to the first number of data input sections and having a count function for counting the first number by a serial operation; and a control device for a storing circuit test for carrying out a 1-bit loop processing the first number of times in accordance with a count result obtained by the count function of the first number of data holding sections, in which test results of the output data having the first number of bits are held as keeping data of the first number of scan flip-flops respectively and the first number of scan flip-flops are then caused to carry out a shift operation for 1 bit, thereby outputting serial output data of the scan flip-flop in the last stage to an outside and feeding back the serial output data as a serial data input of the scan flip-flop in the first stage during a storing circuit test.

A tenth aspect of the present invention is directed to the semiconductor integrated circuit according to the ninth aspect of the present invention, wherein the first number of data holding sections are brought into a hold state in which the redundancy-relieved input selecting circuit holds its own keeping data, when the selection control data of the redundancy-relieved input selecting circuit is a predetermined selection control data.

An eleventh aspect of the present invention is directed to the semiconductor integrated circuit according to the third aspect of the present invention, further comprising a first multiplexer section for classifying two or more output data having a first bit number sent from the first number of flip-flops into a fourth number of first groups which is smaller than the first number and for outputting one of the output data of the flip-flops in the first group as first selection output data based on a first selection signal obtained from an outside in the fourth number of first groups respectively, thereby outputting the first selection output data having the fourth number of bits.

A twelfth aspect of the present invention is directed to the semiconductor integrated circuit according to the eleventh aspect of the present invention, further comprising a selection content setting device for forcibly setting the selection control data of the redundancy-relieved output selecting circuit during a redundancy-relieved output selecting circuit test, wherein the selection content setting device and the first multiplexer section partially sharing a component.

A thirteenth aspect of the present invention is directed to the semiconductor integrated circuit according to the eleventh or twelfth aspect of the present invention, further comprising a second multiplexer section for classifying two or more first selection output data having the fourth number of bits into a fifth number of second groups which is smaller than the fourth number and for outputting one of the first selection output data in the second group as second selection output data based on a second selection signal obtained from an outside in the fifth number of second groups respectively, thereby outputting the second selection output data having the fifth number of bits.

According to the first aspect of the present invention, the flip-flop group for inputting the redundancy-relieved output data having the second number of bits is provided. Therefore, the selection control data of the redundancy-relieved output selecting circuit are properly switched in response to the redundancy control signal determined based on the keeping data of the flip-flop group, thereby causing the flip-flop group to newly keep the second number of redundancy-relieved output data. Consequently, it is possible to carry out a pass/fail judgement of the selecting operation of the redundancy-relieved output selecting circuit comparatively easily.

According to the second aspect of the present invention, the selection control data of the redundancy-relieved output selecting circuit can be set forcibly during the redundancy-relieved output selecting circuit test through the selection content setting device. Consequently, the selection control data can easily be set without using the redundancy control signal.

According to the third aspect of the present invention, the selection control data of the redundancy-relieved output selecting circuit are properly switched so that the result of the comparison of the redundancy-relieved output data with the expectation data is obtained by the second number of flip-flops. Consequently, it is possible to carry out a pass/fail judgement of the selecting operation of the redundancy-relieved output selecting circuit comparatively easily.

According to the fourth aspect of the present invention, the comparing function of the third number of flip-flops is revoked during the redundancy-relieved output selecting circuit test. Consequently, it is possible to avoid a drawback caused by the execution of the comparing operation through the third number of flip-flops which do not contribute to the redundancy-relieved output selecting circuit test.

According to the fifth aspect of the present invention, the switching information storing device is further provided. Consequently, the flip-flop group can be used as a temporary storing section for the redundancy-relieved output data of the storing circuit.

According to the sixth aspect of the present invention, the selection control data of the redundancy-relieved input selecting circuit are properly switched in response to the redundancy control signal determined based on the keeping data of the flip-flop group and the redundancy-relieved input data having the second number of bits are input to the storing circuit and are then output as the redundancy-relieved output data having the second number of bits from the storing circuit and the flip-flop group is caused to newly hold them. Consequently, it is possible to carry out a pass/fail judgement of the selecting operation of the redundancy-relieved input selecting circuit comparatively easily.

According to the seventh aspect of the present invention, the selection control data of the redundancy-relieved input selecting circuit can be set forcibly during the redundancy-relieved input selecting circuit test through the selection content setting device. Consequently, the selection control data can easily be set without using the redundancy control signal.

According to the eighth aspect of the present invention, the first number of data holding sections can be utilized as temporary storing sections for the redundancy-relieved input data.

According to the ninth aspect of the present invention, the control device for a storing circuit test carries out a 1-bit loop processing the first number of times in which the serial output data of the scan flip-flop in the last stage are output to the outside and are fed back as the serial data input of the scan flip-flip in the first stage. Consequently, after the test results are output as the serial output data, the keeping data of the first number of scan flip-flops can be returned to the original test result hold state.

According to the tenth aspect of the present invention, the first number of data holding sections can be utilized as temporary storing sections for the redundancy-relieved input data.

According to the eleventh aspect of the present invention, the output data having the first number of bits are multiplex output as the first selection output data having the fourth number of bits which are smaller through the first multiplexer section. Consequently, the output data having the first number of bits can be sent as the first selection output data without compressing the data contents.

According to the twelfth aspect of the present invention, the selection content setting device and the first multiplexer section partially share the component. Consequently, the structure of the device can be simplified.

According to the thirteenth aspect of the present invention, the first selection output data having the fourth number of bits are multiplex output as the second selection output data having the fifth number of bits which are smaller through the second multiplexer section. Consequently, the first selection output data having the fourth number of bits can be sent as the second selection output data without compressing the data contents.

An object of the present invention is to provide a semiconductor integrated circuit having a test circuit and a redundancy circuit which can execute a pass/fail test for a selecting operation of a redundancy-relieved output selecting circuit for selecting redundancy-relieved output data. These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram illustrating a positional relationship between FIGS. 2 and 3, FIGS. 2 and 3 are circuit diagrams showing a circuit structure of a semiconductor integrated circuit according to a first embodiment, FIGS. 6 and 7 are circuit diagrams showing an example of the internal structure of the write data control circuit, FIG. 17 is a diagram showing truth value states of various signals in the scan path circuit section according to the fourth embodiment, FIG. 24 is a diagram illustrating an operation state in a SET1 mode of the scan flip-flop, FIG. 28 is a diagram illustrating a positional relationship between FIGS. 29 and 30, FIGS. 29 and 30 are circuit diagrams showing a circuit structure of a semiconductor integrated circuit according to a sixth embodiment, FIG. 74 is a circuit diagram showing an internal structure of a scan flip-flop having a comparing circuit shown in FIGS. 72 and 73.

DESCRIPTION OF THE PREFERRED EMBODIMENTS

First Embodiment

Figure 4:
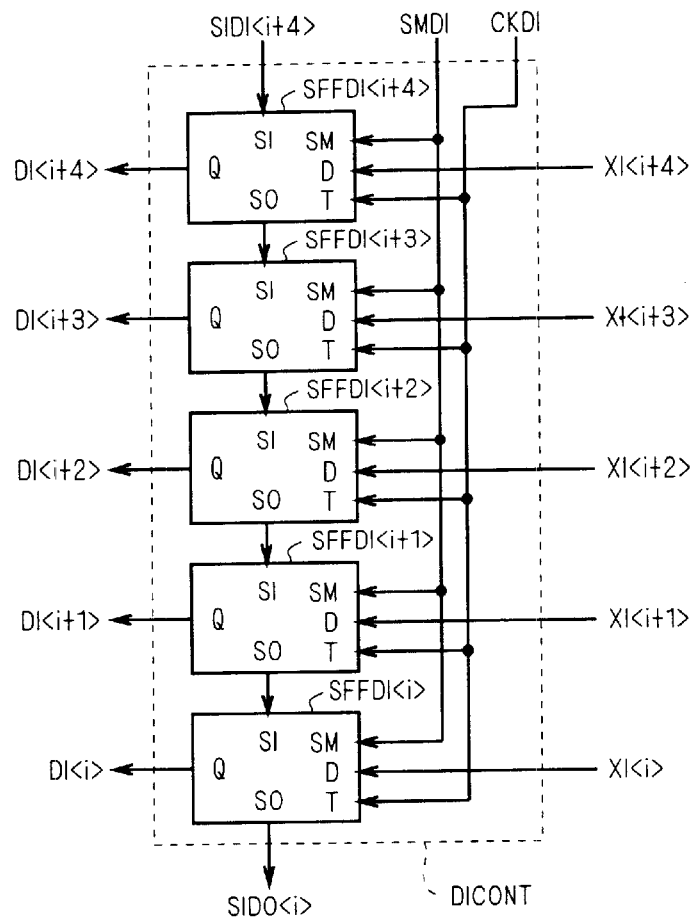
FIG. 4 is a circuit diagram showing an example of an internal structure of a write data control circuit.

FIGS. 1 to 3 are diagrams showing a semiconductor integrated circuit having a test circuit and a redundancy circuit according to a first embodiment of the present invention. FIG. 1 is a diagram illustrating a positional relationship between FIGS. 2 and 3, and FIGS. 2 and 3 are circuit diagrams showing a circuit structure of the semiconductor integrated circuit.

As shown in FIGS. 2 and 3, the circuit structure of the semiconductor integrated circuit according to the first embodiment is different from the conventional circuit structure shown in FIGS. 71 to 76 in that data inputs D of an SFFC <i+3>, an SFFC <i+2>, an SFFC <i+1> and an SFFC <i> are connected to redundancy-relieved data outputs XDO <i+3>, XDO <i+2>, XDO <i+1> and XDO <i> in place of output data DO <i+3>, DO <i+2>, DO <i+1> and DO <i> of an RAM 211, respectively. A data input D of an SFFC <i+4> is connected to output data DO <i+4> in the same manner as that in the conventional circuit structure.

Moreover, an AND gate 21 for inputting a selector test signal PFIN and an AND gate 22 for outputting a signal PFOUT are added. The AND gate 21 receives a serial output SO <i+4> at one of inputs and receives the selector test signal PFIN at the other input, and an output thereof is sent to the other input of an AND gate 223. A connection among AND gates 221 to 223 is the same as that in the conventional structure. The AND gate 22 receives a serial output SO <i> at one of inputs and receives an output of the AND gate 221 at the other input.

Figure 5:
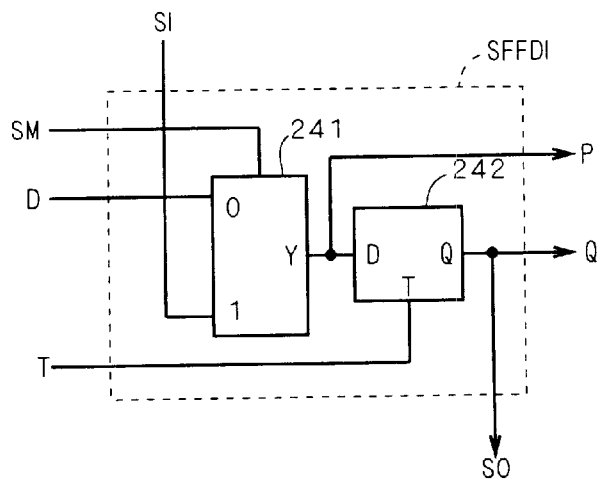
FIG. 5 is a circuit diagram showing an internal structure of a scan flip-flop.
Figure 7:
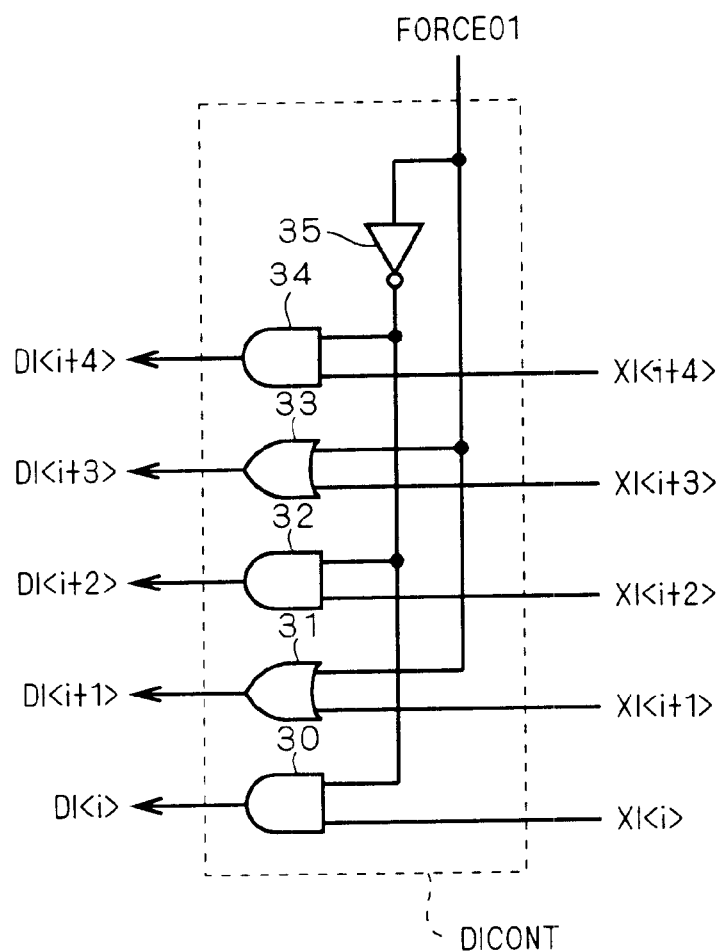

Furthermore, a write data control circuit DICONT serves to write data to the RAM 211, for which circuits shown in FIGS. 4, 6 and 7 are used. FIG. 5 is a circuit diagram showing an example of an internal structure of a scan flip-flop SFFDI to be used in FIGS. 4 and 6.

Figure 75:
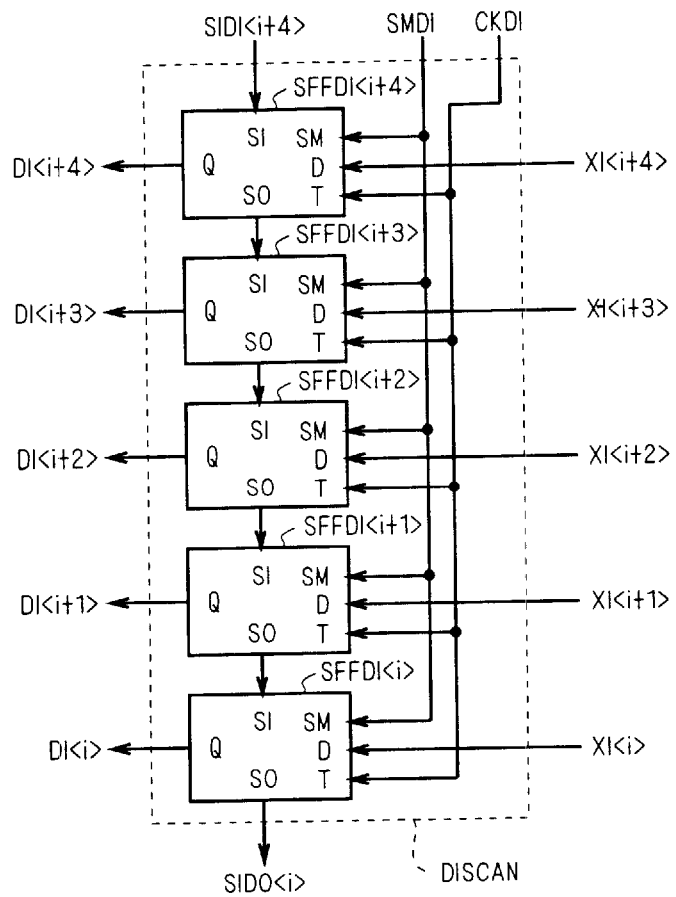
FIG. 75 is a circuit diagram showing an internal structure of a scan path circuit DISCAN.
Figure 76:
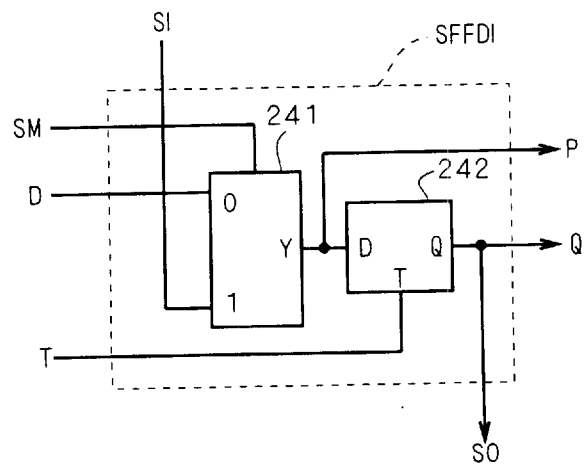
FIG. 76 is a circuit diagram showing an internal structure of a scan flip-flop shown in FIG. 75.

Since the structure of the write data control circuit DICONT shown in FIG. 4 is the same as that of the scan path circuit DISCAN shown in FIG. 75 and the internal structure of the SFFDI shown in FIG. 5 is the same as that of the circuit shown in FIG. 76, description will be omitted.

A structure shown in FIG. 6 is different from the structure shown in FIG. 4 only in that outputs of input data DI <i> to DI <i+4> are sent from P outputs of an SFFDI <i> to an SFFDI <i+4> in place of Q outputs thereof.

A write data control circuit DICONT shown in FIG. 7 is constituted by AND gates 30, 32 and 34, OR gates 31 and 33, and an inverter 35. The inverter 35 receives a control signal FORCE01.

The AND gates 30, 32 and 34 receive input data XI <i>, XI <i+2> and XI <i+4> at inputs and receive an output of the inverter 35 at the other inputs in common. The OR gates 31 and 33 receive input data XI <i+1> and XI <i+3> at inputs and receive the control signal FORCE01 at the other inputs. Then, outputs of the logic gates 30 to 34 are given as input data DIs <i> to <i+4> to the RAM 211.

The write data control circuit DICONT has an object to control write data (input data DI < >) to the RAM 211 such that "1" is given to data inputs of selectors 230 to 233 for each XDO < > and "0" is given to the other data inputs.

More specifically, for example, the control is carried out such that DI <i+4>="0", DI <i+2>="1", DI <i+2>="0", DI <i+1>="1", and DI <i>="0" are obtained.

In the case in which a conventional scan path (the data output Q is an output signal) shown in FIG. 4 is used, the control can be implemented by shifting in "01010" for the SFFDI <i> to the SFFDI <i+4>.

In the case in which a conventional scan path (the data output P is an output signal) shown in FIG. 6 is used, the control can be implemented by shifting in "0101" for the SFFDI <i> to the SFFDI <i+3> and setting "0" to the SIDI <i+4>.

In a circuit structure shown in FIG. 7, the control can be implemented by setting the control signal FORCE01 to "1".

Referring to FIG. 6, SMDI="0" is set in a normal operation mode. Referring to the circuit of FIG. 7, FORCE01="0" is set in a normal operation mode.

Since structures other than those described above are the same as the conventional structure shown in FIGS. 71 to 76, explanation will be omitted.

Next, an operation will be described.

By setting the selector test signal PFIN to "0", redundancy control signals of "F <i+4>=0, F <i+3>=0, F <i+2>=0, F <i+1>=0" are forcibly set.

Consequently, the output data DO <i+3>, DO <i+2>, DO <i+1> and DO <i> are transmitted to the redundancy-relieved data outputs XDO <i+3>, XDO <i+2>, XDO <i+1> and XDO <i>, respectively. Accordingly, D signals of the SFFC <i+3>, the SFFC <i+2>, the SFFC <i+1> and the SFFC <i> are connected to the DO <i+3>, DO <i+2>, DO <i+1> and DO <i>, respectively. Therefore, the RAM 211 can be tested in the same manner as that in the semiconductor integrated circuit including the test circuit having the conventional structure shown in FIGS. 71 to 76.

Next, description will be given to a testing method for the selectors 230 to 233 constituting a redundancy-relieved output selecting circuit for the redundancy-relieved data output XDO < >.

The input data DI <i+4>="0", DI <i+3>="1", DI <i+2>="0", DI <i+1>="1", and DI <i>="0" are set by the write data control circuit DICONT and data are written to specific addresses of the RAM 211.

A reading operation for the RAM 211 on the specific addresses is carried out. As a result, the output data DO <i+4>="0", DO <i+3>="1", DO <i+2>="0", DO <i+1>="1", and DO <i>="0" are obtained.

If the test is carried out by using the SFFC in a state in which all the selection control data of the selectors 230 and 233 are forcibly set to a "0" input with the selector test signal PFIN="0", it is possible to verify whether one of inputs (input 0 side) of each of the selectors 230 to 233 is normally transmitted as the redundancy-relieved data output XDO < >.

Moreover, if the test is carried out by using the SFFC < > with the selector test signal PFIN="1" and "SO <i+4>=1, SO <i+3>=1, SO <i+2>=1, SO <i+1>=1", it is possible to verify whether the other input ("1" input side) of the selector circuit is normally transmitted as the redundancy-relieved data output XDO < >.

Thus, the semiconductor integrated circuit according to the first embodiment can carry out an operation test for the selectors 230 to 233 related to the redundancy-relieved data output XDO < >. The test using the SFFC < > may be carried out by utilizing a comparing operation or a capture operation. The capture operation implies an operation for setting the SFFC < > in a normal mode and inputting a clock to be toggle.

Second Embodiment

Figure 8:
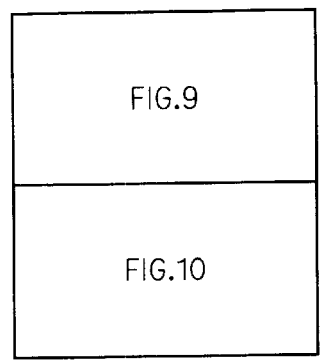
FIG. 8 is a diagram illustrating a positional relationship between FIGS. 9 and 10, FIGS. 9 and 10 are circuit diagrams showing a circuit structure of a semiconductor integrated circuit according to a second embodiment.
Figure 9:
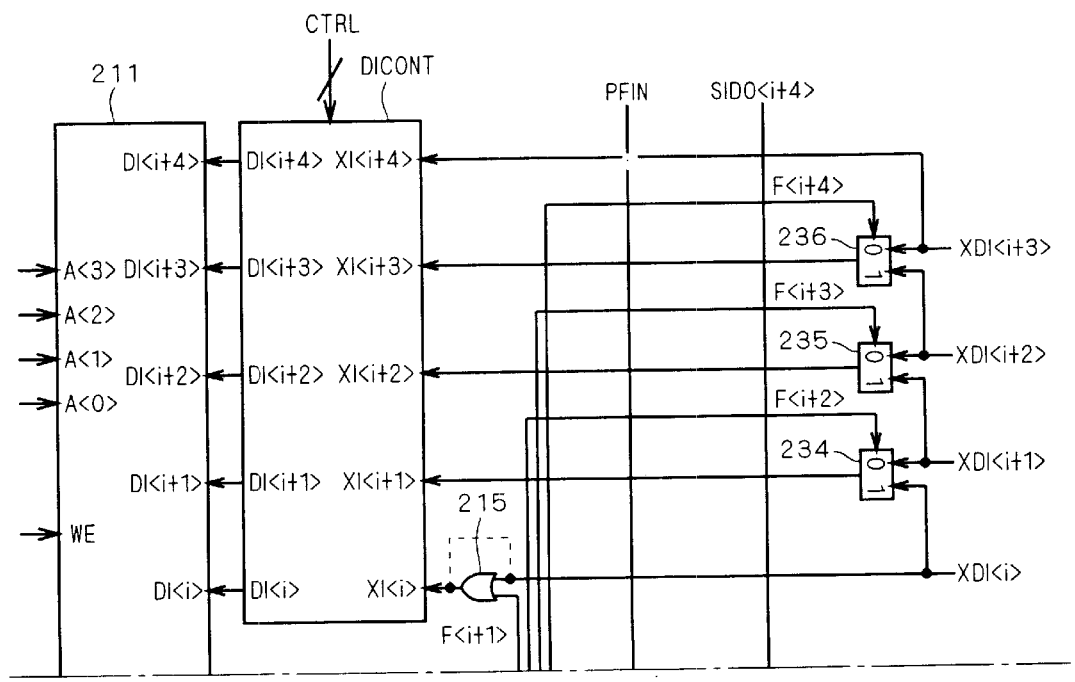

FIGS. 8 to 10 are diagrams showing a semiconductor integrated circuit according to a second embodiment of the present invention. FIG. 8 is a diagram illustrating a positional relationship between FIGS. 9 and 10, and FIGS. 9 and 10 are circuit diagrams showing a circuit structure of the semiconductor integrated circuit.

Differently from the structure according to the first embodiment, registers REG <i> to REG <i+4> are added. The registers REG <i> to REG <i+4> for receiving a timing signal TR at toggle inputs T in common are constituted by D flip-flops.

The register REG <i> receives a serial output SO <i> at a data input D and a data output Q is sent to one of inputs of an AND gate 22, the register REG <i+1> receives a serial output SO <i+1> at a data input D and a data output Q is sent to one of inputs of an AND gate 221, the register REG <i+2> receives a serial output SO <i+2> at a data input D and a data output Q is sent to one of inputs of an AND gate 222, the register REG <i+3> receives a serial output SO <i+3> at a data input D and a data output Q is sent to one of inputs of an AND gate 223, and the register REG <i+4> receives a serial output SO <i+4> at a data input D and a data output Q is sent to one of inputs of an AND gate 21.

With such a structure, the serial outputs SO <i+1> to SO <i+4> of the SFFC <i+1> to the SFFC <i+4> are supplied from the registers REG <i+1> to REG <i+4>, respectively. Therefore, a flip-flop 207 provided in the SFFC < > can be used as an output register for temporarily storing redundancy-relieved output data of an RAM 211 in a normal operation mode.

The register REG < > may be constituted by a master/slave flip-flop or a half latch circuit in addition to the D flip-flop.

Third Embodiment

Figure 11:
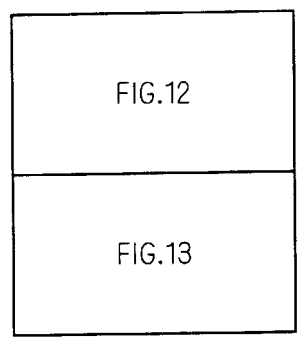
FIG. 11 is a diagram illustrating a positional relationship between FIGS. 12 and 13, FIGS. 12 and 13 are circuit diagrams showing a circuit structure of a semiconductor integrated circuit according to a third embodiment.
Figure 12:
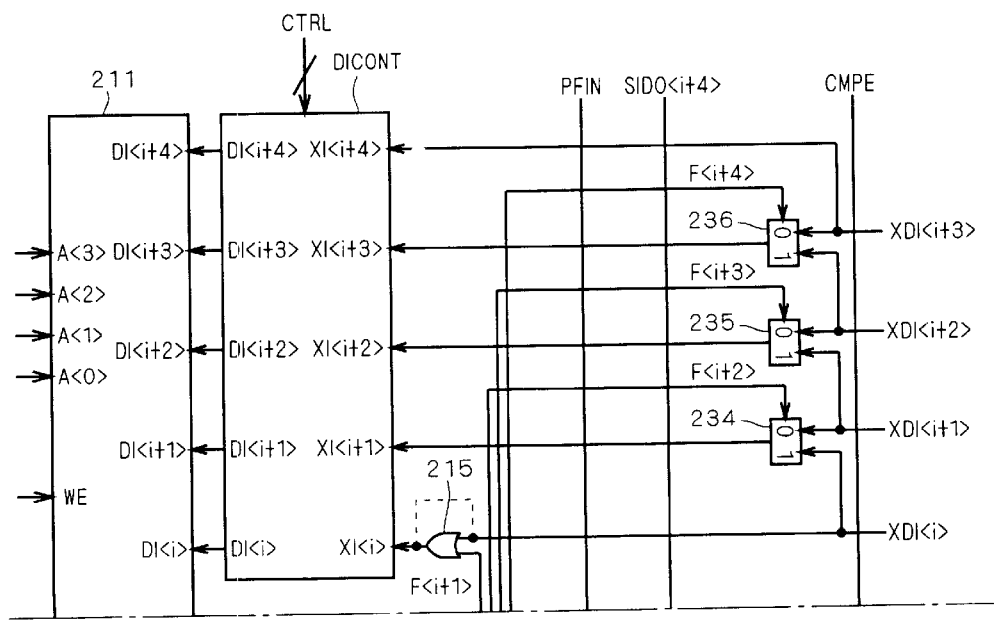

FIGS. 11 to 13 are diagrams showing a semiconductor integrated circuit according to a third embodiment of the present invention. FIG. 11 is a diagram illustrating a positional relationship between FIGS. 12 and 13, and FIGS. 12 and 13 are circuit diagrams showing a circuit structure of the semiconductor integrated circuit.

Differently from the structure according to the first embodiment, an AND gate ANDCMPE is added. The AND gate ANDCMPE receives a comparison control signal CMP at one of inputs and receives a comparison control signal CMPE at the other input, and an output thereof is sent to an input section for the comparison control signal CMP of an SFFC <i+4>. Other structures are the same as those in the first embodiment.

With the circuit structure according to the first embodiment, if the comparing operation for latch data of the SFFC <i+4> is carried out when a test is executed on the input "1" side of the selectors 230 to 233, the data are not coincident with each other so that SO <i+4>="0" is obtained. For this reason, a judgement based on SODO <i+4> is complicated.

With the circuit structure according to the third embodiment, if the comparison control signal CMPE="0" is set when a test is executed on the input "1" side of the selectors 230 to 233, a comparing operation for the SFFC <i+4> can be suppressed.

By such control, all expectations for the test are unified into "1", that is, SO <i+4>=1, SO <i+3>=1, SO <i+2>=1, SO <i+1>=1 and SO <i>=1 are obtained. Therefore, the judgement based on the SODO <i+4> can be carried out easily.

If a selector test signal PFIN="1" is set at this time, a normal/abnormal judgement can be carried out depending on "1"/"0" of an output signal PFOUT.

Fourth Embodiment

Figure 14:
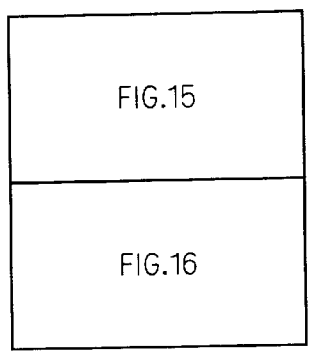
FIG. 14 is a diagram illustrating a positional relationship between FIGS. 15 and 16, FIGS. 15 and 16 are circuit diagrams showing a circuit structure of a scan path circuit section according to a fourth embodiment.
Figure 15:
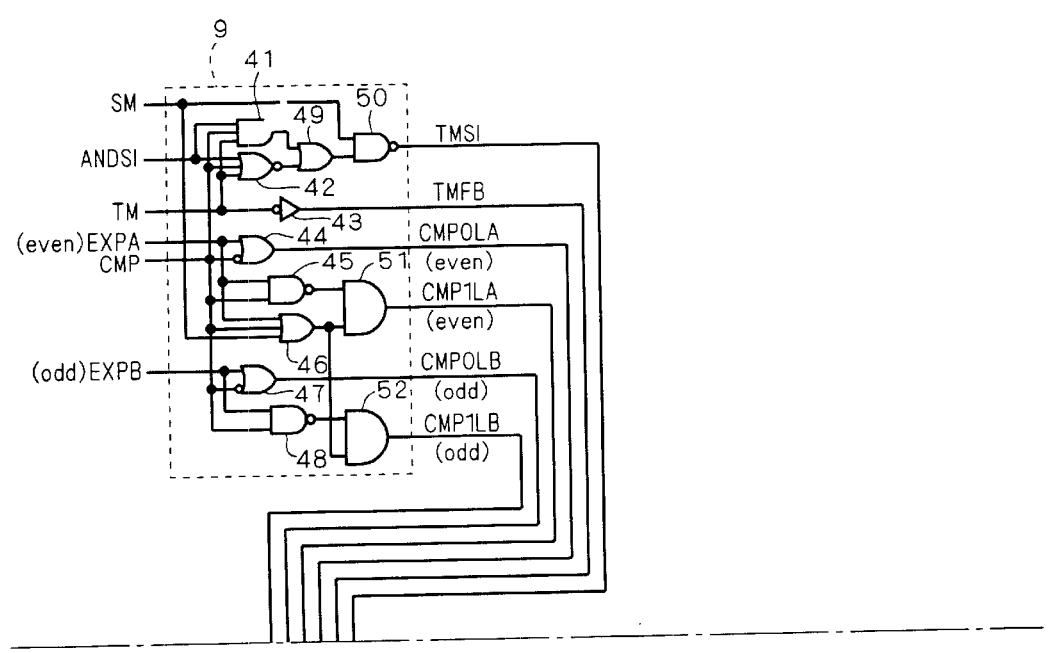
Figure 16:
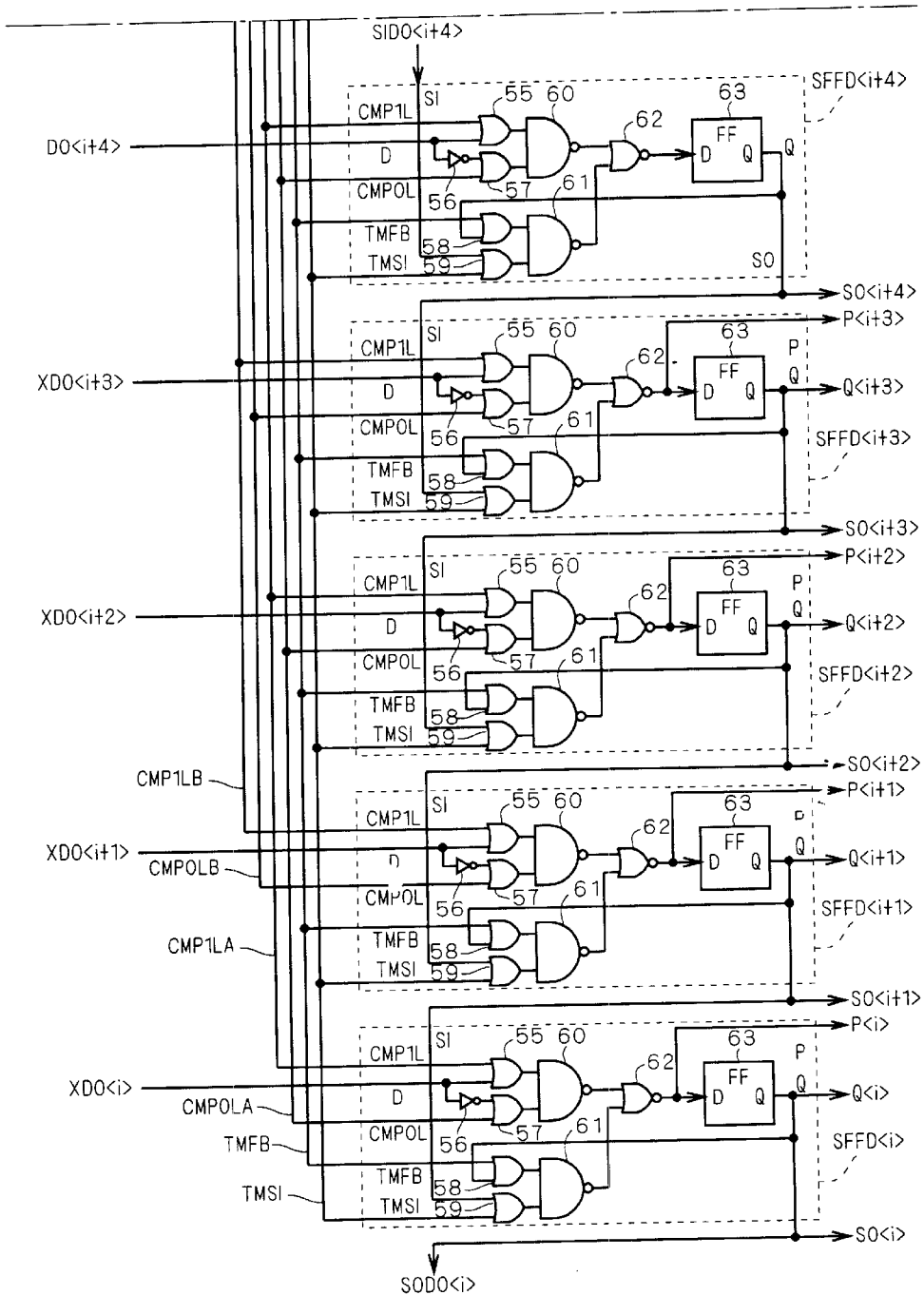

FIGS. 14 to 16 are diagrams showing a scan path circuit section having a comparing circuit of a semiconductor integrated circuit according to a fourth embodiment of the present invention. FIG. 14 is a diagram illustrating a positional relationship between FIGS. 15 and 16, and FIGS. 15 and 16 are circuit diagrams showing a circuit structure of the scan path circuit section.

In the scan path circuit section having a comparing circuit according to the fourth embodiment, the SFFC <i> to the SFFC <i+4> to be the circuit structures according to the first embodiment are replaced with scan flip-flops SFFD <i> to SFFD <i+4> and a signal control circuit 9. Structures other than the scan path circuit section are the same as those in the first embodiment. Moreover, it is possible to use the scan flip-flops SFFC <i> to SFFC <i+4> according to the second embodiment, the third embodiment and the succeeding embodiments. In some cases, the scan flip-flop SFFD < > will be hereinafter referred to as an SFFD < >.

As shown in FIG. 15, the signal control circuit 9 is constituted by logic gates 41 to 52. Both a 3-input AND gate 41 and a 3-input NOR gate 42 receive signals ANDSI, CMP and TM, an inverter 43 receives a signal TM, an OR gate 44 receives a signal EXPA and an inverted signal of the signal CMP, an NAND gate 45 receives the signals EXPA and CMP, a 3-input OR gate 46 receives the signals EXPA and CMP and a signal SM, an OR gate 47 receives a signal EXPB and an inverted signal of the signal CMP, and an NAND gate 48 receives the signal EXPB and the signal CMP.

An OR gate 49 receives outputs of the AND gate 41 and the NOR gate 42, an NAND gate 50 receives the signal SM and an output of the OR gate 49, an AND gate 51 receives an output of the NAND gate 45 and an output of the OR gate 46, and an AND gate 52 receives an output of the AND gate 48 and the output of the OR gate 46.

Then, outputs of the NAND gate 50, the inverter 43, the OR gate 44, the AND gate 51, the OR gate 47 and the AND gate 52 are sent as signals TMSI, TMFB, CMP0LA, CMP1LA, DMP0LB and CMP1LB, respectively.

As shown in FIG. 16, the scan flip-flops SFFD <i> to SFFD <i+4> are connected in series in order of the SFFD <i+4> to the SFFD <i>, the SFFD <i+4> receives a signal SIDO <i+4> as a serial input SI and a serial output SO <i> of the SFFD <i> is sent as a signal SODO <i>.

The scan flip-flops SFFD <i> to SFFD <i+4> are constituted by logic gates 55 to 62 and a D-FF 63, respectively. An OR gate 55 receives a signal CMP1L and a signal D, an inverter 56 receives the signal D, an OR gate 57 receives an output of the inverter 56 and a signal CMP0L, an OR gate 58 receives a signal TMFB and a Q output of the D-FF 63, and an OR gate 59 receives signals SI and TMSI.

An NAND gate 60 receives outputs of the OR gate 55 and the OR gate 57, an NAND gate 61 receives outputs of the OR gate 58 and the OR gate 59, an NOR gate 62 receives outputs of the NAND gate 60 and the NAND gate 61, the D-FF 63 receives an output of the NOR gate 62 at a D input, and a signal obtained from a Q output thereof is output as a serial output signal SO to the outside. A clock input to the D-FF 63 is not shown.

The scan flip-flops SFFD <i> to SFFD <i+3> receive redundancy-relieved data outputs XDO <i> to XDO <i+3> as D inputs, and the scan flip-flop SFFD <i+4> receives output data D <i+4> as a D input.

The scan flip-flops SFFD <i>, SFFD <i+2> and SFFD <i+4> receive signals CMP1LA and CMP0LA as the signals CMP1L and CMP0L in common, respectively. The scan flip-flops SFFD <i+1> and SFFD <i+3> receive signals CMP1LB and CMP0LB as the signals CMP1L and CMP0L in common, respectively.

Thus, the SFFD < > having an even bit inputs the signals CMP1LA and CMP0LA as the signals CMP1L and CMP0L respectively, and the SFFD < > having an odd bit inputs the signals CMP1LB and CMP0LB as the signals CMP1L and CMP0L respectively.

Then, serial output signals SO of the scan flip-flops SFFD <i> to SFFD <i+4> are sent as SO <i> to SO <i+4>, respectively.

FIG. 17 is a diagram showing truth value states of various signals in the scan path circuit section according to the fourth embodiment. FIGS. 18 to 24 are diagrams illustrating an operation state in each operation mode of the scan flip-flop SFFD.

With reference to these drawings, description will be given to seven operation modes, that is, NORMAL, SHIFT, HOLD, COMPARE, SHIFTING-COMPARE, COMPARE-ONCE and SET1.

First of all, a signal ANDSI="0" is set and the same signal setting as that in a conventional art is carried out to set the NORMAL mode, the SHIFT mode, the HOLD mode and the COMPARE mode. Thus, compatibility with the SFFC < > shown in FIG. 74 can be obtained.

The NORMAL mode is constituted to fetch the output data of the RAM 211 to the D-FF 63 in the SFFD < >. In the case in which the D-FF 63 in the SFFC < > is used for redundant control, it is necessary to stop the supply of a clock to the D-FF 63 (which is not shown in FIG. 16).

Figure 18:
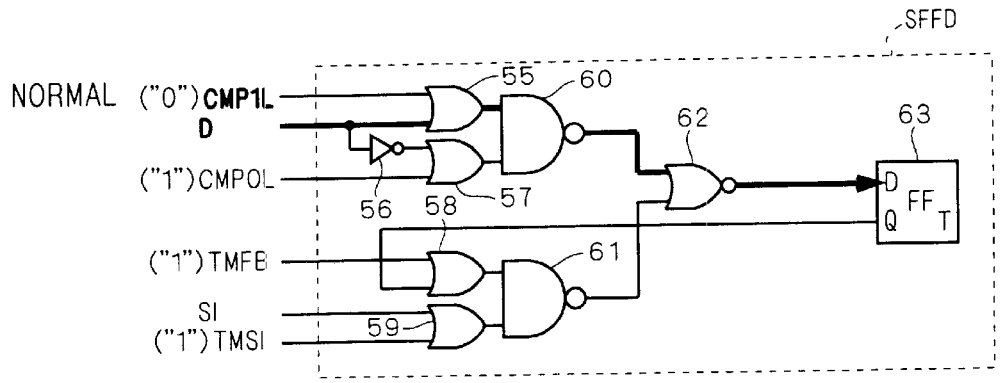
FIG. 18 is a diagram illustrating an operation state in a NORMAL mode of a scan flip-flop.

As shown in FIG. 18, the signals CMP1L, CMP0L, TMFB and TMSI are set to "0", "1", "1" and "1" in the NORMAL mode. Therefore, the output of the NAND gate 61 is fixed to "0" and the input signal D is given to the D input of the D-FF 63.

In the SHIFT mode, a series shift operation is carried out by the SFFD <i> to the SFFD <i+4>. In the case in which "1" is to be set to the D-FF 63 before comparison is carried out in the COMPARE mode which will be described below, the SHIFT mode can be used.

Figure 19:
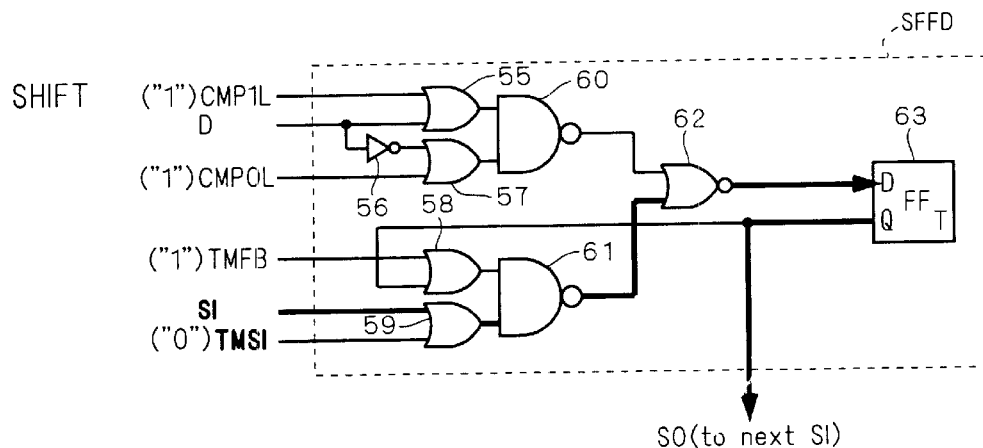
FIG. 19 is a diagram illustrating an operation state in a SHIFT mode of the scan flip-flop.

As shown in FIG. 19, the signals CMP1L, CMP0L, TMFB and TMSI are set to "1", "1", "1" and "0" in the SHIFT mode. Therefore, the output of the NAND gate 60 is fixed to "0" and the serial input signal SI is given to the D input of the D-FF 63.

The HOLD mode is used for holding a test result obtained in the middle of a test. In the case in which the D-FF 63 is used for the redundant control, the HOLD mode can be utilized (the stop of a clock is not required).

Figure 20:
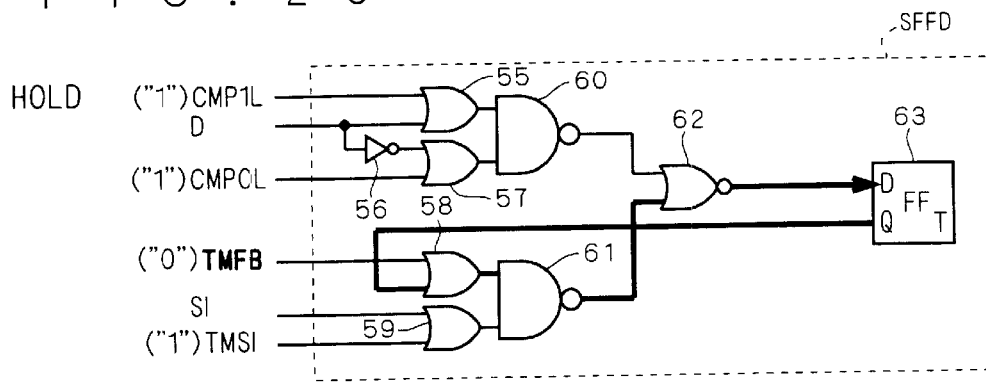
FIG. 20 is a diagram illustrating an operation state in a HOLD mode of the scan flip-flop.

As shown in FIG. 20, the signals CMP1L, CMP0L, TMFB and TMSI are set to "1", "1", "0" and "1" in the HOLD mode. Therefore, the output of the NAND gate 60 is fixed to "0" and the Q output of the D-FF 63 is fed back to the D input.

The COMPARE mode is used for comparing the output data DO <i> to DO <i+4> of the RAM 211 with the expectations (EXPA, EXPB). Before the comparison is carried out, it is necessary to set "1" to the D-FF 63.

Then, one of signals CMP1Lc and CMP0Lc (c="A" and "B") is set to "0" according to the expectation to give a clock. Thus, the comparing operation is carried out. If the output sent from the RAM 211 is different from the expectation, the value of the D-FF 63 is changed to "0".

After the test is completed for all addresses, the SHIFT mode is set to read the test result as SIDO <i>. If the test result does not need to be detected in a relief operation, it is not necessary to read the test result in the shift operation.

Figure 21:
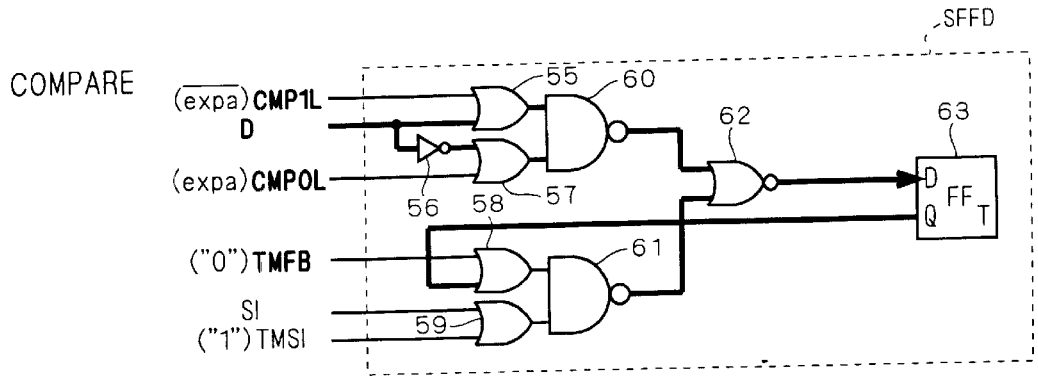
FIG. 21 is a diagram illustrating an operation state in a COMPARE mode of the scan flip-flop.

As shown in FIG. 21, if the expectation is (expa) in the COMPARE mode, the signals CMP1L, CMP0L, TMFB and TMSI are set to "bar (expa)", "(expa)", "0" and "1", respectively.

Accordingly, if the Q output of the D-FF 63 is "1", the output of the NAND gate 61 is fixed to "0" and "1"/"0" is given to the D input of the D-FF 63 depending on coincidence/non-coincidence of the input signal D with the expectation (expa).

On the other hand, if the Q output of the D-FF 63 is "0", the output of the NAND gate 61 is fixed to "1" and the output of the NOR gate 62 is fixed to "0". Consequently, "0" is given to the D input of the D-FF 63 irrespective of the result of comparison of the input signal D with the expectation (expa).

The SHIFTING-COMPARE mode is obtained by combining the COMPARE mode with the SHIFT mode (ANDSI=1 is set). When a failure is detected ("0" is latched onto the D-FF 63), the information is also propagated to the SFFD < > in a subsequent stage (the D-FF 63 of the SFFD in the subsequent stage is also set to "0" with the propagation). As compared with the COMPARE mode, the shift operation is executed together with the comparing operation. Therefore, "0" is output early as the SODO <i> to the outside. Consequently, it is possible to shorten a time required for detecting the failure of the RAM 211.

Moreover, if the SFFD < > is operated in the SHIFT mode, the output of the D-FF 63 can be exactly set to the output data F <i+1> to F <i+4> to be the redundancy control signals of the selectors 230 to 233 for redundancy switching, which will be described in the following sixth embodiment.

Figure 22:
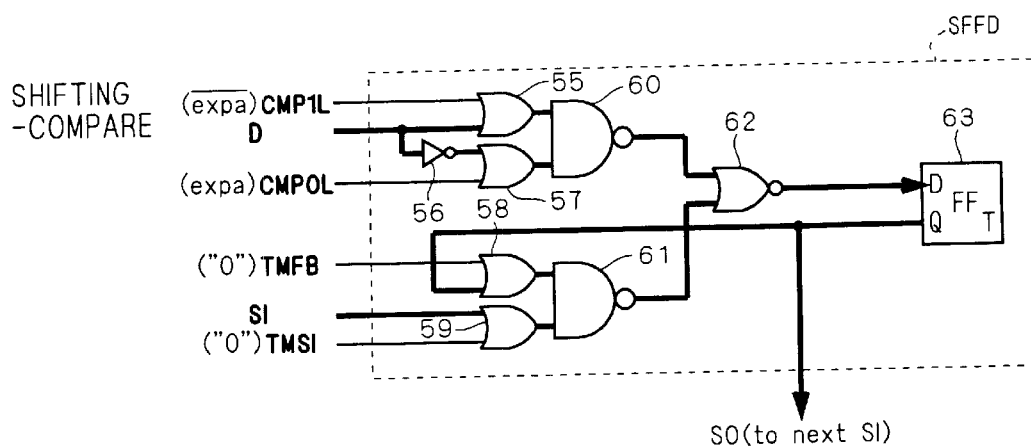
FIG. 22 is a diagram illustrating an operation state in a SHIFTING-COMPARE mode of the scan flip-flop.

As shown in FIG. 22, if the expectation is (expa) in the SHIFTING-COMPARE mode, the signals CMP1L, CMP0L, TMFB and TMSI are set to "bar (expa)", "(expa)", "0" and "0", respectively.

Accordingly, if both the Q output of the D-FF 63 and the serial input signal SI are "1", the output of the NAND gate 61 is fixed to "0" and "1"/"0" is given to the D input of the D-FF 63 depending on coincidence/non-coincidence of the input signal D with the expectation (expa).

On the other hand, if at least one of the Q output of the D-FF 63 and the serial input signal SI is "0", the output of the NAND gate 61 is fixed to "1" and the output of the NOR gate 62 is fixed to "0". Consequently, "0" is given to the D input of the D-FF 63 irrespective of the result of comparison of the input signal D with the expectation (expa).

The COMPARE-ONCE mode is obtained by deleting a storing operation in the COMPARE mode. Every time the result for each comparison is fetched to the D-FF 63, the contents of the D-FF 63 are updated. In other words, once the D-FF 63 is set to "0", "0" is maintained in the COMPARE mode and is not maintained in the COMPARE-ONCE mode.

Figure 23:
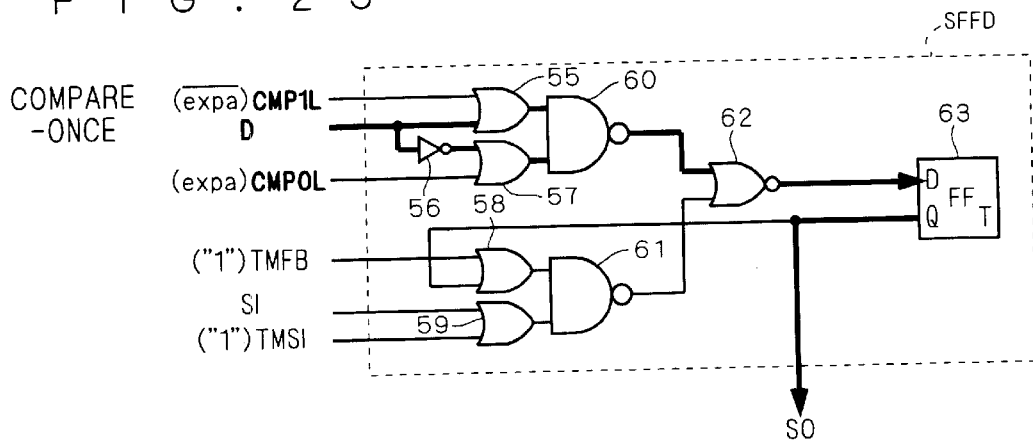
FIG. 23 is a diagram illustrating an operation state in a COMPARE-ONCE mode of the scan flip-flop.

As shown in FIG. 23, if the expectation is (expa) in the COMPARE-ONCE mode, the signals CMP1L, CMP0L, TMFB and TMSI are set to "bar (expa)", "(expa)", "1" and "1", respectively. Therefore, the output of the NAND gate 61 is fixed to "0" and "1"/"0" is given to the D input of the D-FF 63 depending on coincidence/noncoincidence of the input signal D with the expectation (expa).

The SET1 mode is used for setting "1" to the D-FF 63.

As shown in FIG. 24, the signals CMP1L, CMP0L, TMFB and TMSI are set to "1", "1", "1" and "1" in the SET1 mode, respectively. Therefore, the output of the NOR gate 62 is fixed to "1" and "1" is given to the D input of the D-FF 63.

As described above, in the scan path circuit section according to the fourth embodiment, the SHIFTING-COMPARE mode, the COMPARE-ONCE mode and the SET1 mode are added and more various operations can be carried out differently from the structures of the SFFC <i> to SFFC <i+4> according to the first embodiment.

Moreover, modes other than the above-mentioned modes have compatibility with conventional structures (the structures of the SFFC <i> to SFFC <i+4> according to the first embodiment). Therefore, the scan path circuit section according to the fourth embodiment can also be used for other embodiments.

Fifth Embodiment

Figure 25:
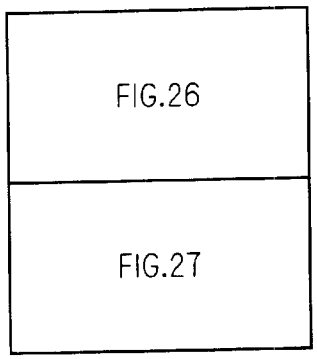
FIG. 25 is a diagram illustrating a positional relationship between FIGS. 26 and 27, FIGS. 26 and 27 are circuit diagrams showing a circuit structure of a semiconductor integrated circuit according to a fifth embodiment.
Figure 26:
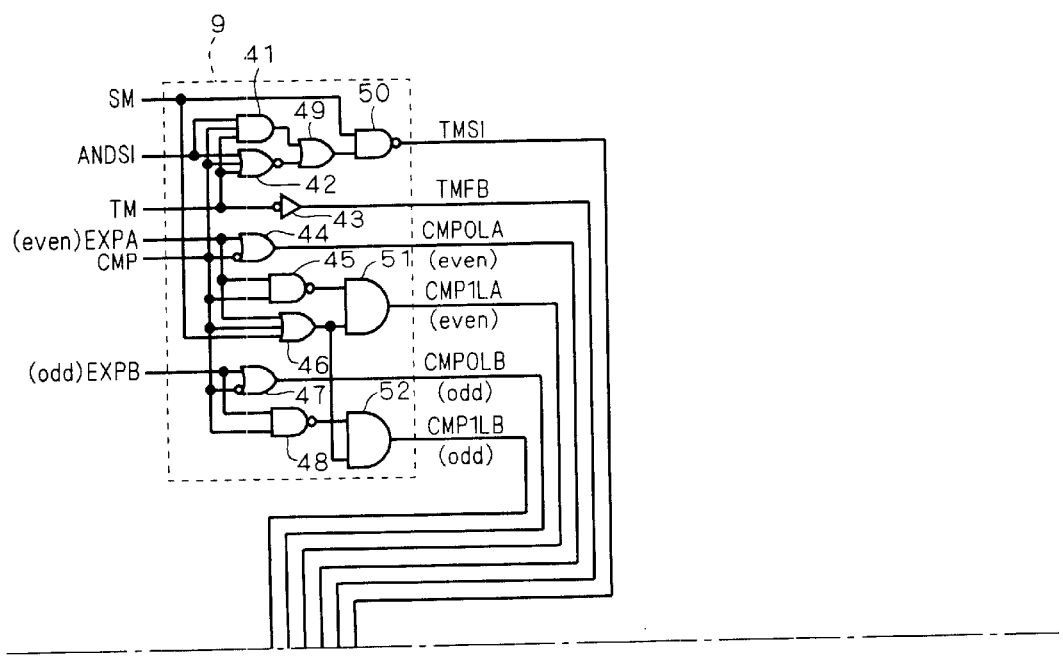
Figure 27:
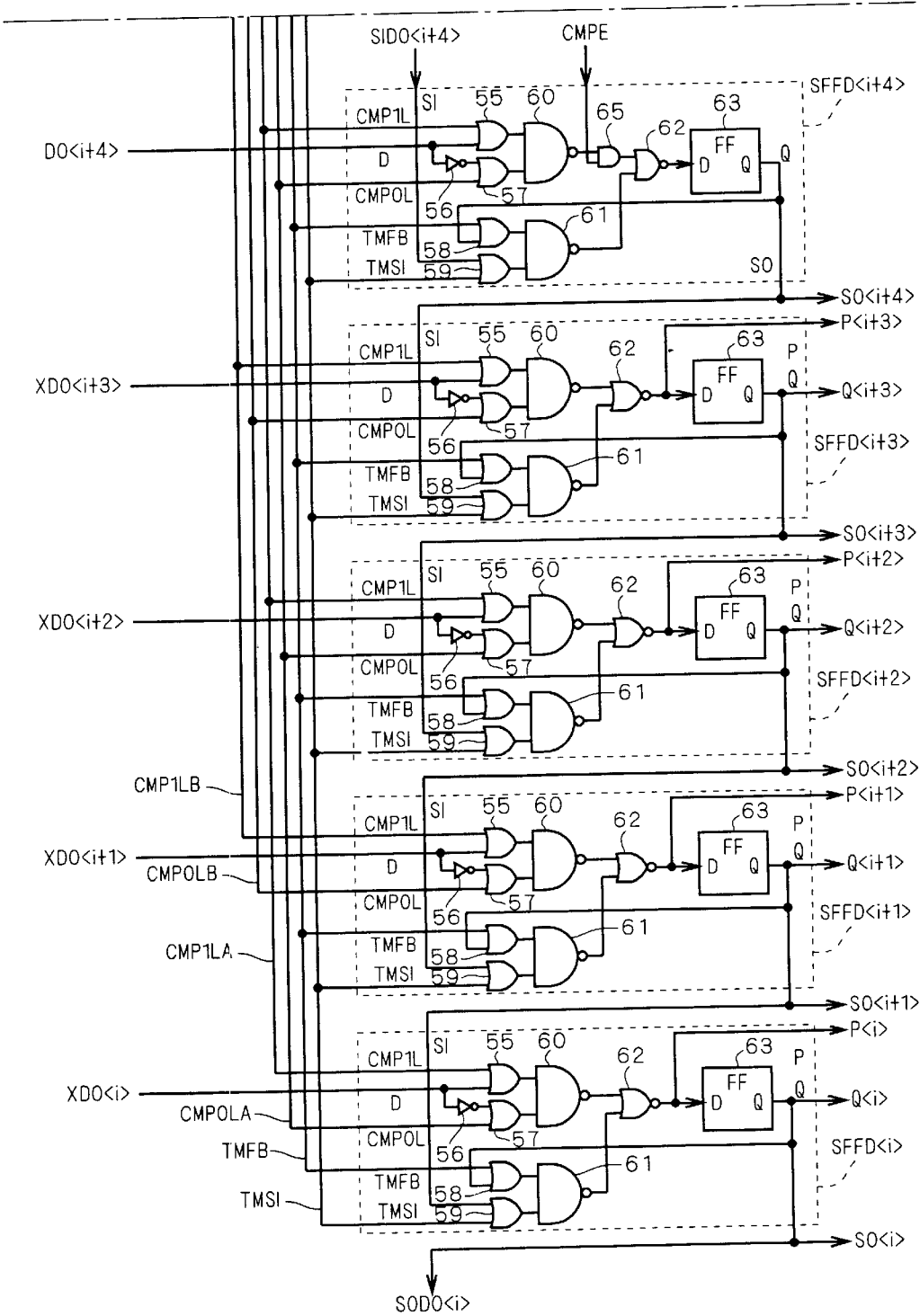

FIGS. 25 to 27 are diagrams showing a scan path circuit section having a comparing circuit of a semiconductor integrated circuit according to a fifth embodiment of the present invention. FIG. 25 is a diagram illustrating a positional relationship between FIGS. 26 and 27, and FIGS. 26 and 27 are circuit diagrams showing a circuit structure of the scan path circuit section.

As shown in FIGS. 26 and 27, the scan path circuit section according to the fifth embodiment is a variant and an AND gate 65 to cause an SFFD <i+4> to have the function of ANDCMPE is added to the circuit structure according to the fourth embodiment.

The AND gate 65 receives an output of an NAND gate 60 as one of inputs, and receives a comparison control signal CMPE as the other input from the outside. Then, an output of the AND gate 65 is sent to one of inputs of an NOR gate 62. Other structures in the SFFD <i+4> are the same as those of the SFFD <i+4> according to the fourth embodiment and the external structure of the SFFD <i+4> is the same as that of the scan path circuit section according to the fourth embodiment.

In the case in which the scan path circuit section according to the fifth embodiment is used, a comparing operation of the SFFD <i+4> can be suppressed if a comparison control signal CMPE="0" is set during a test on the input "1" side of selectors 230 to 233. Consequently, a judgement based on a signal SODO <i+4> can easily be carried out in the same manner as that in the third embodiment.

Sixth Embodiment

Figure 30:
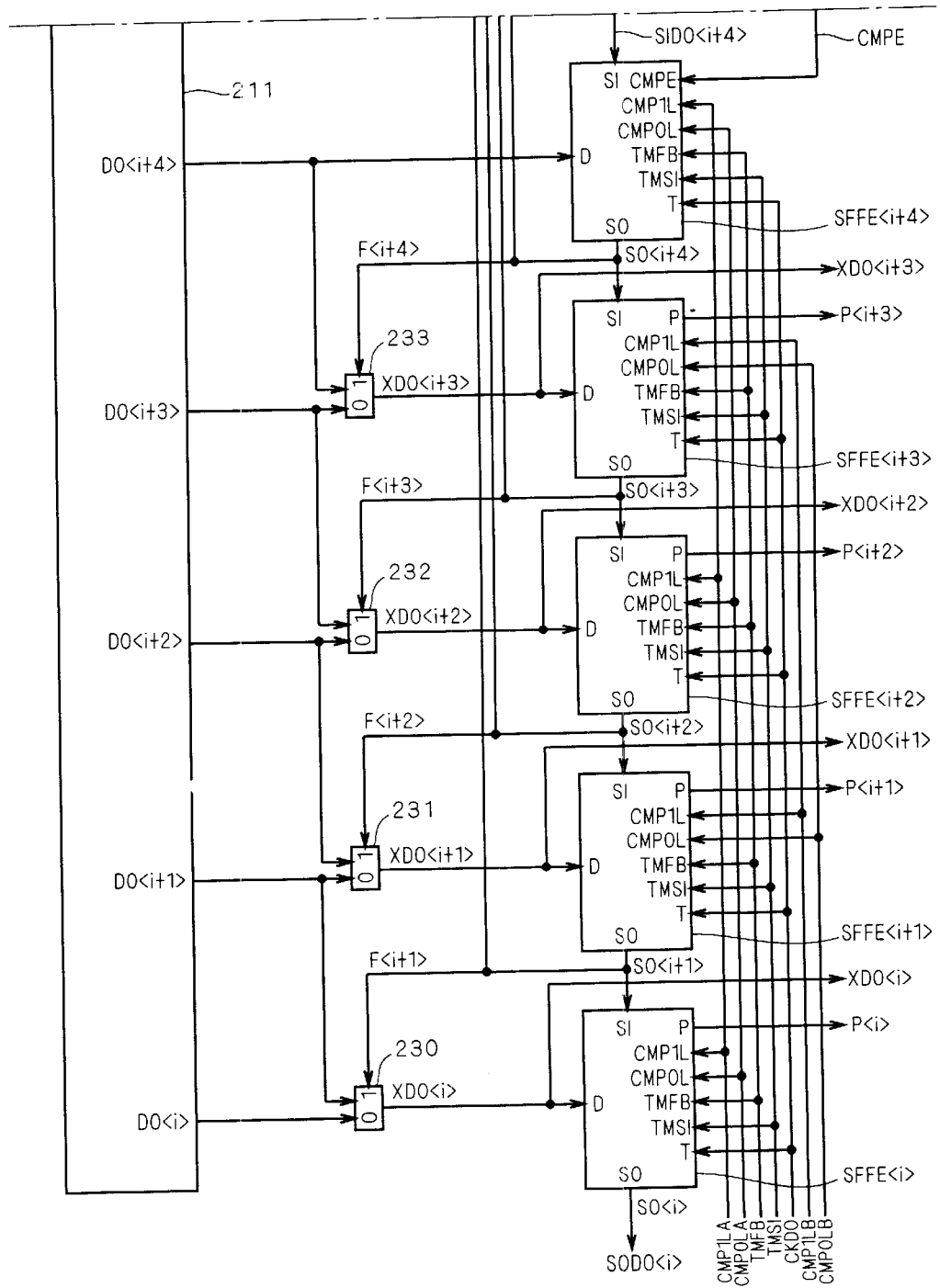

FIGS. 28 to 30 are diagrams showing a semiconductor integrated circuit according to a sixth embodiment of the present invention. FIG. 28 is a diagram illustrating a positional relationship between FIGS. 29 and 30, and FIGS. 29 and 30 are circuit diagrams showing a circuit structure of the semiconductor integrated circuit.

In the sixth embodiment, a scan path is provided by connecting scan flip-flops SFFE <i> to SFFE <i+4> in series. In some cases, the scan flip-flop SFFE < > will be hereinafter referred to as an SFFE < >.

Figure 31:
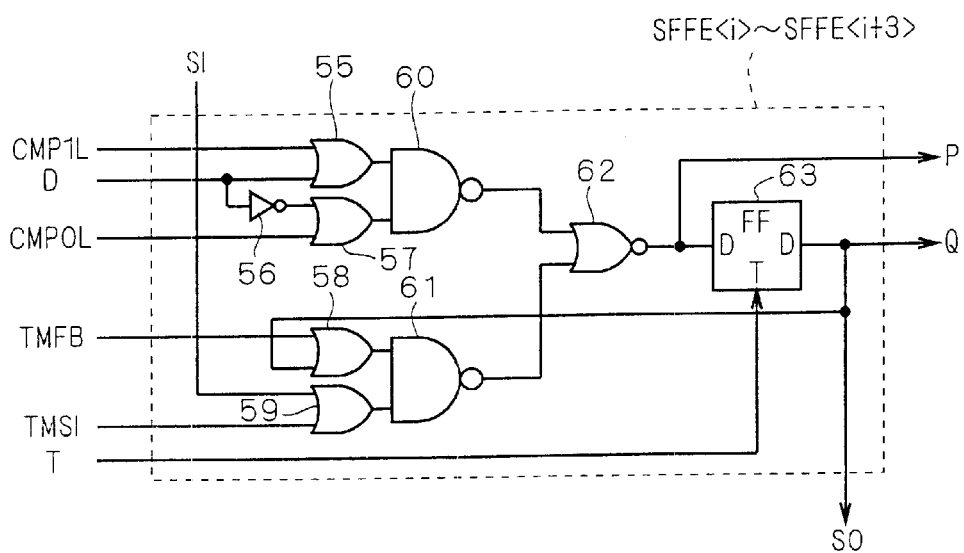
FIGS. 31 and 32 are circuit diagrams showing a circuit structure of a scan flip-flop used in FIG. 30.

As shown in FIG. 31, the SFFE <i> to the SFFE <i+3> have substantially the same circuit structures as those of the SFFD <i> to the SFFD <i+2> according to the fourth and fifth embodiments, and an output of an NOR gate 62 is sent as a data output P and a timing signal T is sent to a toggle input T of a D-FF 63.

Figure 32:
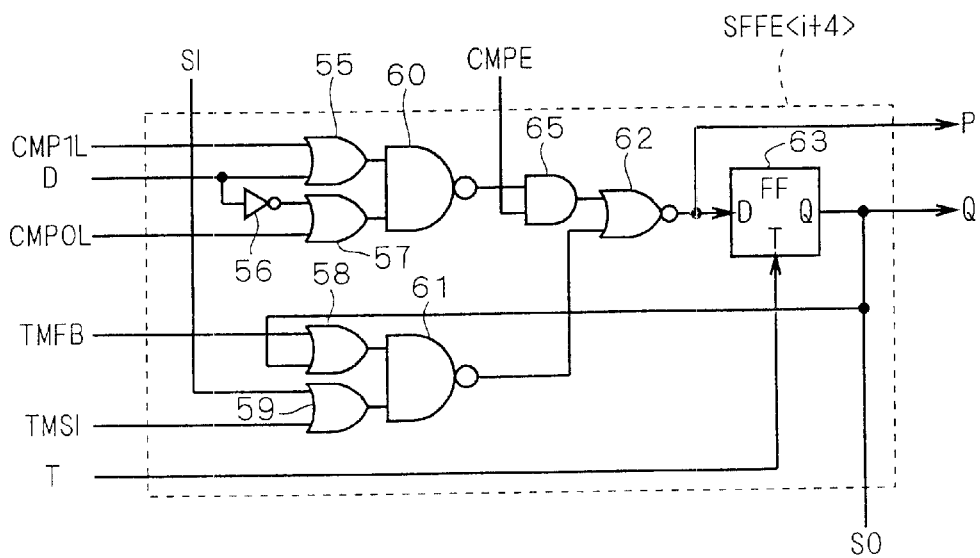

As shown in FIG. 32, an SFFE <i+4> has substantially the same circuit structure as that of the SFFD <i+4> according to the fifth embodiment, and the output of the NOR gate 62 is sent as the data output P and the timing signal T is sent to the toggle input T of the D-FF 63.

The SFFE <i> to the SFFE <i+4> receive a signal TMFB, a signal TMSI and a timing control signal CKDO in common (the timing control signal CKDO is input as the timing signal T of the D-FF 63), receive redundancy-relieved data outputs XDO <i> to XDO <i+3> as respective input data D of the SFFE <i> to the SFFE <i+3> and receive a data output DO <i+4> as input data D of the SFFE <i+4>.

Moreover, the SFFEs <i>, <i+2> and <i+4> receive signals CMP1LA and CMP0LA as signals CMP1L and CMP0L for expectations, and the SFFEs <i+1> and <i+3> receive signals CMP1LB and CMP0LB as the signals CMP1L and CMP0L, respectively. In other words, the expectation of a comparing operation can be set to have different values for even and odd bits. These signals and operation modes have the relationship shown in FIG. 17.

Serial outputs SO <i+1> to SO <i+4> of the SFFE <i+1> to the SFFE <i+4> are given as output data F <i+1> to F <i+4> to be redundancy control signals of selectors 230 to 233, respectively. Respective data outputs P of the SFFE <i> to the SFFE <i+3> are sent as data outputs P <i> to P <i+3>.

Furthermore, the SFFE <i+4> has the same comparison suppressing function as that of the SFFE <i+4> according to the fifth embodiment in response to a comparison control signal CMPE. Since other structures are the same as those of the first embodiment, description will be omitted.

With such a structure, the SFFE <i> to the SFFE <i+4> are set to a SHIFTING-COMPARE mode and are operated. Consequently, when a failure is detected in the SFFE <i+2> corresponding to output data DO <i+2> of an RAM 211, for example, a clock (timing control signal CKDO) is given and is sequentially propagated to the SFFE <i+1> and the SFFE <i> each time (even if outputs DO <i+1> and DO <i> have no failure).

Finally, SO <i+4>=1, SO <i+3>=1, SO <i+2>=0, SO <i+1>=0 and SO <i>=0 are set. If the SO <i+1> to SO <i+4> are exactly used as F <i+1> and F <i+4> to control the selection control data of the selectors 230 to 233, desirable redundancy switching can be implemented.

Next, description will be given to a method of testing the selectors 230 to 233 to be redundancy-relieved output selecting circuits for a redundancy-relieved data output XDO< >.

By a write data control circuit DICONT, DI <i+4>="0", DI <i+3>="1", DI <i+2>="0", DI <i+1>="1", and DI <i>= "0" are set and data are written to specific addresses of the RAM 211. A reading operation for the specific addresses is carried out. As a result, DO <i+4>="0", DO <i+3>="1", DO <i+2>="0", DO <i+1>="1", and DO <i>="0" are obtained.

If a capture operation is carried out by using the SFFE <i> to the SFFE <i+3> in a state of "SO <i+4>=0, SO <i+3>=0, SO <i+2>=0, SO <i+1>=0", it is possible to verify whether one of inputs (input "0" side) of each of the selectors 230 to 233 is transmitted as the redundancy-relieved data output XDO < >.

If the capture operation is carried out by using the SFFE <i> to the SFFE <i+3> in a state of "SO <i+4>=1, SO <i+3>=1, SO <i+2>=1, SO <i+1>=1", it is possible to verify whether the other input (input "1" side) of each of the selectors 230 to 233 is transmitted as the redundancy-relieved data output XDO < >.

Thus, the operation test for the selectors 230 to 233 related to the redundancy-relieved data output XDO < > can be carried out.

Seventh Embodiment

Figure 33:
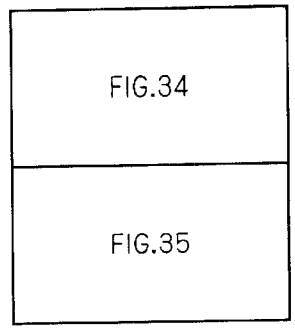
FIG. 33 is a diagram illustrating a positional relationship between FIGS. 34 and 35, FIGS. 34 and 35 are circuit diagrams showing a circuit structure of a semiconductor integrated circuit according to a seventh embodiment.
Figure 34:
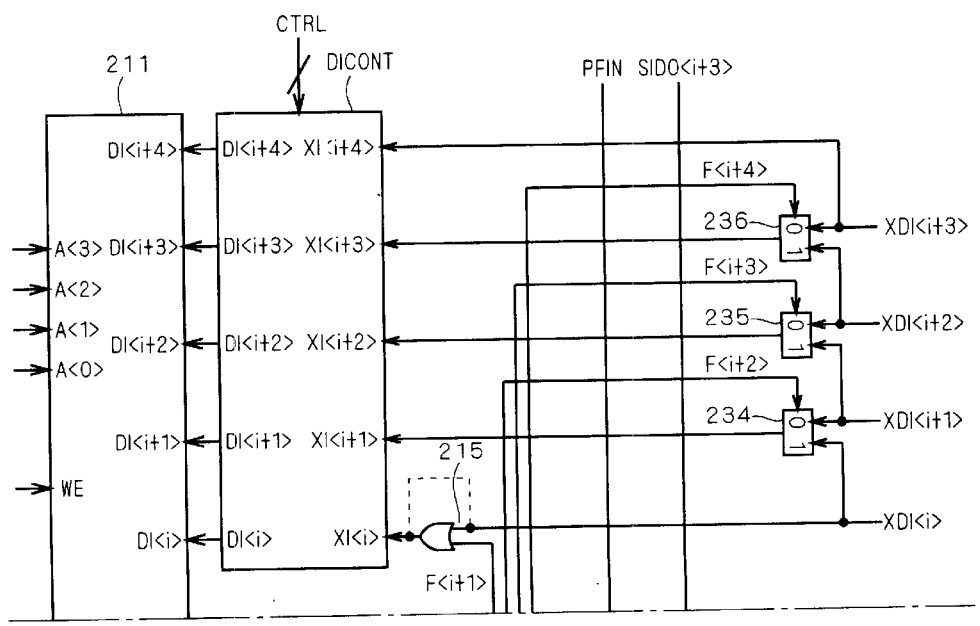
Figure 35:
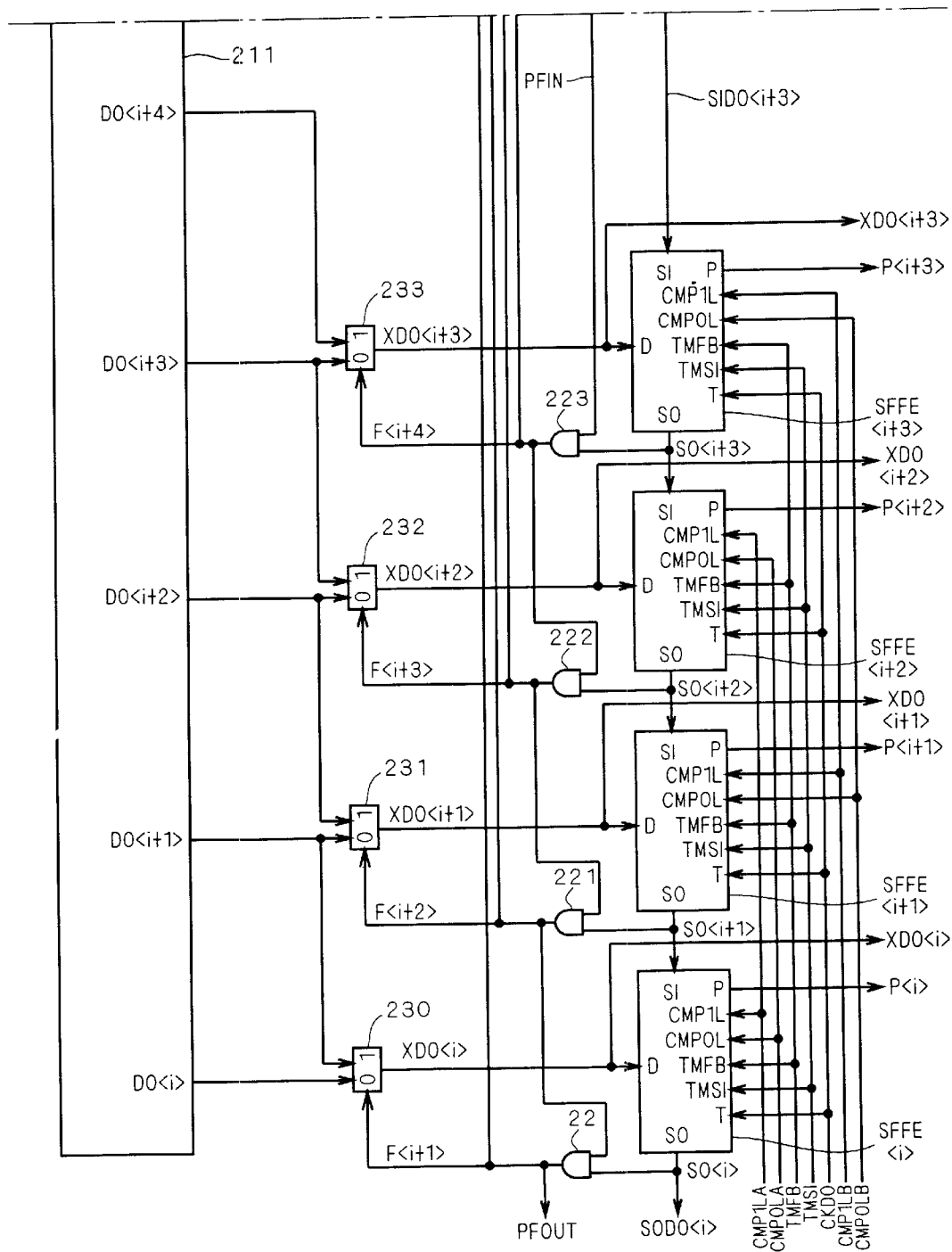

FIGS. 33 to 35 are diagrams showing a semiconductor integrated circuit according to a seventh embodiment of the present invention. FIG. 33 is a diagram illustrating a positional relationship between FIGS. 34 and 35, and FIGS. 34 and 35 are circuit diagrams showing a circuit structure of the semiconductor integrated circuit.

As shown in these drawings, a scan path is constituted by a series connection of four scan flip-flops SFFE <i> to SFFE <i+3>.

With such a structure, a SHIFT mode operation can be implemented by setting signals CMP1L, CMP0L, TMFB and TMSI to "1", "1", "1" and "0" respectively, and a SHIFTING-COMPARE mode operation can be implemented with an expectation of (expa) by setting the signals CMP1L, CMP0L, TMFB and TMSI to "bar (expa)", "(expa)", "0" and "0" respectively.

The SFFE <i> to the SFFE <i+3> fetch a signal SIDO <i+3> from the outside to a serial input SI of the SFFE <i+3>, and output SODO <i> from a serial output SO of the SFFE <i> to the outside.

Moreover, a serial output SO <i> is sent to one of inputs of an AND gate 22, serial outputs SO <i+1> to SO <i+3> are sent to inputs of AND gates 221 to 223, a selector control signal PFIN is sent to the other input of the AND gate 223, an output of the AND gate 223 is sent to the other input of the AND gate 222, an output of the AND gate 222 is sent to the other input of the AND gate 221, an output of the AND gate 221 is sent to the other input of the AND gate 22, and an output of the AND gate 22 is sent as a signal PFOUT to the outside.

Then, the outputs of the AND gate 22 and the AND gates 221 to 223 are given, to control inputs of selectors 230 to 233, as output data F <i+1> to F <i+4> to be redundancy control signals. Since other structures are the same as the circuit structure according to the sixth embodiment, description will be omitted.

With such a structure, output data DO <i+3>, DO <i+2>, DO <i+1> and DO <i> can be tested in a state of the selector control signal PFIN="0" to set the serial outputs SO <i> to SO <i+3> to "1", and output data DO <i+4>, DO <i+3>, DO <i+2> and DO <i+1> can be tested in a state of the selector test signal PFIN="1". By carrying out the test twice, it is to be confirmed that there is no failure for 2 bits or more.

During a relief operation, an RAM test (comparing operation) is carried out with the selector test signal PFIN=1.

If a failure is found during the RAM test, redundancy switching is carried out by the serial outputs SO <i> to SO <i+3> at that time.

By using the circuit according to the seventh embodiment, one scan flip-flop can be omitted so that a circuit scale can be reduced.

Eighth Embodiment

Figure 36:
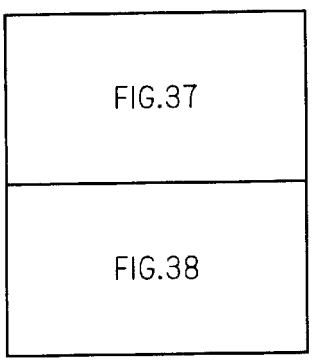
FIG. 36 is a diagram illustrating a positional relationship between FIGS. 37 and 38, FIGS. 37 and 38 are circuit diagrams showing a circuit structure of a semiconductor integrated circuit according to an eighth embodiment.
Figure 37:
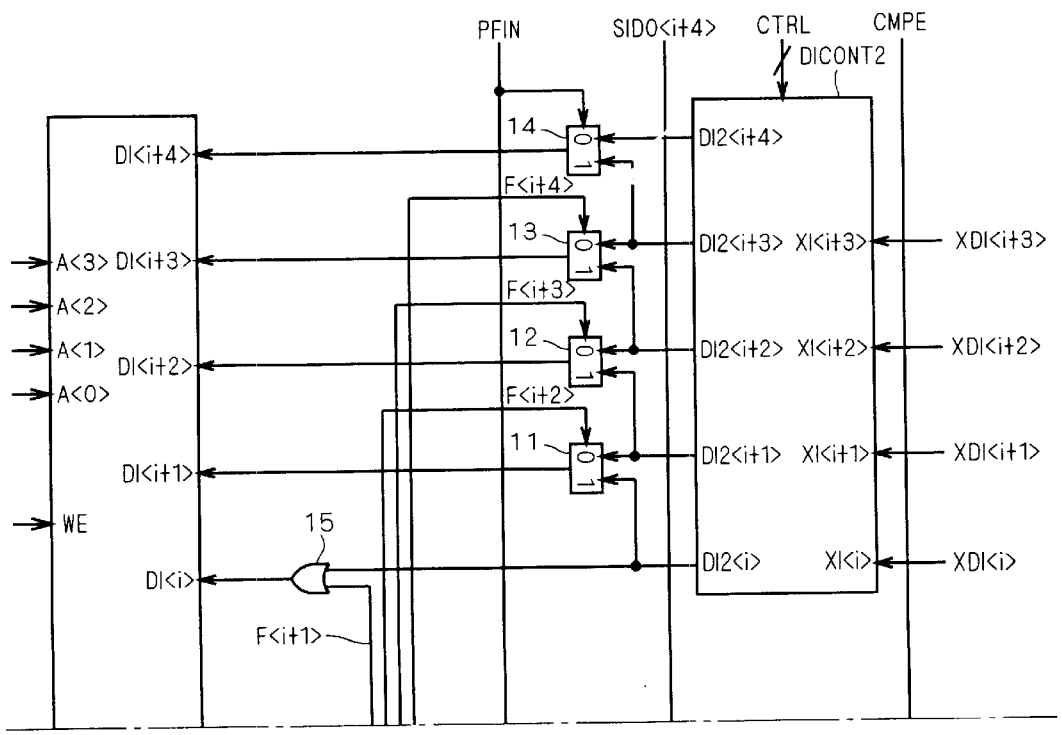
Figure 38:
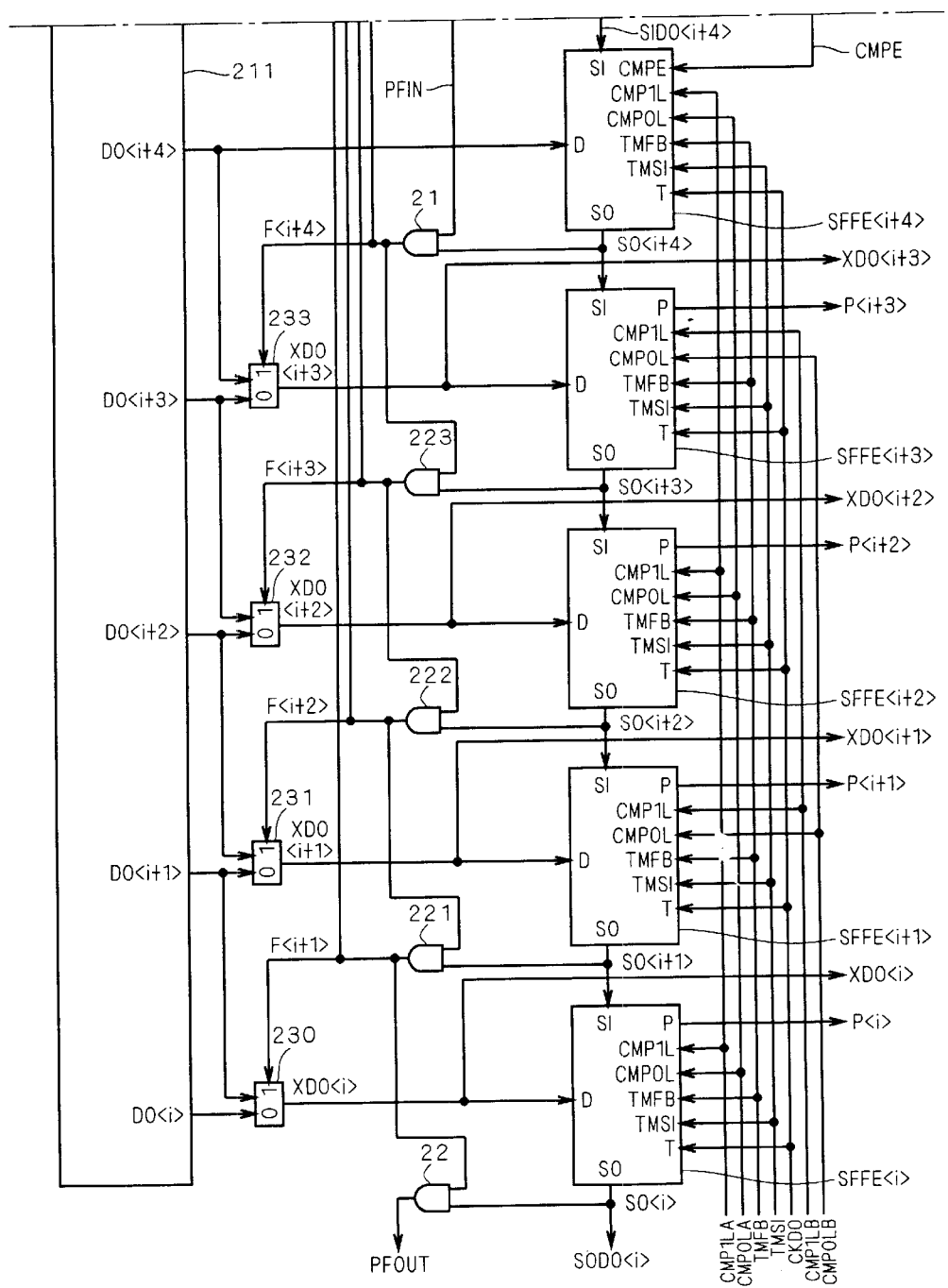

FIGS. 36 to 38 are diagrams showing a semiconductor integrated circuit according to an eighth embodiment of the present invention. FIG. 36 is a diagram illustrating a positional relationship between FIGS. 37 and 38, and FIGS. 37 and 38 are circuit diagrams showing a circuit structure of the semiconductor integrated circuit.

As shown in FIG. 37, redundancy-relieved data inputs XDI <i> to XDI <i+3> are input as input data XI <i> to XI <i+3> of a write data control circuit DICONT2 and output data DI2 <i> to DI2 <i+4> of the data control circuit DICONT2 are output.

The output data DI2 <i+1> to DI2 <i+4> are given to "0" inputs of selectors 11 to 14, and the output data DI2 <i> to DI2 <i+3> are given to "1" inputs of the selectors 11 to 14. The selectors 11 to 13 receive output data F <i+2> to F <i+4> at control inputs, a selector 14 receives a selector control signal PFIN at a control input, and an OR gate 15 receives the output data DI2 <i> at one of inputs and receives output data F <i+1> at the other input.

An output of the OR gate 15 is given to an input section for input data DI <i> of an RAM 211, and outputs of the selectors 11 to 14 are given to input sections for input data DI <i+1> to DI <i+4> of the RAM 211. Accordingly, the RAM 211 has a 5-bit input sections for the input data DI <i> to DI <i+4>.

As shown in FIG. 38, a scan path is constituted by a series connection of five scan flip-flops SFFE <i> to SFFE <i+4>, and fetches a signal SIDO <i+4> from the outside to a serial input SI of the SFFE <i+4> and outputs a signal ODO <i> from a serial output SO of the SFFE <i> to the outside.

Moreover, a serial output SO <i> is sent to one of inputs of an AND gate 22, serial outputs SO <i+1> to SO <i+3> are sent to inputs of AND gates 221 to 223, and a serial output SO <i+4> is sent to one of inputs of an AND gate 21.

Then, a selector control signal PFIN is sent to the other input of the AND gate 21, an output of the AND gate 21 is sent to the other input of the AND gate 223, an output of the AND gate 223 is sent to the other input of the AND gate 222, an output of the AND gate 222 is sent to the other input of the AND gate 221, an output of the AND gate 221 is sent to the other input of the AND gate 22, and an output of the AND gate 22 is sent as a signal PFOUT to the outside.

Subsequently, the outputs of the AND gates 221 to 223 and 21 are given as the output data F <i+1> to F <i+4> for control to the control inputs of selectors 230 to 233. Since other structures are the same as the circuit structure according to the sixth embodiment, description will be omitted.

Figure 39:
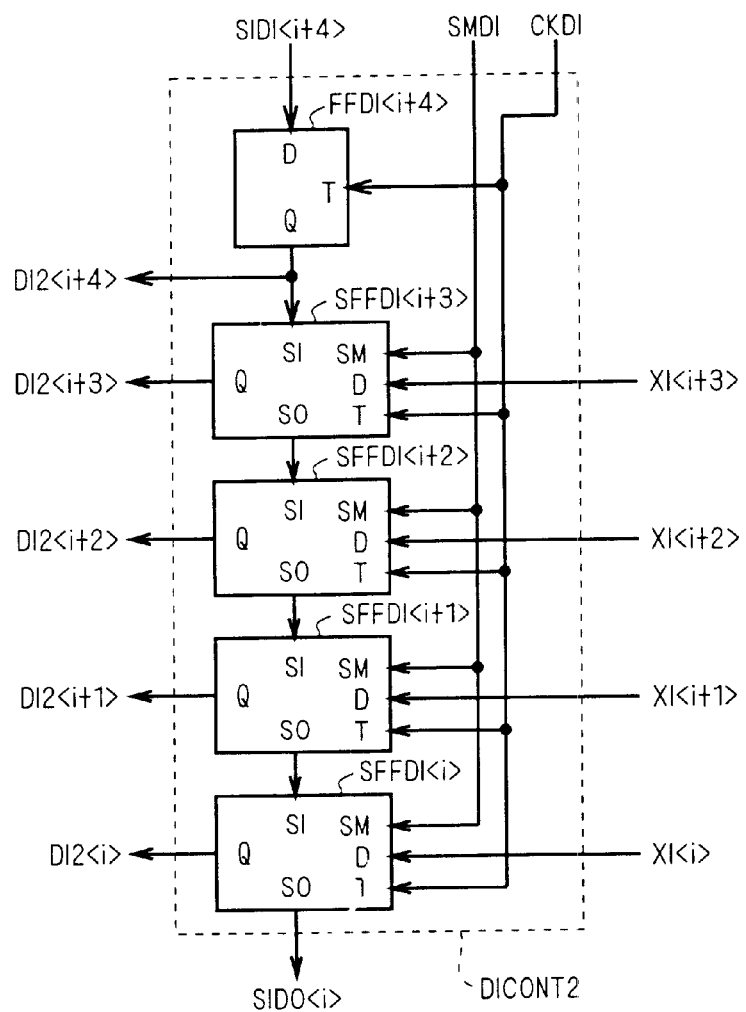
FIGS. 39 to 41 are circuit diagrams showing an example of an internal structure of a write data control circuit.
Figure 40:
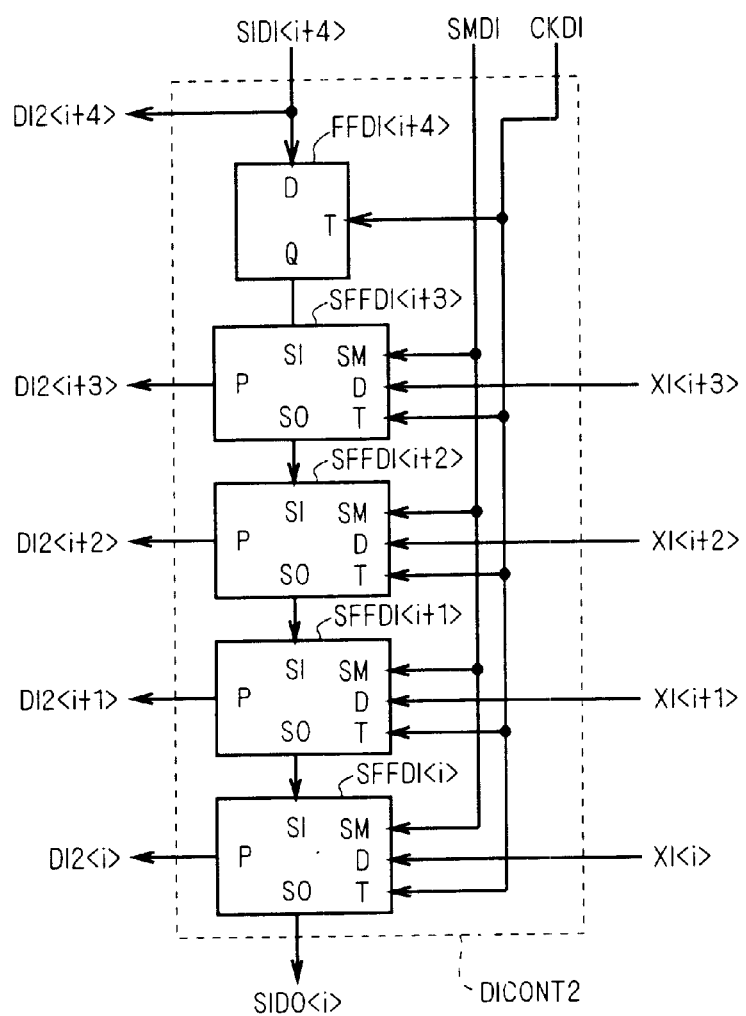
Figure 41:
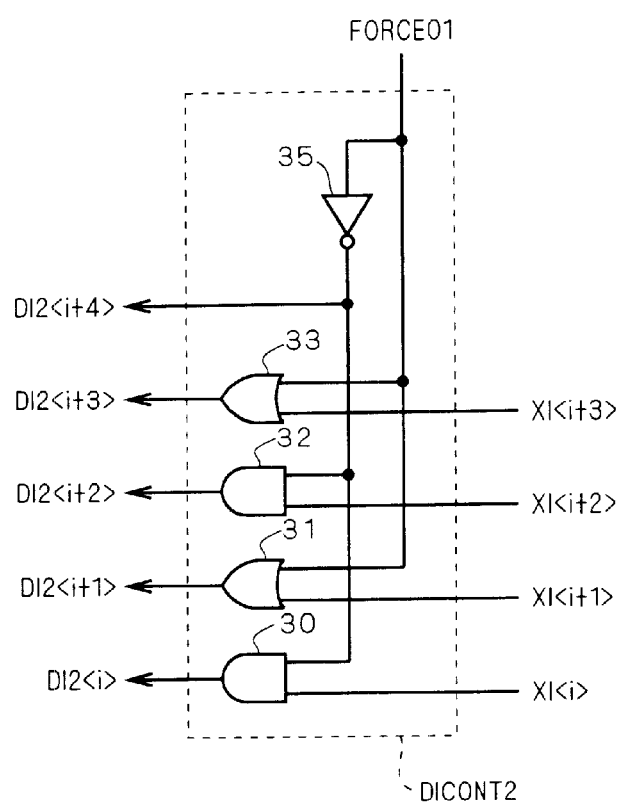

Moreover, the write data control circuit DICONT2 serves to write data to the RAM 211, for which circuits shown in FIGS. 39, 40 and 41 are used, for example.

In the structure of the write data control circuit DICONT2 shown in FIG. 39, a flip-flop FFDI <i+4> to be an ordinary D-FF is used in place of the SFFDI <i+4> in the structure of FIG. 4. The FFDI <i+4> receives a signal SIDI <i+4> at a D input, receives a signal CKDI at a T input, and sends a Q output as DI2 <i+4> and as a serial input SI of an SFFDI <i+3>. Since other structures are the same as the structure of FIG. 4, description will be omitted. Moreover, an SFFDI < > has the same structure as that shown in FIG. 5.

A structure shown in FIG. 40 is different from the structure shown in FIG. 39 only in that the outputs of the input data DI2 <i> to DI2 <i+3> are sent from P outputs of the SFFDI <i> to SFFDI <i+3> in place of the Q outputs thereof and the output of the input data DI2 <i+4> is sent from the SIDI <i+4> itself in place of the FFDI <i+4>.

A write data control circuit DICONT2 shown in FIG. 41 is different from the circuit shown in FIG. 7 in that the AND gate 34 is removed and an output of an inverter 35 is used as input data DI2 <i+4>.

Similarly, FIGS. 39, 40 and 41 are different from FIGS. 4, 5 and 7 in that the DI <i> to DI <i+4> are changed to DI2 <i> to DI2 <i+4>.

With such a structure, input data DI2 <i+4>, DI2 <i+3>, DI2 <i+2>, DI2 <i+1> and DI2 <i> are given from the DICONT2 to the input sections for DI <i+4>, DI <i+3>, DI <i+2>, DI <i+1> and DI <i> of the RAM 211 in a state of a selector test signal PFIN="0". In this state, the selectors 230 to 233 to be the redundancy-relieved output selecting circuits of the redundancy-relieved data output XDO < > can be tested as described in the above-mentioned embodiments.

In a state of the selector test signal PFIN="1" and "SO <i+4>=1, SO <i+3>=1, SO <i+2>=1, SO <i+1>=1", the input data DI2 <i+3>, DI2 <i+2>, DI2 <i+1> and DI2 <i> are given from the DICONT2 to the input sections for the input data DI <i+4>, DI <i+3>, DI <i+2> and DI <i+1> of the RAM 211, and "1" is supplied to the input section for the input data DI <i>.

Next, description will be given to a method of testing the selectors 11 to 14 constituting a redundancy-relieved input selecting circuit of a data input section.

(1) The data control circuit DICONT2 is set to DI2 <i+4>= "0", DI2 <i+3>="1", DI2 <i+2>="0", DI2 <i+1>="1" and DI2 <i>="0".

(2) In a state of the selector test signal PFIN="0", data are written to a specific address of the RAM 211.

(3) An operation for reading data from the RAM 211 is carried out for the specific address. As a result, output data DO <i+4>="0", DO <i+3>="1", DO <i+2>="0", DO <i+1>="1" and DO <i>="0" are obtained.

(4) In a state of the selector test signal PFIN="0" and expectation data EXPA="0" and EXPB="1", a comparison test is carried out.

(5) The data control circuit DICONT2 is set to DI <i+4>= "0", DI <i+3>="1", DI <i+2>="0", DI <i+1>="1" and DI <i>="0".

(6) In a state of the selector test signal PFIN="1" and "SO <i+4>=1, SO <i+3>=1, SO <i+2>=1, SO <i+1>=1", data are written to a specific address of the RAM.

(7) An operation for reading data from the RAM is carried out for the specific address. As a result, output data DO <i+4>="1", DO <i+3>="0", DO <i+2>="1", DO <i+1>= "0" and DO <i>="1" are obtained.

(8) In a state of the selector test signal PFIN="0" and expectation data EXPA="1" and EXPB="0", a comparison test is carried out.

Thus, an operation test can be carried out for the redundancy selectors 11 to 14 of the data input section as well as the redundancy selectors 230 to 233 of the data output section (XDO < >) by the comparison tests of (4) and (8).

While the circuit structure according to the eighth embodiment has been obtained by improving the circuit according to the sixth embodiment, the present invention can also be applied to circuits according to other embodi-

Ninth Embodiment

Figure 42:
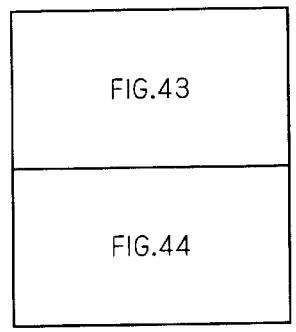
FIG. 42 is a diagram illustrating a positional relationship between FIGS. 43 and 44, FIGS. 43 and 44 are circuit diagrams showing a circuit structure of a semiconductor integrated circuit according to a ninth embodiment.
Figure 43:
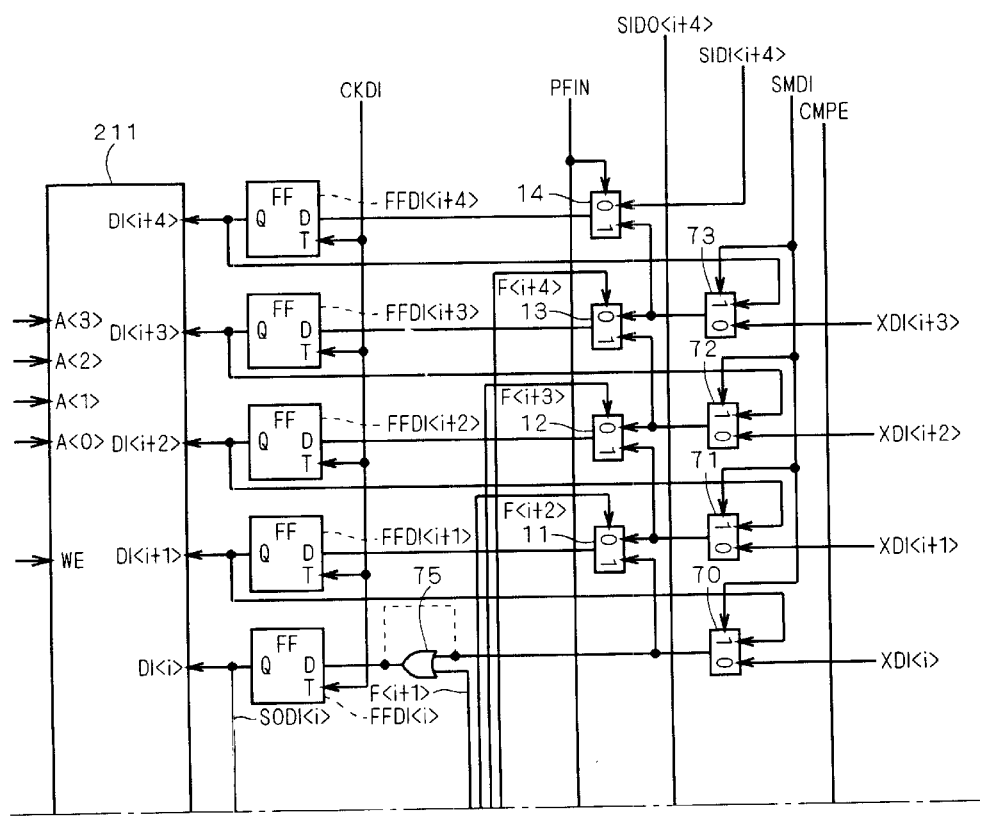
Figure 44:
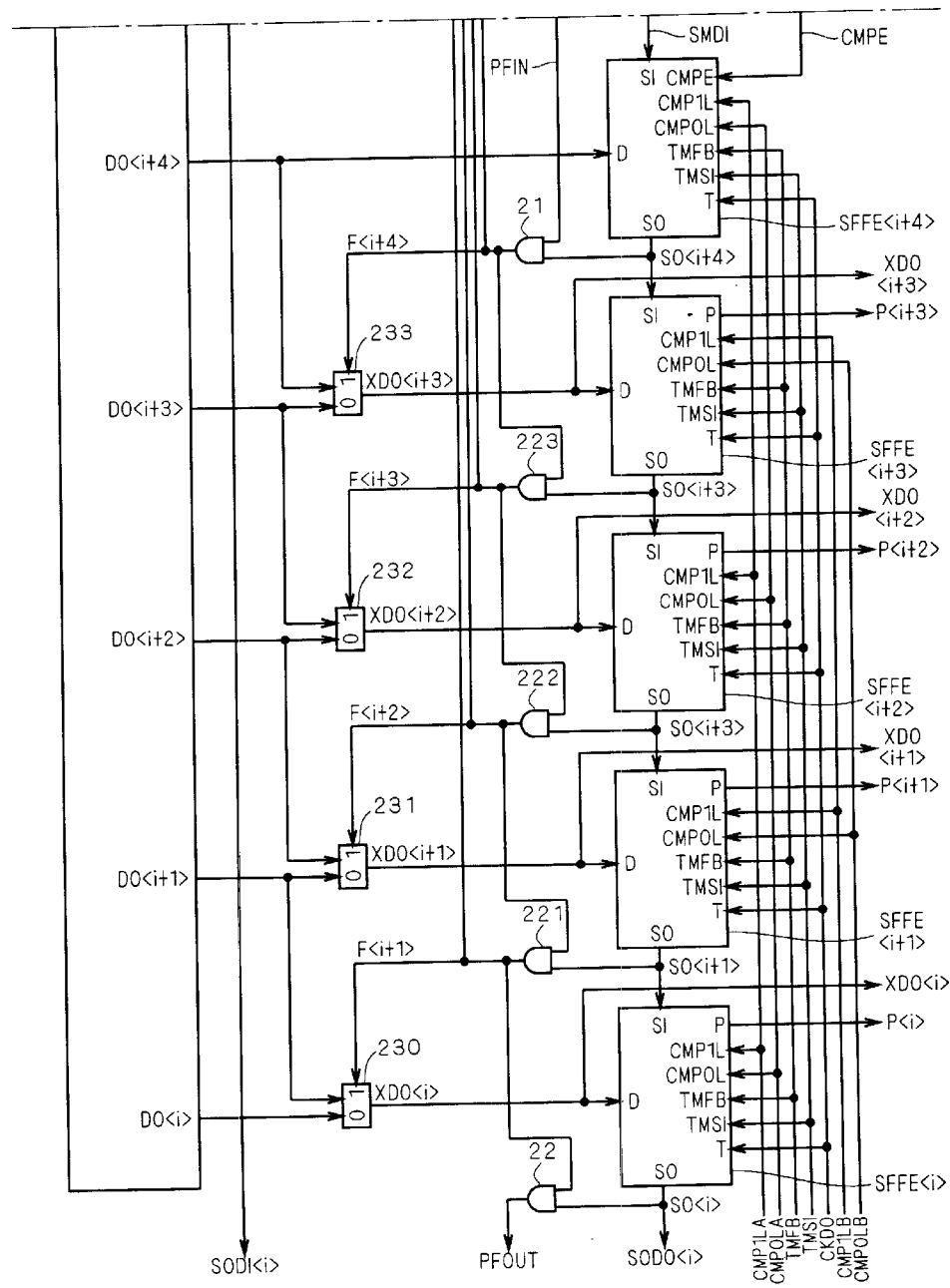

FIGS. 42 to 44 are diagrams showing a semiconductor integrated circuit according to a ninth embodiment of the present invention. FIG. 42 is a diagram illustrating a positional relationship between FIGS. 43 and 44, and FIGS. 43 and 44 are circuit diagrams showing a circuit structure of the semiconductor integrated circuit.

In the semiconductor integrated circuit according to the ninth embodiment, the data control circuit DICONT2 (particularly, the structure shown in FIG. 39) and the OR gate 15 according to the eighth embodiment are implemented by flip-flops FFDI <i> to FFDI <i+4> to be ordinary D-FFs, selectors 70 to 73 and an OR gate 75. In some cases, a D flip-flop FFDI < > will be hereinafter referred to as an FFDI < >.

As shown in these drawings, the selectors 70 to 73 receive redundancy-relieved data inputs XDI <i> to XDI <i+3> at "0" inputs and receive Q outputs of an FFDI <i+1> to an FFDI <i+4> at "1" inputs. A signal SMDI is sent to control inputs of the selectors 70 to 73 in common. Outputs of the selectors 70 to 73 are sent to "1" inputs of selectors 11 to 14, the outputs of the selectors 71 to 73 are sent to "0" inputs of the selectors 11 to 13, and the output of the selector 70 is sent to one of inputs of the OR gate 75.

A "0" input of the selector 14 is SIDI <i+4>, outputs of the selectors 11 to 14 are sent to D inputs of the FFDIs <i+1> to <i+4>, the other input of the OR gate 75 is sent as output data F <i+1>, and an output of the OR gate 75 is sent to a D input of the FFDI <i>.

The FFDI <i> to the FFDI <i+4> are connected in series in order of the FFDI <i+4>, the FFDI <i+3>, the FFDI <i> and receive a signal CKDI at T inputs in common, and the Q outputs of the FFDIs <i> to <i+4> are sent to a 5-bit input section for input data DI <i> to DI <i+4> of an RAM 211. Moreover, the Q output of the FFDI <i> is sent as a signal SODI <i> to the outside. Since other structures are the same as those in the eighth embodiment shown in FIGS. 36 to 39, description will be omitted.

In the ninth embodiment, basically, the selectors 11 to 14 for redundant control are provided between the selectors 70 to 73 for D input switching of the FFDI <i> to the FFDI <i+4> and the FFDI <i> to the FFDI <i+4>.

With such a structure, an operation equivalent to that of the eighth embodiment can be implemented in the ninth embodiment. For example, the selectors 11 to 14 output the "0" inputs and the selectors 70 to 73 output the "1" inputs in a state of SMDI="1" and a selector test signal PFIN="0". Thus, a shift operation can be carried out by the FFDI <i> to the FFDI <i+4>.

Tenth Embodiment

Figure 45:
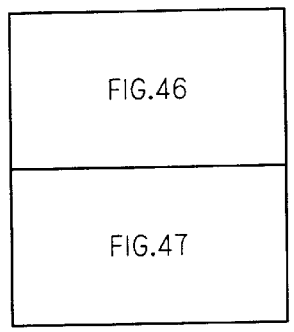
FIG. 45 is a diagram illustrating a positional relationship between FIGS. 46 and 47, FIGS. 46 and 47 are circuit diagrams showing a circuit structure of a semiconductor integrated circuit according to a tenth embodiment.
Figure 46:
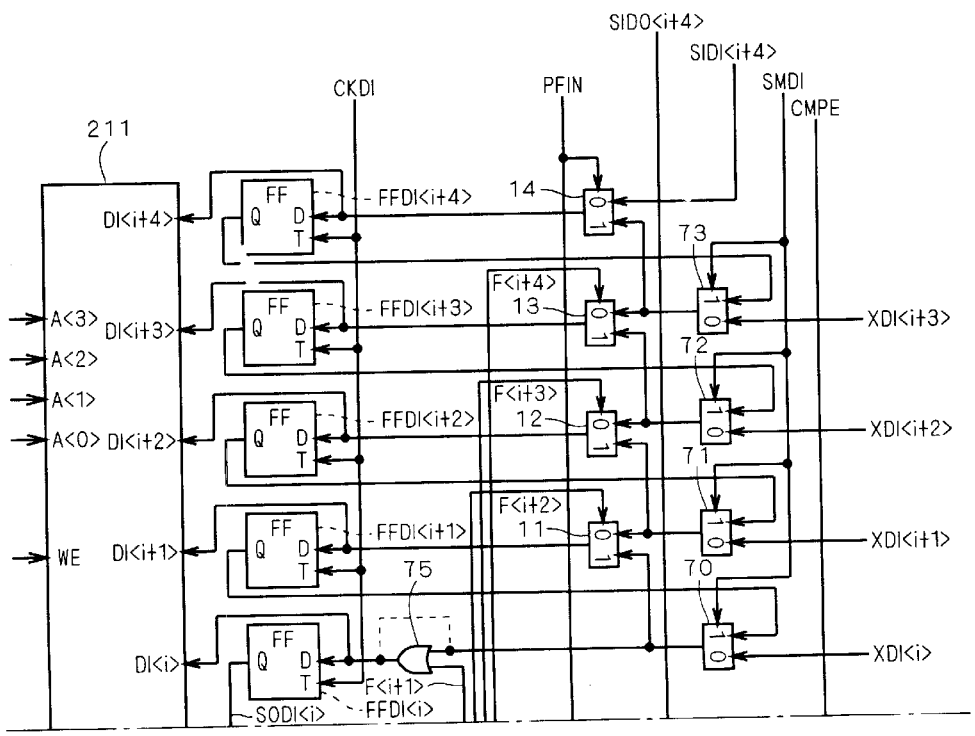

FIGS. 45 to 47 are diagrams showing a semiconductor integrated circuit according to a tenth embodiment of the present invention. FIG. 45 is a diagram illustrating a positional relationship between FIGS. 46 and 47, and FIGS. 46 and 47 are circuit diagrams showing a circuit structure of the semiconductor integrated circuit.

In the semiconductor integrated circuit according to the tenth embodiment, the data control circuit DICONT2 (particularly, the structure shown in FIG. 40) and the OR gate 15 according to the eighth embodiment are implemented by flip-flops FFDI <i> to FFDI <i+4> to be ordinary D-FFs, selectors 70 to 73 and an OR gate 75.

As shown in these drawings, D inputs of the FFDIs <i> to <i+4> are given to input sections for input data DI <i> to DI <i+4> of an RAM 211. Since other structures are the same as the structure according to the ninth embodiment shown in FIGS. 42 to 44, description will be omitted.

With such a structure, an operation equivalent to that of the eighth embodiment can be implemented in the tenth embodiment. In a state of SMDI="1" and a selector test signal PFIN="0", for example, a shift operation can be carried out in the same manner as that in the ninth embodiment.

Eleventh Embodiment

Figure 48:
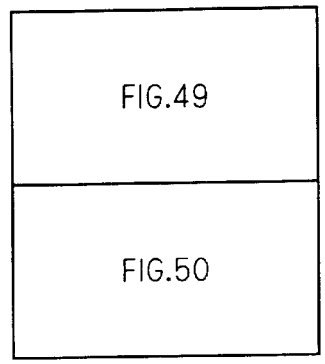
FIG. 48 is a diagram illustrating a positional relationship between FIGS. 49 and 50, FIGS. 49 and 50 are circuit diagrams showing a circuit structure of a semiconductor integrated circuit according to an eleventh embodiment.
Figure 49:
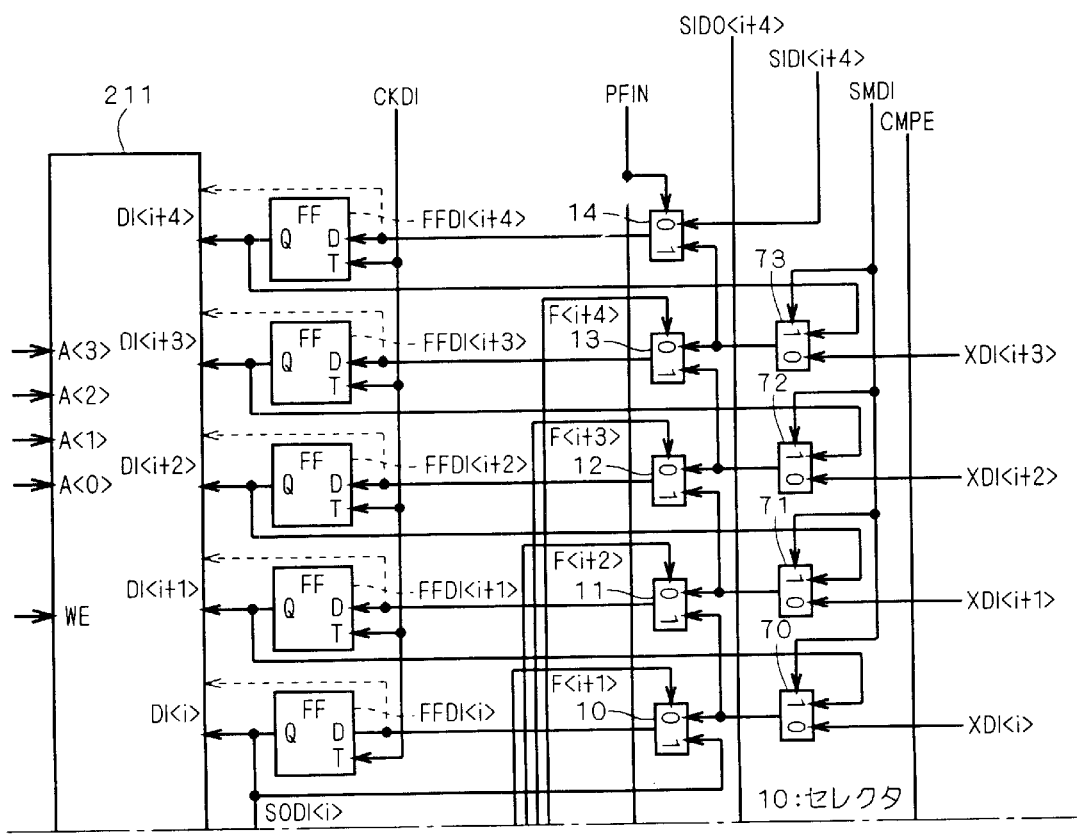

FIGS. 48 to 50 are diagrams showing a semiconductor integrated circuit according to an eleventh embodiment of the present invention. FIG. 48 is a diagram illustrating a positional relationship between FIGS. 49 and 50, and FIGS. 49 and 50 are circuit diagrams showing a circuit structure of the semiconductor integrated circuit.

In the semiconductor integrated circuit according to the eleventh embodiment, the data control circuit DICONT2 (the structure shown in FIG. 39 or 40) and the OR gate 15 according to the eighth embodiment are implemented by flip-flops FFDI <i> to FFDI <i+4> to be ordinary D-FFs and selectors 70 to 73 and 10.

As shown in these drawings, the newly provided selector 10 receives an output of the selector 70 at a "0" input, receives a Q output of the FFDI <i> at a "1" input, and receives output data F <i+1> at a control input, and an output thereof is sent to a D input of the FFDI <i>. Moreover, the OR gate 75 is omitted. Since other structures are the same as those in the ninth or tenth embodiment shown in FIGS. 36 to 41 or FIGS. 42 to 44, description will be omitted.

With such a structure, an operation equivalent to that of the eighth embodiment can be implemented in the eleventh embodiment. In a state of SMDI="1" and a selector test signal PFIN="0", for example, a shift operation can be carried out in the same manner as that in the ninth and tenth embodiments.

Furthermore, signal setting is carried out with SMDI="1", PFIN="1" and SO <i> to SO <i+4>=1. Consequently, all the FFDI <i> to FFDI <i+4> can be set into a data hold state (HOLD state).

In this state, even if a clock is given to a signal CKDI, keeping data of the FFDI <i> to the FFDI <i+4> are not changed. Accordingly, write data of the FFDI < > can be held in the eleventh embodiment.

The data holding operation can be used in a data input for a test of an RAM 211 and can also be used as an input register for temporary storage to hold redundancy write data in a normal operation.

Twelfth Embodiment

Figure 51:
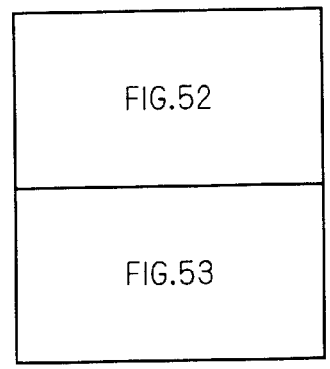
FIG. 51 is a diagram illustrating a positional relationship between FIGS. 52 and 53, FIGS. 52 and 53 are circuit diagrams showing a circuit structure of a semiconductor integrated circuit according to a twelfth embodiment.
Figure 52:
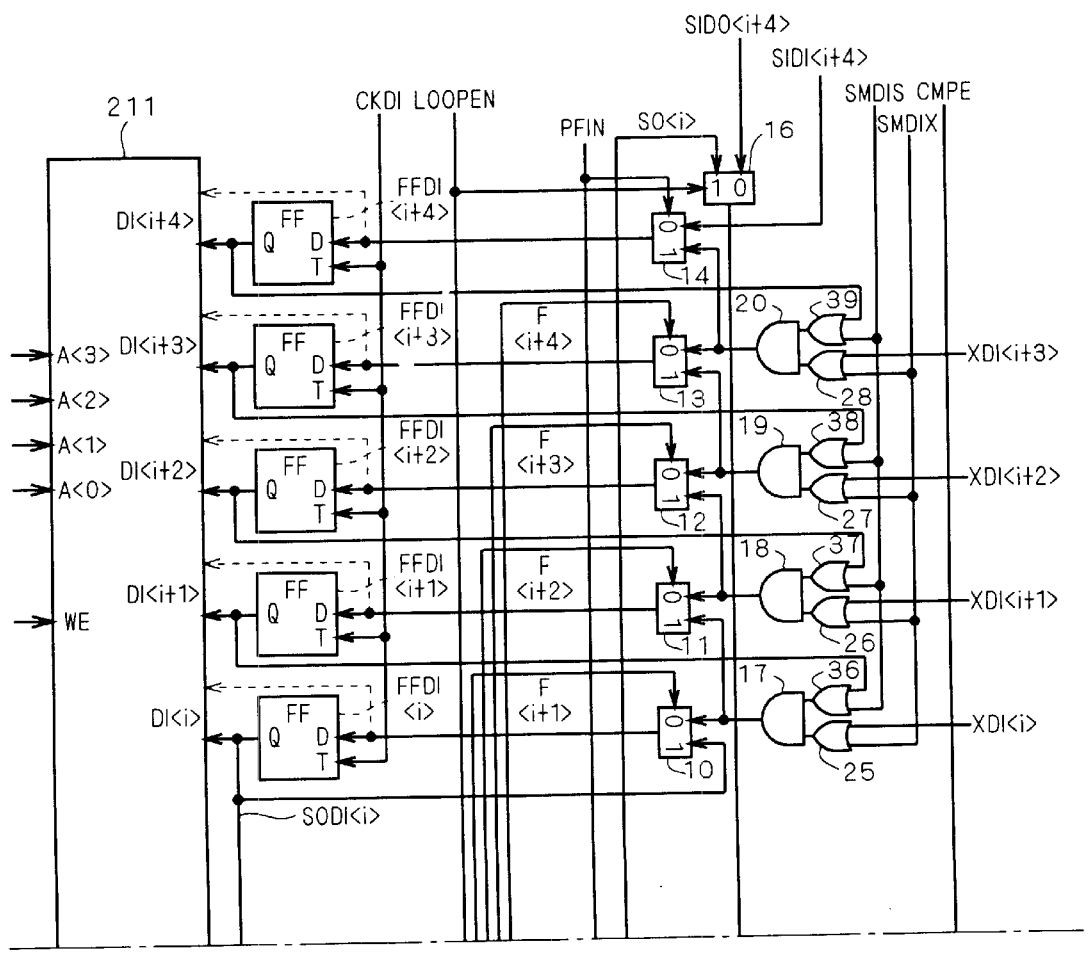
Figure 53:
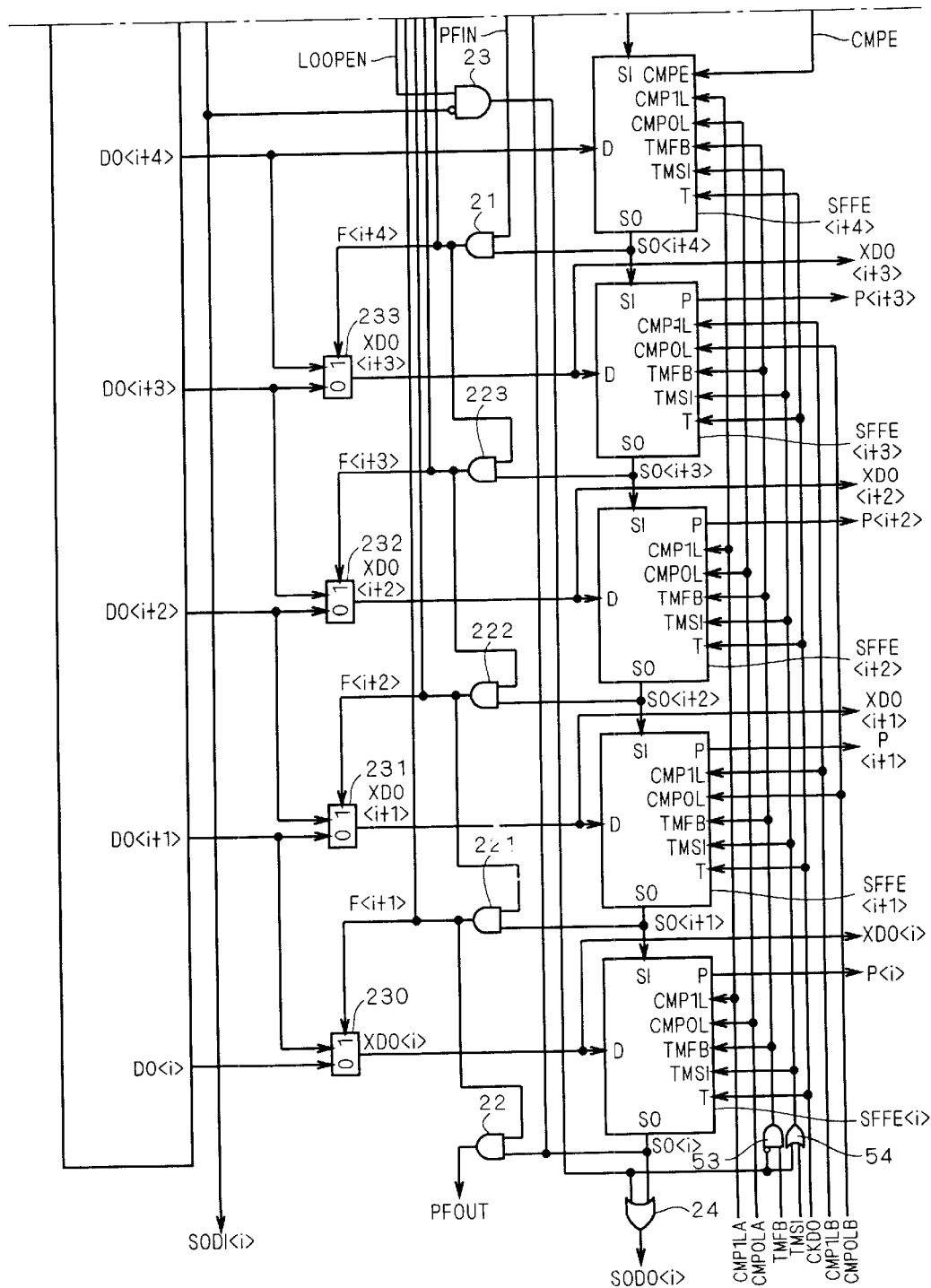

FIGS. 51 to 53 are diagrams showing a semiconductor integrated circuit according to a twelfth embodiment of the present invention. FIG. 51 is a diagram illustrating a positional relationship between FIGS. 52 and 53, and FIGS. 52 and 53 are circuit diagrams showing a circuit structure of the semiconductor integrated circuit.

The semiconductor integrated circuit according to the twelfth embodiment is changed, for example, the selectors 70 to 73 according to the eleventh embodiment are constituted by a logic gate.

As shown in these drawings, OR gates 25 to 28 receive XDIs <i> to <i+3> at inputs and receive a signal SMDIX at the other inputs in common. OR gates 36 to 39 receive Q outputs of an FFDI <i+1> to an FFDI <i+4> at inputs and receive a signal SMDIS at the other inputs in common. AND gates 17 to 20 receive outputs of the OR gates 25 to 28 at inputs and receive outputs of the OR gates 36 to 39 at the other inputs, and outputs thereof are sent to "0" inputs of selectors 10 to 13. These logic gate groups 17 to 20, 25 to 28 and 36 to 39 act equivalently to the selectors 70 to 73.

Furthermore, a newly added selector 16 receives SIDO <i+4> at a "0" input, receives a serial output SO <i> of an SFFE <i> at a "1" input and receives a signal LOOPEN at a control input, and an output thereof is sent to a serial input SI of an SFFE <i+4>.

Moreover, an AND gate 23 receives the signal LOOPEN and an inverted signal of a signal SODI <i>. An OR gate 24 receives an output of the AND gate 23 at one of inputs and receives the serial output SO <i> at the other input, and an output thereof is sent as SODO <i> to the outside.

Furthermore, an AND gate 53 receives an inverted signal of the output of the AND gate 23 at one of inputs and receives a signal TMFB at the other input, and an output thereof is sent to TMFB inputs of the SFFEs <i> to <i+4> in common. An OR gate 54 receives the output of the AND gate 23 at one of inputs and receives a signal TMSI at the other input, and an output thereof is sent to TMSI inputs of the SFFEs <i> to <i+4> in common.

Since other structures are the same as those of the eleventh embodiment shown in FIGS. 48 to 50, description will be omitted.

With such a structure, an operation equivalent to that of the eleventh embodiment can be implemented in the twelfth embodiment. SMDIS="1" and SMDIX ="0" correspond to the SMDI="0" in the eleventh embodiment and SMDIS="0" and SMDIX="1" correspond to the SMDI="1" in the eleventh embodiment.

Accordingly, a shift operation can be carried out in a state of SMDIS="0", SMDIX="1" (corresponding to the SMDI="1" in the eleventh embodiment) and a selector test signal PFIN="0".

Furthermore, signal setting is carried out with SMDIS="0", SMDIX="1", PFIN="1" and SO <i> to SO <i+4>=1. Consequently, all the FFDI <i> to FFDI <i+4> can be set into a data hold state.

Moreover, if a clock is given with SMDIS="1", SMDIX="1", PFIN="0" and SIDI <i+4>=1, all the FFDI <i> to the FFDI <i+4> can be collectively set to "1". At this time, the output Q of the FFDI <i> is "1".

If all the FFDI<i> to the FFDI <i+4> are set to "1" and the shift operation is then repeated in a state of SMDIS="0", SMDIX="1", PFIN="0" and SIDI <i+4>=0, the output Q of the FFDI <i> is set to "1" till four clocks and is set to "0" on and after five clocks.

Thus, the FFDI <i> to the FFDI <i+4> can be utilized as a 5-clock counter.

In the twelfth embodiment, there is added a circuit (RAM test control means (16, 23, 53, 54)) for serially reading, as SODO <i>, test results stored in the scan flip-flops SFFE <i> to SFFE <i+4> having a comparing circuit and for looping them between the SFFE <i> to the SFFE <i+4> and storing them in original positions by utilizing the above-mentioned count operation of the FFDI <i> to the FFDI <i+4>.

By setting LOOPEN="1", a loop from the SODO <i> to a serial input SI of the SFFC <i+4> is constituted according to a switching operation of the selector 16.

If the count operation of the FFDI <i> to the FFDI <i+4> and the shift operation for the test results of the SFFE <i> to the SFFE <i+4> are carried out at the same time in the above-mentioned state, each SFFE < > is forcibly brought into the hold state of "TMFB=0, TMSI=1" after five clocks. Consequently, the test results are stored in the original SFFE < >. Even if six clocks or more are given, the AND gate 23 is set to "1" so that the HOLD state of each SFFE < > is maintained as long as the signal LOOPEN holds "1". Therefore, the test results are not shifted.

By a judging circuit provided in the semiconductor integrated circuit device or on the outside thereof, it is judged whether the test result (5 bits in this example) output as the SODO <i> from the OR gate 24 has a failure for 2 bits or more. If there is a failure for 2 bits or more, it is judged that relief cannot be carried out.

By the loop function, the test result is returned to the position of the original SFFE < >. Therefore, "PFIN=1, LOOPEN=0, SMDIS=1, SMDIX=0" is set and a clock T (CKDO) for the SFFE < > is stopped. Consequently, proper redundancy switching is carried out based on the data stored in the SFFE <i> to the SFFE <i+4>.

While a logic gate to be controlled in response to the signals SMDIS and SMDIX has been used as means for setting "1" to the FFDI <i> to the FFDI <i+4> in the twelfth embodiment, other means can also be used.

For example, the shift operation can also be implemented by shifting in "1" from the SIDI <i+4> by utilizing the shift operation of the FFDI <i> to the FFDI <i+4>. At this time, the shift operation can be carried out by giving more clocks than the number of bits. Moreover, it is also possible to use a flip-flop having a set function as the FFDI <i> to the FFDI <i+4>, for example.

By using, as counters, the FFDI <i> to the FFDI <i+4> provided for setting input data DI of an RAM 211 during the shift operation for judging pass/fail of failure relief as described above, the test results obtained from the SFFE <i> to the SFFE <i+4> can be automatically restored in original positions. At this time, even if more clocks than a necessary bit number are given, there is no hindrance. Therefore, in the case in which a plurality of RAMs are mounted on the semiconductor integrated circuit device, control can be carried out very easily.

For example, in the case in which a 5-bit RAM, an 8-bit RAM and a 12-bit RAM are mounted, a shift operation having 12 clocks (a 1-bit loop operation) is carried out at the same time. Consequently, the test results of these three RAMs are returned and stored in original positions on the scan flip-flop for a test.

The OR gate 24 is added for causing the SODO <i> to output "1" indicative of Pass in relation to the RAM which carries out the shift operation with more bit numbers than the necessary bit number (The OR gate 24 is not essential). If the OR gate 24 is provided, the control of the judging circuit for judging the pass/fail of the relief can be carried out easily. In the example of the three RAMs, if the SODO <i> for the three RAMs is observed for 12 bits, the decision can be carried out. If the OR gate 24 is not provided, for example, SO <i> of a 5-bit RAM is "0" (indicative of Fail), the "0" is observed for additional 7 bits so that control for masking the same is required. However, the drawback can be eliminated by the OR gate 24.

Thirteenth Embodiment

A thirteenth embodiment has an object to easily carry out failure analysis for an RAM by using a memory test device.

In the case in which the detailed failure analysis is to be carried out, it is not desirable that the contents of a test result should be compressed by a scan flip-flop having a comparing circuit (a part of original information should be lost). It is desirable that the test result should be output without compression.

However, an output bit number of the built-in RAM is greater than a bit number which can be processed by the memory test device in some cases. Therefore, it is necessary to reduce the bit number and send an output without data compression in a multiplexer section. In the thirteenth embodiment, the multiplexer section is constituted by AND gates (ANDs <0> to <17>) connected in series for redundancy switching.

Figure 54:
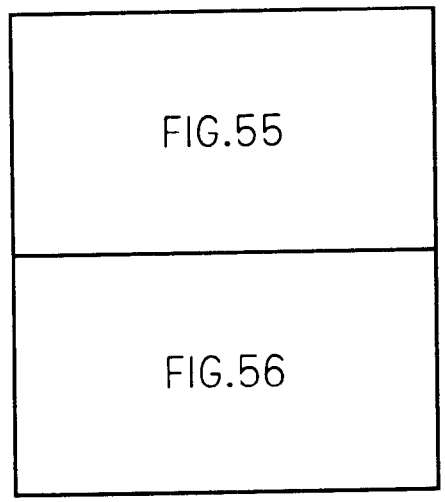
FIG. 54 is a diagram illustrating a positional relationship between FIGS. 55 and 56, FIGS. 55 and 56 are circuit diagrams showing a circuit structure of a multiplexer section according to a thirteenth embodiment.
Figure 55:
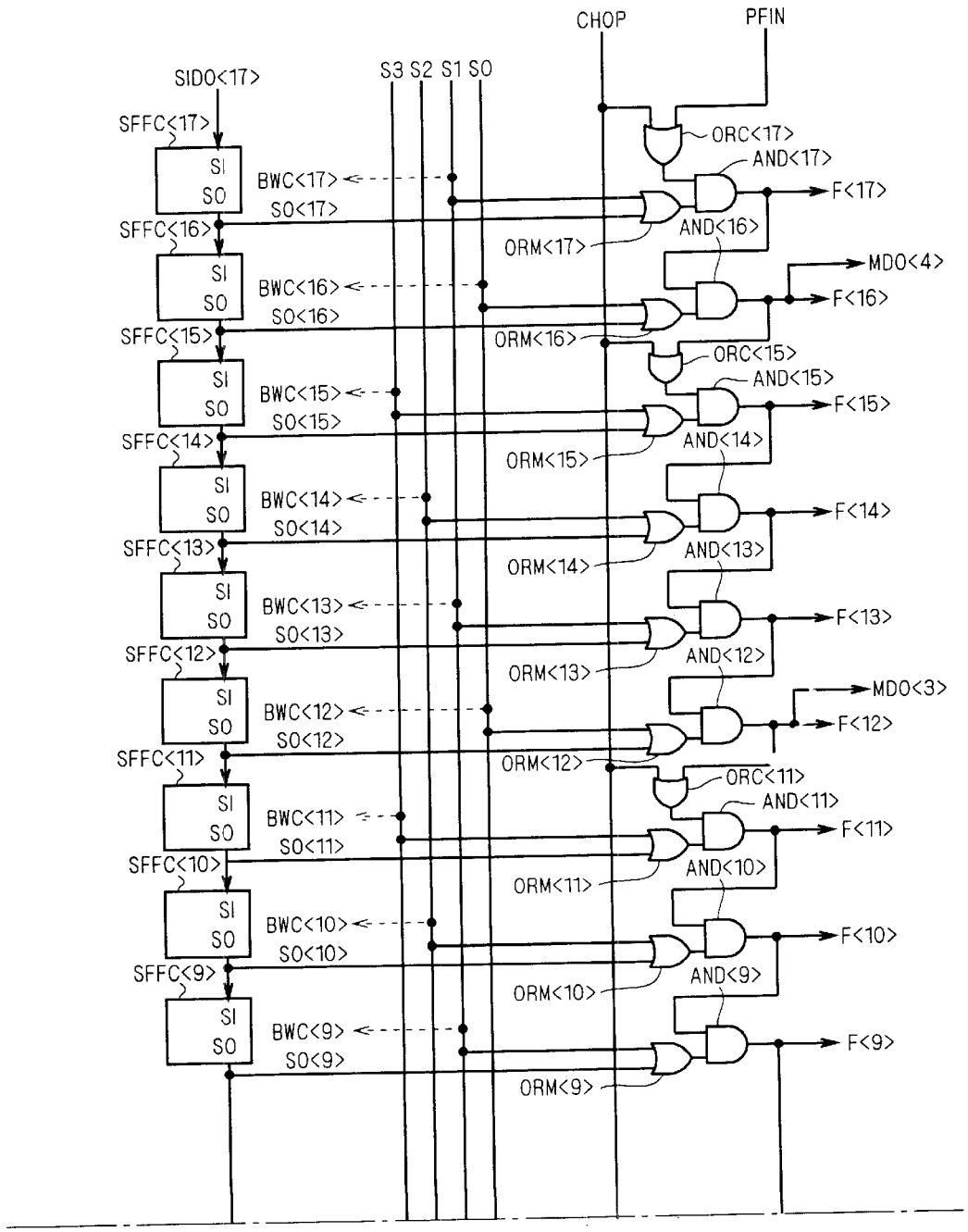
Figure 56:
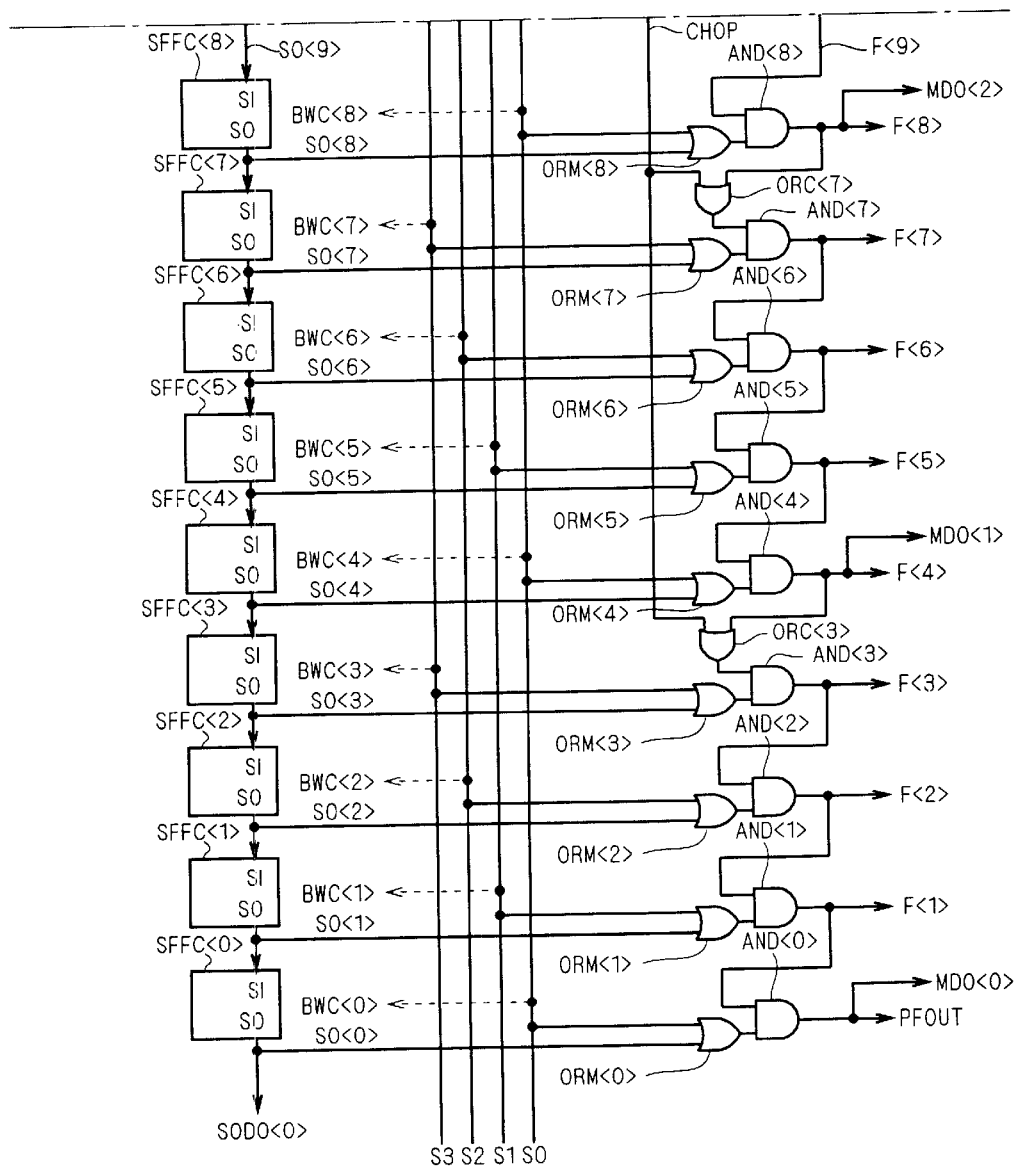

FIGS. 54 to 56 are diagrams showing the multiplexer section of a semiconductor integrated circuit according to the thirteenth embodiment of the present invention. FIG. 54 is a diagram illustrating a positional relationship between FIGS. 55 and 56, and FIGS. 55 and 56 are circuit diagrams showing a circuit structure of the multiplexer section.

While the scan flip-flop (SFFC < >, SFFD < >, SFFE < >) for redundancy control has a 5-bit structure of <i> to <i+4> in the first to twelfth embodiments, it has an 18-bit structure of an SFFC <0> to an SFFC <17> in the thirteenth embodiment.

As shown in these drawings, the multiplexer section is constituted by OR gates ORMs <0> to <17>, OR gates ORCs <3>, <7>, <11>, <15> and <17>, and AND gates <0> to <17>. In some cases, they will be hereinafter referred to as ORM < >, ORC < > and AND < >.

Serial outputs SO <0> to SO <17> of the SFFC <0> to the SFFC <17> are sent to inputs of the OR gates ORM <0> to ORM <17> respectively, a signal S0 is sent to the other inputs of the OR gates ORM <0>, ORM <4>, ORM <8>, ORM <12> and ORM <16>, a signal S1 is sent to the other inputs of the OR gates ORM <1>, ORM <5>, ORM <9>, ORM <13> and ORM <17>, a signal S2 is sent to the other inputs of the OR gates ORM <2>, ORM <6>, ORM <10> and ORM <14>, and a signal S3 is sent to the other inputs of the OR gates ORM <3>, ORM <7>, ORM <11> and ORM <15>.

The AND gates AND <0> to AND <17> for sending output data F < > for redundancy control receive outputs of the OR gates ORM <0> to ORM <17> at inputs, the AND gates ANDs <0>, <1>, <2>, <4>, <5>, <6>, <8>, <9>, <10>, <12>, <13>, <14> and <16> receive output data F <1>, <2>, <3>, <5>, <6>, <7>, <9>, <10>, <11>, <13>, <14>, <15> and <17> at other inputs, and the AND gates ANDs <3>, <7>, <11>, <15> and <17> receive outputs of the OR gates ORCs <3>, <7>, <11>, <15> and <17> at the other inputs. The ANDs <0> to <17> correspond to the AND gates 21, 22 and 221 to 223 in the first embodiment, for example. Outputs of the ANDs <1> to <17> are sent as output data F <1> to <17> and an output of the AND <0> is sent as PFOUT.

Then, outputs of the AND <0>, AND <4>, AND <8>, AND <12> and AND <16> are sent as multiplex outputs MDO <0> to MDO <4> to the outside.

The OR gates ORCs <3>, <7>, <11>, <15> and <17> receive a signal CHOP at inputs in common, and the OR gates ORCs <3>, <7>, <11> and <15> and the ORC <17> receive output data F <4>, <8>, <12> and <16> and a signal PFIN at the other inputs.

Figure 57:
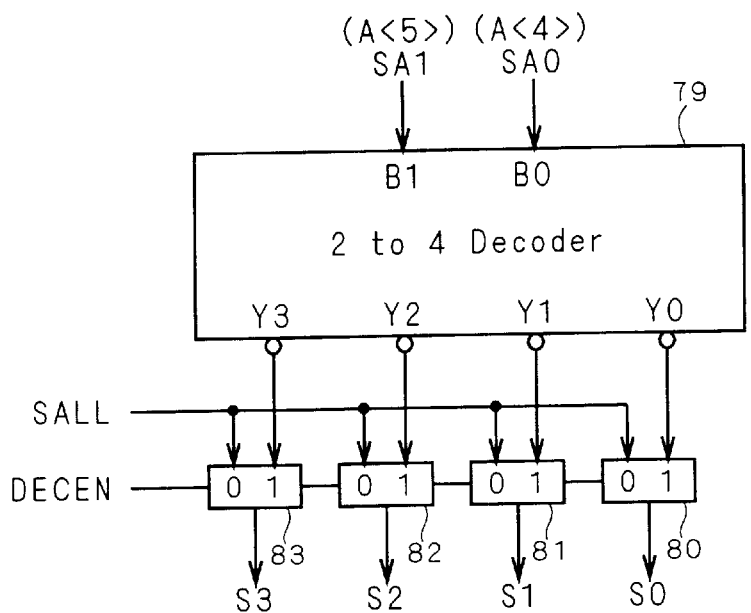
FIG. 57 is a circuit diagram showing an example of a structure of a signal generating circuit for controlling the multiplexer section.

FIG. 57 is a circuit diagram showing an example of a structure of a signal generating circuit for generating signals S0 to S3 for controlling the multiplexer section. As shown in FIG. 57, a decoder 79 receives 2-bit address inputs SA0 and SA1 at 2-bit input sections B0 and B1, and outputs "1" for only 1 bit and "0" for 3 bits as decoding results from 4-bit output sections Y0 to Y3.

Selectors 80 to 83 receive, at "1" inputs, inverted signals of the signals sent from the output sections Y0 to Y3, receive a signal SALL at "0" inputs in common, and receive DECEN at control inputs in common.

Figure 58:
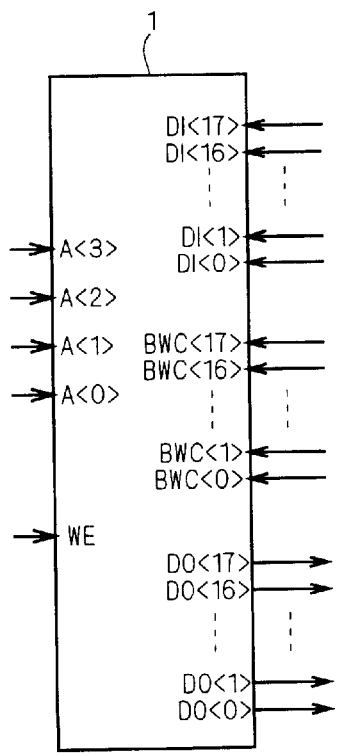
FIG. 58 is a diagram illustrating an example of a structure of an RAM corresponding to the multiplexer section according to the thirteenth embodiment.

FIG. 58 is a diagram showing an example of a structure of an RAM corresponding to the multiplexer section according to the thirteenth embodiment. As shown in FIG. 58, an RAM 1 receives 4-bit address inputs A <0> to A <3>, a write control signal WE, input data DI <0> to DI <17> and bit write (Bit-Write) control signals BWC <0> to BWC <17>, and sends output data DO <0> to DO <17>.

A writing operation of the whole RAM 1 is controlled by the write control signal WE. If BWC <n> "1" is set when writing is to be carried out, the writing operation can be suppressed for a bit number n. For such an RAM 1, a connection of the signal BWC < > corresponding to a broken line in FIGS. 55 and 56 can be carried out (the bit write control signal BWC < > is not required but is desirably present).

Description will be given to an operation of the multiplexer section according to the thirteenth embodiment. First of all, CHOP="1" is set so that all outputs of the ORC < > are set to "1" and the ANDs <0> to <17> connected in series are divided.

For example, the AND <4> to the AND <7> for outputting the output data F <4> to F <7> constitute a 4-input (outputs of the ORMs <4> to <7>) AND gate. Moreover, the ANDs <16> and <17> for outputting output data F <16> and F <17> constitute a 2-input (outputs of the ORMs <16> and <17>) AND gate.

The AND gate groups thus divided are combined with the corresponding ORMs < > so that a multiplexer can be constituted.

For example, the outputs of the ORMs <4> to <7> are ANDed with the ANDs <4> to <7> so that the MDO <1> is output to the outside.

SO <4>, SO <5>, SO <6> and SO <7> are given to inputs of the ORM <4>, the ORM <5>, the ORM <6> and the ORM <7>, and signals S0, S1, S2 and S3 are sent to the other inputs. Consequently, the multiplex output MDO <1> is determined as described above.

MDO <1>=SO <4> is set with "S0=0, S1=1, S2=1, S3=1", MDO <1>=SO <5> is set with "S0=1, S1=0, S2=1, S3=1", MDO <1>=SO <6> is set with "S0=1, S1=1, S2=0, S3=1", and MDO <1>=SO <7> is set with "S0=1, S1=1, S2=1, S3=0".

In the multiplexer section according to the thirteenth embodiment, MDO <k> is determined for k=0 to 3 in the following manner.

MDO <k>=SO <4*k> is set with "S0=0, S1=1, S2=1, S3=1", MDO <k>=SO <4*k+1> is set with "S0=1, S1=0, S2=1, S3=1", MDO <k>=SO <4*k+2> is set with "S0=1, S1=1, S2=0, S3=1", and MDO <k>=SO <4*k+2> is set with "S0=1, S1=1, S2=1, S3=0".

In the thirteenth embodiment, MDO <k> is determined for k=4 in the following manner.

MDO <k>=SO <4*k> is set with "S0=0, S1=1, S2=1, S3=1", MDO <k>=SO <4*k+1> is set with "S0=1, S1=0, S2=1, S3=1", MDO <k>="1" is set with "S0=1, S1=1, S2=0, S3=1", and MDO <k>="1" is set with "S0=1, S1=1, S2=1, S3=0".

All the MDOs < > are set to "1" with "S0=1, S1=1, S2=1, S3=1". Moreover, MDO <k> is a result of an AND operation of SO <4*k>, SO <4*k+1>, SO <4*k+2> and SO <4*k+2> with "S0=0, S1=0, S2=0, S3=0".

The signals S0, S1, S2 and S3 can be set easily through the circuit shown in FIG. 57 as described above. SA0 and SA1 are extended address signals and correspond to additional address inputs A <4> and A <5> in the RAM shown in FIG. 58.

A normal operation can be implemented by signal setting to "S0=0, S1=0, S2=0, S3=0" (all the BWCs < > are "0" and outputs of ORMs <0> to <17> are changed to serial outputs SO <0> to <17>) with DECEN="0" and SMALL="0".

In the thirteenth embodiment, as described above, the multiplexer section can be constituted by utilizing the AND gates to be the selection control data setting means which are connected in series for redundancy switching. Consequently, an increase in a circuit scale can be suppressed.

When the failure analysis of the RAM 1 is to be carried out, the following two cycles are repeated while changing addresses A <0> to A <3> and SA0 (A <4>) and SA1 (A <5>).

(1) In a state of a signal PFIN="0" (a "0" input side is selected by a redundancy selector), the output data of the RAM 1 are fetched into FFs in scan flip-flops SFFCs <0> to <17> having a comparing circuit.

(2) In a state of CHOP "1" and DECEN="1", the output data of the SFFCs <0> to <17> are output as MDO < >.

In place of the above-mentioned (1), the following may be carried out. (1)' In a state of PFIN=0 (the "0" input side is selected by the redundancy selector), the output data of the RAM are compared with an expectation and a result of the comparison is fetched into the FFs in the scan flip-flops SFFCs <0> to <17> having a comparing circuit.

For example, the above-mentioned (1)' can be executed by using the COMPARE-ONCE mode shown in FIG. 23.

While the AND gates connected in series for redundancy switching have been used to constitute the 4-bit multiplexer section in the thirteenth embodiment, it is a matter of course that the same multiplexer section can be constituted with 2 bits or more.

Fourteenth Embodiment

In the case in which a bit number of a multiplex output MDO < > is too great to be processed by a memory test device even if the multiplexer section described in the thirteenth embodiment is applied, it is necessary to add a second multiplexer section for reducing the bit number without further compressing data.

For example, in the case in which the output bit number of an RAM is 72 bits and that of the multiplex output MDO < > is 18 bits, the second multiplexer section is required to covert the bit number to have 9 bits, which can be implemented in the fourteenth embodiment.

Figure 59:
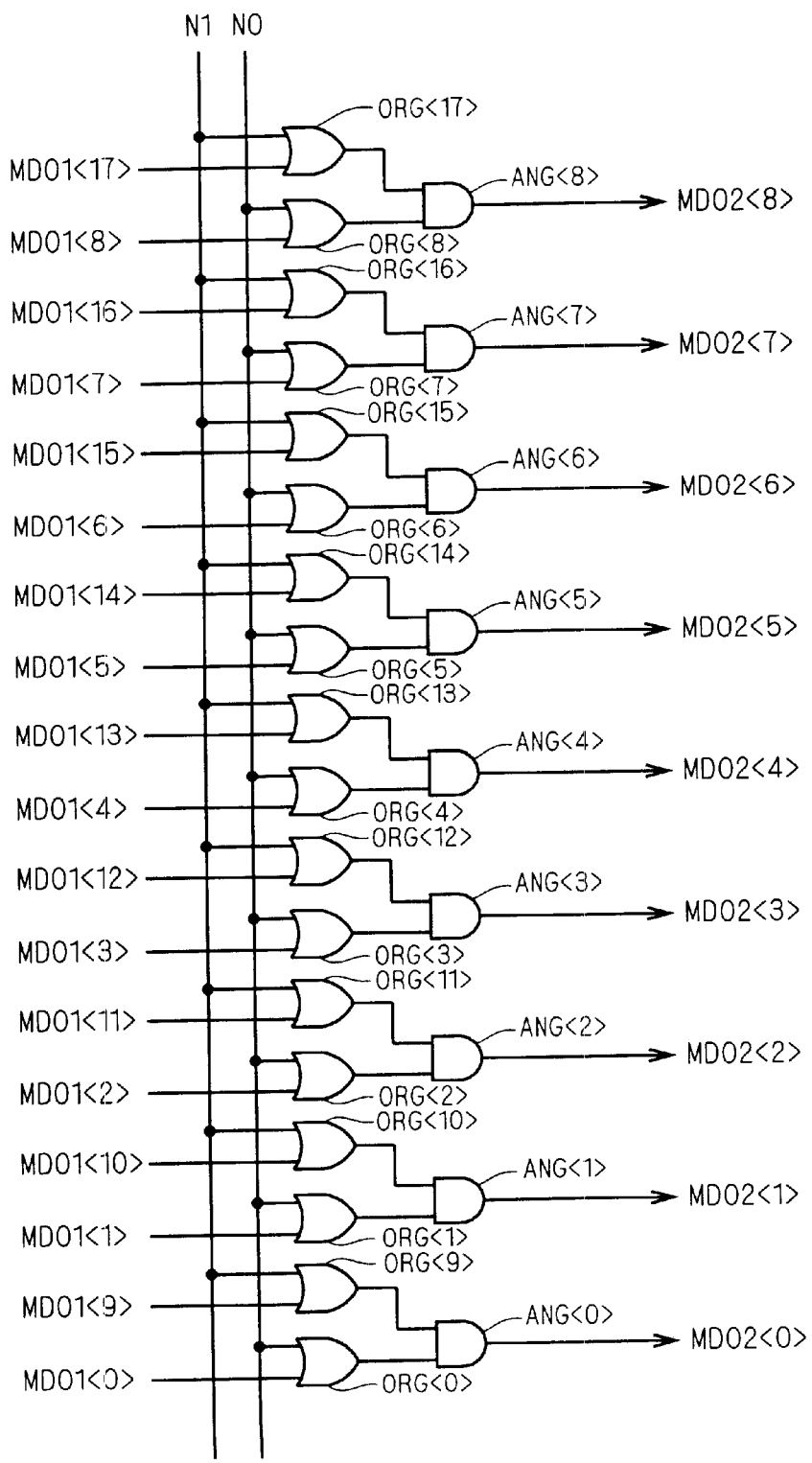
FIG. 59 is a circuit diagram showing a circuit structure of a second multiplexer section according to a fourteenth embodiment.

FIG. 59 is a circuit diagram showing a second multiplexer section of a semiconductor integrated circuit according to the fourteenth embodiment of the present invention.

As shown in FIG. 59, the second multiplexer section is constituted by OR gates ORGs <0> to <17> and AND gates ANGs <0> to <8> to decrease the bit numbers of the first multiplex outputs MDO1s <0> to <17> having 18 bits and to output second multiplex outputs MDO2s <0> to <8> having 9 bits. The OR gate ORG < > and the AND gate ANG < > will be hereinafter referred to as ORG < > and ANG < > in some cases. Moreover, the first multiplex outputs MDO1s <0> to <17> correspond to the multiplex outputs MDOs <0> to <4> sent from the multiplexer section according to the thirteenth embodiment.

The OR gates ORGs <0> to <17> receive the first multiplex outputs MDO1s <0> to <17> at inputs, the ORGs <0> to <8> receive a signal N0 at the other inputs in common, and the ORGs <9> to <17> receive a signal N1 at the other inputs in common.

The ANGs <0> to <8> receive outputs of the ORGs <0> to <8> at inputs and receive outputs of the ORGs <9> to <17> at the other inputs, and outputs thereof are sent as the second multiplex outputs MDO2s <0> to <8>.

Figure 60:
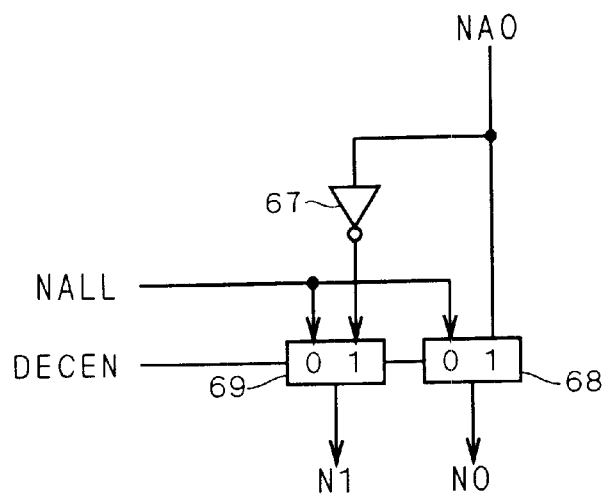
FIG. 60 is a circuit diagram showing an example of a structure of a signal generating circuit for controlling a multiplexer section.

FIG. 60 is a circuit diagram showing an example of a structure of a signal generating circuit for generating the signals N0 and N1 for controlling the second multiplexer section.

As shown in FIG. 60, a selector 68 receives an extended address input NA0 at a "1" input and receives a signal NALL at a "0" input. A selector 69 receives, at a "1" input, an inverted signal obtained from the address input NA0 through an inverter 67 and receives the signal NALL at a "0" input. A signal DECEN is input to control inputs of the selectors 68 and 69 in common.

In the signal generating circuit having such a structure, if DECEN="1" is set, one of the signals N0 and N1 is set to "0" and the other signal is set to "1" based on the address input NA0.

In the second multiplexer section according to the fourteenth embodiment, accordingly, a second multiplex output MDO2 <k>=MOD1 <k> is set with "N0=0, N1=1" and MDO2 <k>=MOD1 <k+9> is set with "N0=1, N1=0" for k=0 to 8.

With "N0=1, N1=1", all the MDO2s < >are set to "1". With "N0=0, S1=0", the MDO2 <k> is a result of an AND operation of the MOD1 <k> and the MOD1 <k+9>.

Accordingly, analysis can be carried out by using a memory test device capable of executing a memory test with 9 bits based on the second multiplex outputs MDO2s <0> to <8>.

Figure 61:
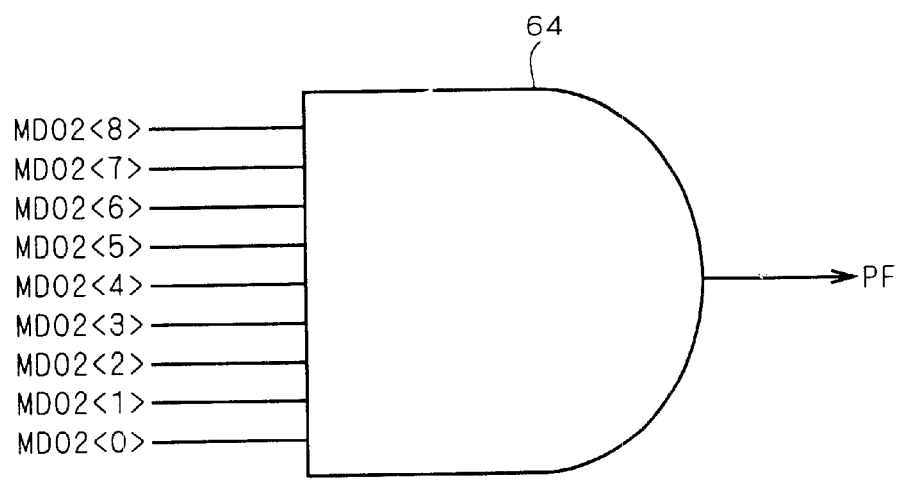
FIG. 61 is a circuit diagram showing a circuit structure of a failure result output circuit.

FIG. 61 is a circuit diagram showing a circuit structure of a failure result output circuit which can be utilized in the fourteenth embodiment. As shown in FIG. 61, an AND gate 64 receives the second multiplex outputs MDO2s <0> to <8> and outputs a result of the AND operation as a detection signal PF.

Accordingly, Pass/Fail in the whole MDO1 < > can be detected based on "1"/"0" of the detection signal PF in a state of DECEN="0" and NALL="0". It is necessary to detect the failure of the RAM by using the above-mentioned (1)' in the thirteenth embodiment. The circuit shown in FIG. 61 is not essential to the fourteenth embodiment.

Fifteenth Embodiment

In the case in which a bit number of a multiplex output MDO < > is too great to be processed by a memory test device even if the multiplexer section described in the thirteenth embodiment is applied, it is necessary to add a second multiplexer section for reducing the bit number without further compressing data.

For example, in the case in which the output bit number of an RAM is 72 bits and that of the multiplex output MDO < > is 18 bits, the second multiplexer section is required to covert the bit number to have 5 bits, which can be implemented in the fifteenth embodiment.

Figure 62:
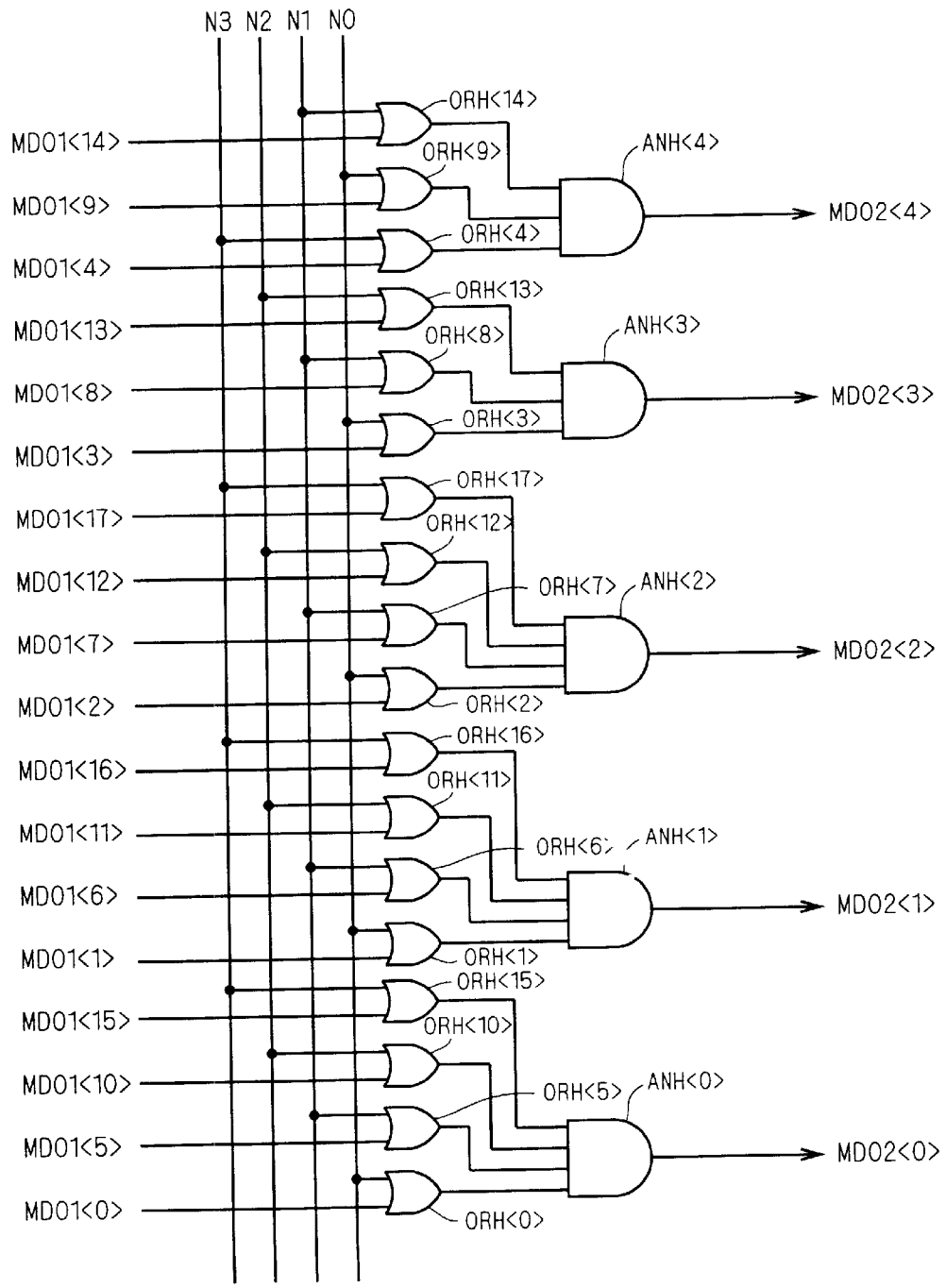
FIG. 62 is a circuit diagram showing a circuit structure of a second multiplexer section according to a fifteenth embodiment.

FIG. 62 is a circuit diagram showing a circuit structure of the second multiplexer section. As shown in FIG. 62, the second multiplexer section is constituted by OR gates ORHs <0> to <17> and AND gates ANHs <0> to <4> to further decrease the bit numbers of first multiplex outputs MDO1s <0> to <17> having 18 bits and to output second multiplex outputs MDO2s <0> to <4> having 5 bits. The OR gate ORH < > and the AND gate ANH < > will be hereinafter referred to as ORH < > and ANH < > in some cases. Moreover, the first multiplex outputs MDO1s <0> to <17> correspond to the multiplex outputs MDOs <0> to <4> sent from the multiplexer section according to the thirteenth embodiment.

The OR gates ORHs <0> to <17> receive the first multiplex outputs MDO1s <0> to <17> at inputs, the OR gates ORHs <0> to <3> and the ORH <9> receive a signal N0 at the other inputs, the OR gates ORHs <5> to <8> and the ORH <14> receive a signal N1 at the other inputs, the OR gates ORHs <10> to <13> receive a signal N2 at the other inputs, and the OR gates ORHs <15> to <17> and the ORH <4> receive a signal N3 at the other inputs.

The ANH <0> receives outputs of the ORHs <0>, <5>, <10> and <15>, the ANH <1> receives outputs of the ORHs <1>, <6>, <11> and <16>, the ANH <2> receives outputs of the ORHs <2>, <7>, <12> and <17>, the ANH <3> receives outputs of the ORHs <3>, <8> and <13>, and the ANH <4> receives outputs of the ORHs <4>, <9> and <14>, and outputs thereof are sent as the second multiplex outputs MDO2s <0> to <4>.

Figure 63:
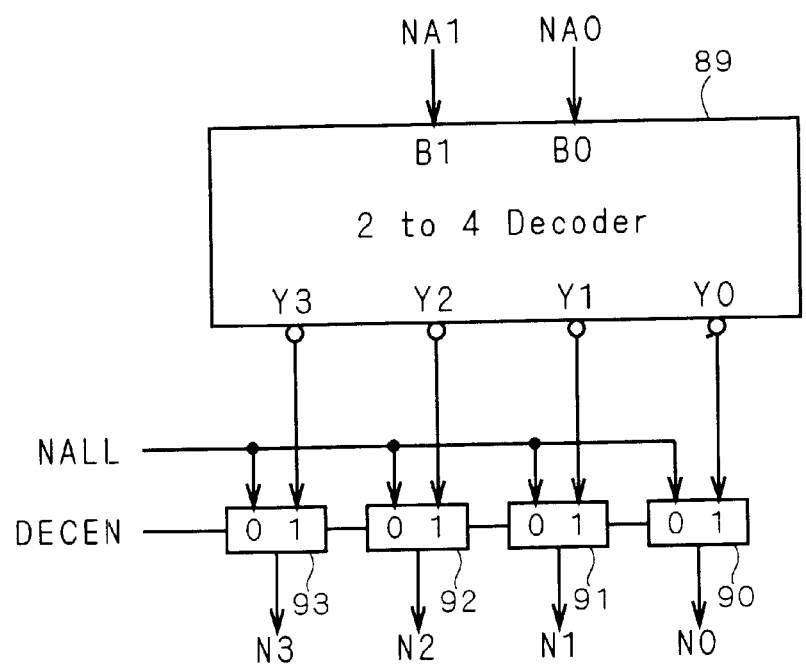
FIG. 63 is a circuit diagram showing an example of a structure of a signal generating circuit for controlling a multiplexer section.

FIG. 63 is a circuit diagram showing an example of a structure of a signal generating circuit for generating the signals N0 to N3 for controlling the second multiplexer section. As shown in FIG. 63, a decoder 89 receives 2-bit address inputs NA0 and NA1 at 2-bit input sections B0 and B1 and outputs, as decoding results, "1" for only 1 bit and "0" for 3 bits from 4-bit output sections Y0 to Y3.

Selectors 90 to 93 receive inverted signals of the signals obtained from the output sections Y0 to Y3 at "1" inputs, receive a signal NALL at "0" inputs in common, and receive DECEN at control inputs in common.

The second multiplexer section according to the fifteenth embodiment determines MDO <k> for k=0 to 3 in the following manner.

MDO2 <k>=SO <k> is set with "N0=0, N1=1, N2=1, N3=1", MDO2 <k>=MDO1 <k+2> is set with "N0=1, N1=0, N2=1, N3=1", MDO2 <k>=MDO1 <k+0O> is set with "N0=1, N1=1, N2=0, N3=1", and MDO2 <k>=MDO1 <k+15> is set with "N0=1, N1=1, N2=1, N3=0" (MOD2 <3>="1" is set).

In the fifteenth embodiment, the MDO2 <k> is determined with k=4 in the following manner.

MDO2 <4>=MDO1 <9> is set with "N0=0, N1=1, N2=1, N3=1", MDO2 <4>=MDO1 <14> is set with "N0=1, N1=0, N2=1, N3=1", MDO2 <4>="1" is set with "N0=1, N1=1, N2=0, N3=1", and MDO2 <4>=MDO1 <4> is set with "N0=1, N1=1, N2=1, N3=0".

With "N0=1, N1=1, N2=1, N3=1", all the MDO2s < > are set to "1". With "N0=0, N1=0, N2=0, N3=0", MDO2 <k> for k=0 to 4 is obtained as a result of an AND operation of MDO1 <k>, MDO1 <k+5>, MDO1 <k+10> and MDO1 <k+15> (MDO1 <k+15> is not present with k=3, 4).

The above-mentioned signals N0 to N3 can easily be generated by the circuit shown in FIG. 63 in the same manner as those in the thirteenth embodiment. NA0 and NA1 indicate extended address signals.

As described above, analysis can be carried out by a memory test device capable of executing a memory test with 5 bits based on the second multiplex outputs MDO2s <0> to <4> in the fifteenth embodiment.

Figure 64:
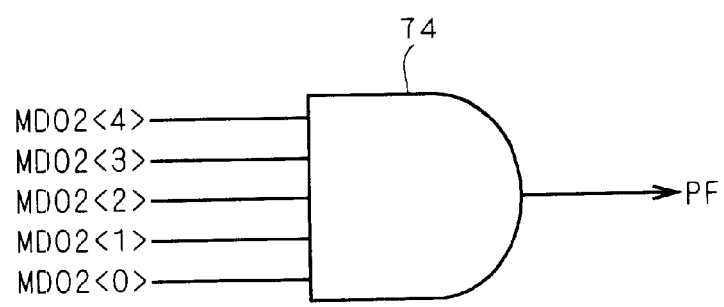
FIG. 64 is a circuit diagram showing a circuit structure of a failure result output circuit.

FIG. 64 is a circuit diagram showing a circuit structure of a failure result output circuit which can be utilized in the fifteenth embodiment. As shown in FIG. 64, an AND gate 74 receives the second multiplex outputs MDO2s <0> to <4> and outputs a result of the AND operation as a detection signal PF.

Accordingly, Pass/Fail in the whole MDO1 < > can be detected based on "1"/"0" of the detection signal PF in a state of DECEN="0" and NALL="0". It is necessary to detect the failure of the RAM by using the above-mentioned (1)' in the thirteenth embodiment. The circuit shown in FIG. 64 is not essential to the fifteenth embodiment.

Sixteenth Embodiment

Figure 65:
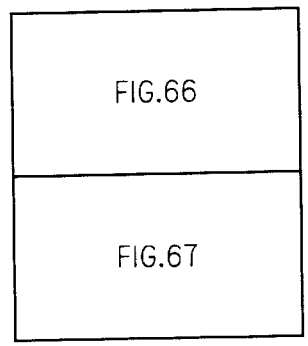
FIG. 65 is a diagram illustrating a positional relationship between FIGS. 66 and 67, FIGS. 66 and 67 are circuit diagrams showing a circuit structure of a semiconductor integrated circuit according to a sixteenth embodiment.
Figure 66:
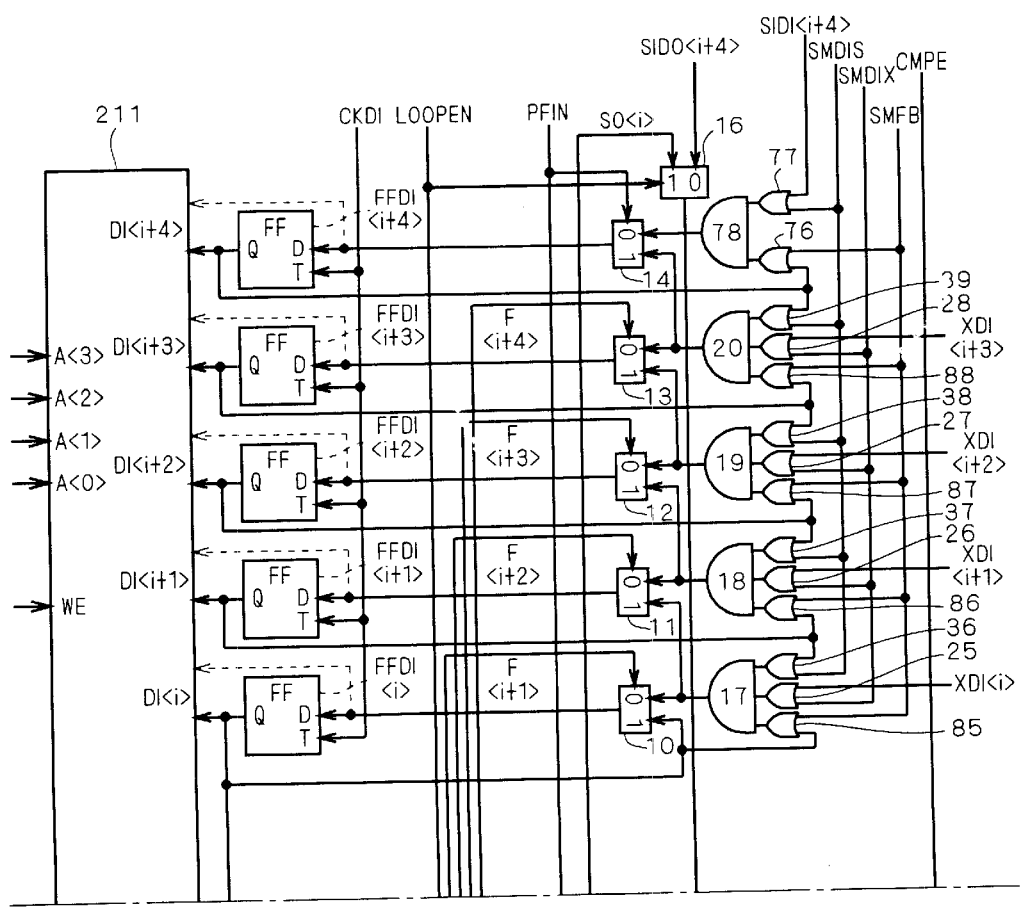
Figure 67:
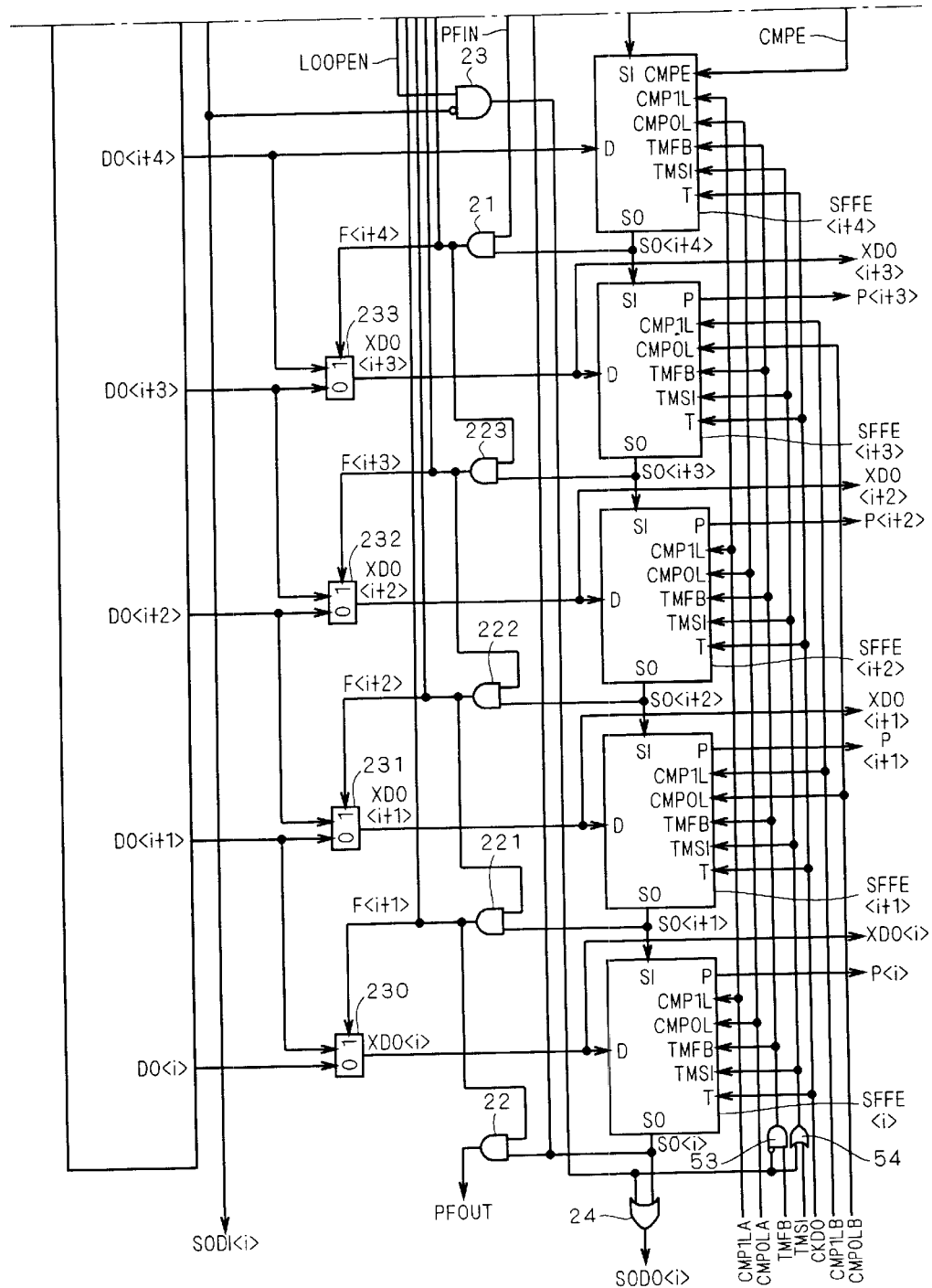

FIGS. 65 to 67 are diagrams showing a semiconductor integrated circuit according to a sixteenth embodiment of the present invention. FIG. 65 is a diagram illustrating a positional relationship between FIGS. 66 and 67, and FIGS. 66 and 67 are circuit diagrams showing a circuit structure of the semiconductor integrated circuit.

In the semiconductor integrated circuit according to the sixteenth embodiment, OR gates 85 to 88, OR gates 76 and 77 and an AND gate 78 are further added to the structure according to the twelfth embodiment. Moreover, each of AND gates 17 to 20 is extended to have three inputs in place of two inputs.

The OR gates 85 to 88 receive a signal SMFB at inputs and receive Q outputs of an FFDI <i> to an FFDI <i+3> at the other inputs, and outputs of the OR gates 85 to 88 are sent as third inputs of the AND gates 17 to 20, respectively.

The OR gate 76 receives the signal SMFB at one of inputs and receives the Q output of an FFDI <i+4> at the other input. The OR gate 77 receives a signal SIDI <i+4> at one of inputs and receives a signal SMDIS at the other input.

The AND gate 78 receives outputs of the OR gates 76 and 77, and an output thereof is sent to a "0" input of a selector 14. Since other structures are the same as those in the twelfth embodiment shown in FIGS. 51 to 53, description will be omitted.

In the sixteenth embodiment having such a structure, the FFDI <i> to the FFDI <i+4> can be caused to execute a data holding operation (HOLD state) by simple signal setting respectively in addition to the operation according to the twelfth embodiment.

More specifically, if SMFB="0", SMDIS="1", SMDIX="1" and PFIN="0" are set, each FFDI < > can fetch its own Q output data at a D input.

The data holding operation can also be used in a test for an RAM 211, and can also be used as an input register for temporary storage to hold redundancy write data in a normal operation.

While the serial outputs SO of the SFFE <i+1> to the SFFE <i+4> should be set to "SO <i+4>=1, SO <i+3>=1, SO <i+2>=1 and SO <i+1>=1" in order to cause the FFDI < > to carry out the data holding operation in the ninth and tenth embodiments, the setting operation is not required in the sixteenth embodiment. Thus, it is possible to obtain the effect that signal control can be carried out very easily.

Seventeenth Embodiment

Figure 68:
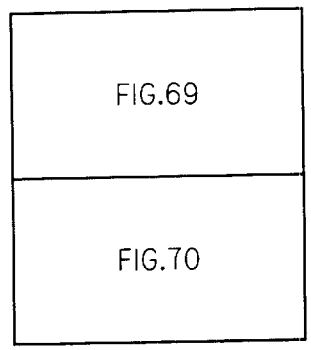
FIG. 68 is a diagram illustrating a positional relationship between FIGS. 69 and 70, FIGS. 69 and 70 are circuit diagrams showing a circuit structure of a semiconductor integrated circuit according to a seventeenth embodiment.
Figure 69:
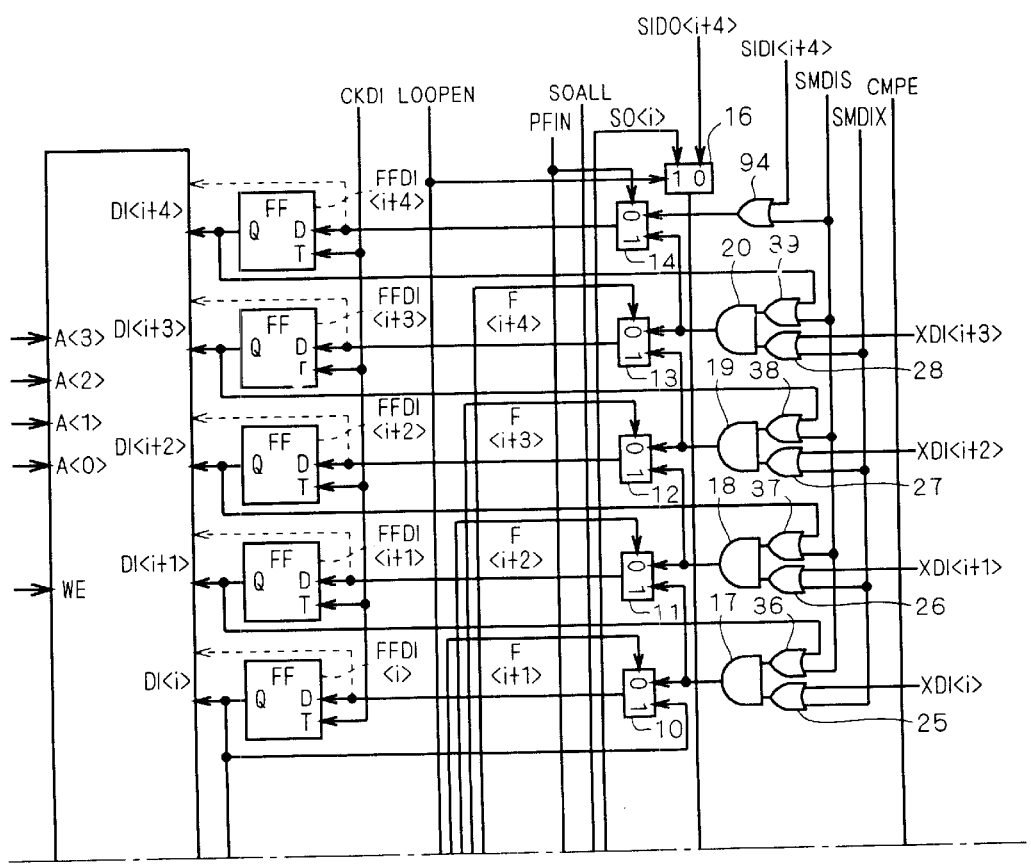
Figure 70:
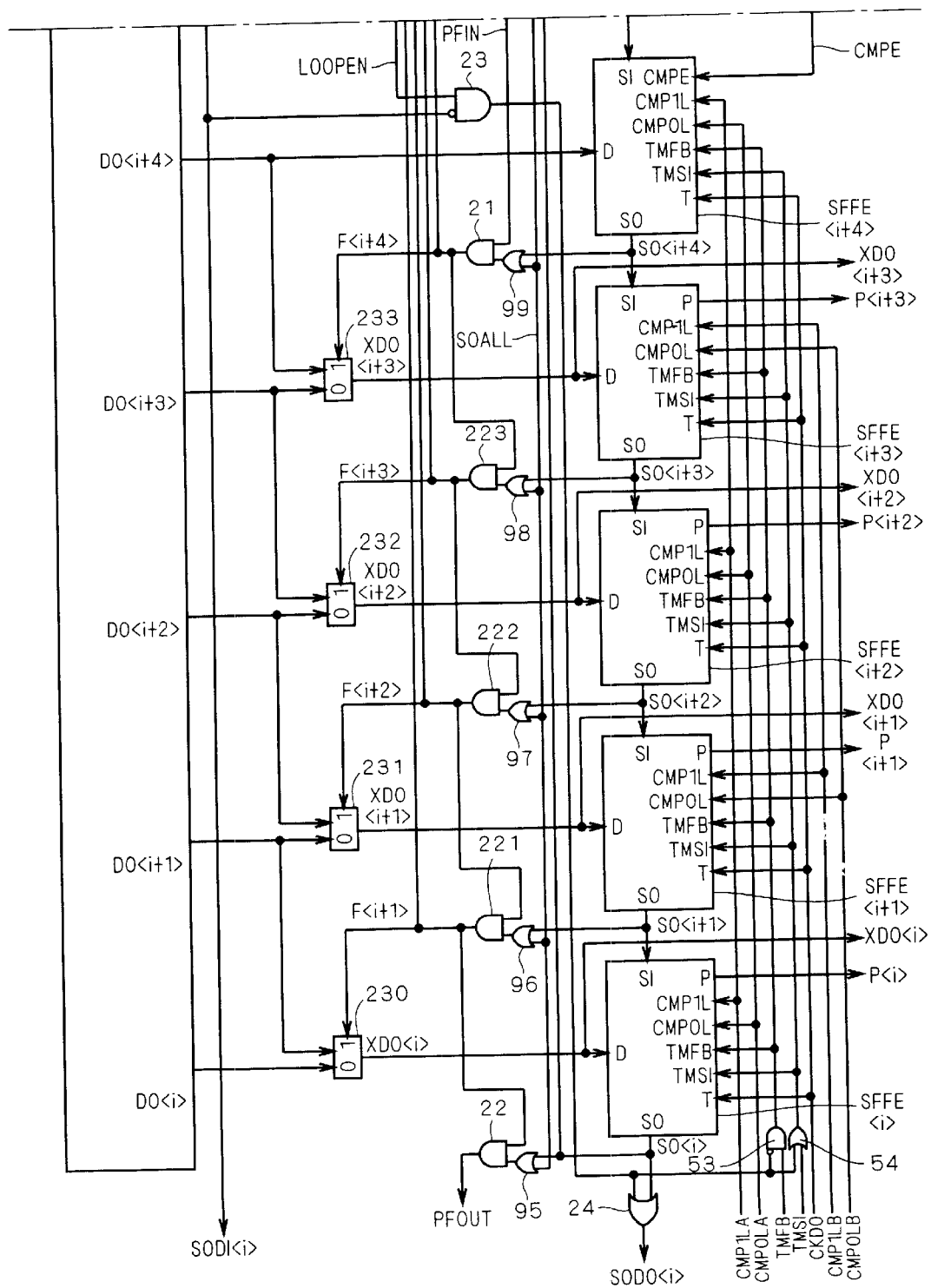
Figure 71:
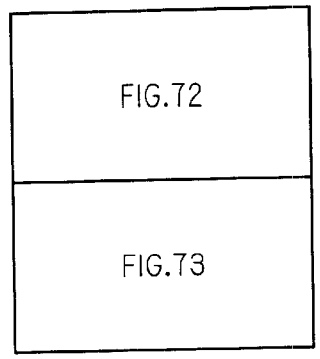
FIG. 71 is a diagram illustrating a positional relationship between FIGS. 72 and 73, FIGS. 72 and 73 are circuit diagrams showing a structure of a conventional RAM circuit comprising a test circuit and a redundancy circuit.
Figure 72:
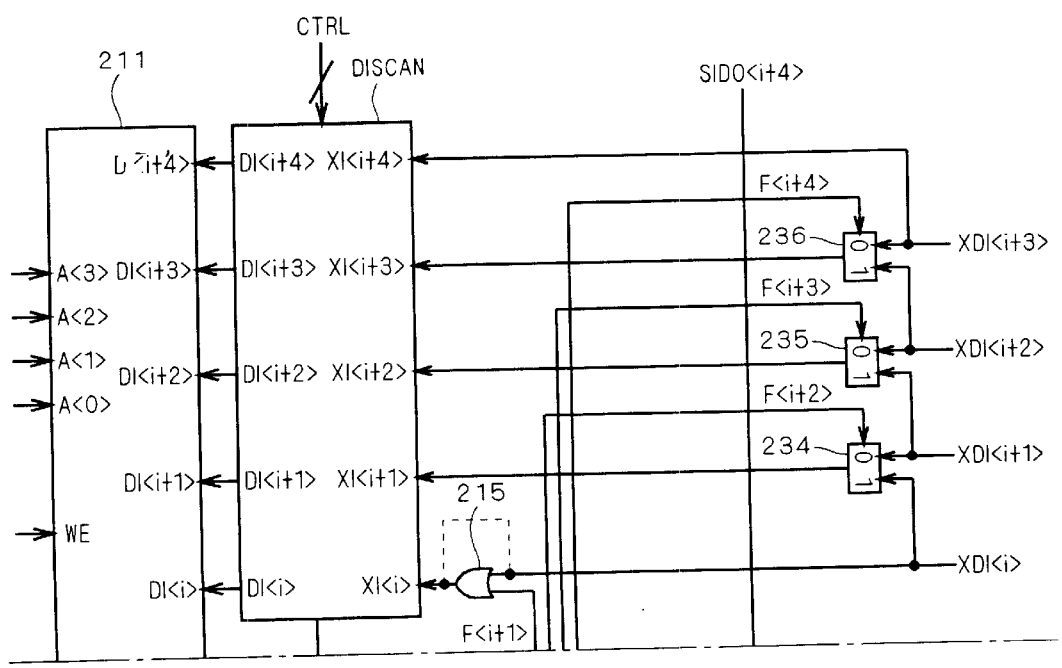

FIGS. 68 to 70 are diagrams showing a semiconductor integrated circuit according to a seventeenth embodiment of the present invention. FIG. 68 is a diagram illustrating a positional relationship between FIGS. 69 and 70, and FIGS. 69 and 70 are circuit diagrams showing a circuit structure of the semiconductor integrated circuit.

In the semiconductor integrated circuit according to the seventeenth embodiment, OR gates 94 to 99 are further added to the structure according to the twelfth embodiment.

As shown in these drawings, the OR gate 94 receives a signal SIDI <i+4> at one of inputs and receives a signal SMDIS at the other input, and an output thereof is sent to a "0" input of a selector 14.

The OR gates 95 to 99 receive a signal SOALL at inputs in common and receive serial outputs SOs <i> to <i+4> at the other inputs. An output of the OR gate 95 is sent to one of inputs of an AND gate 22, an output of each of the OR gates 96 to 98 is sent to one of inputs of each of AND gates 221 to 223, and an output of the OR gate 99 is sent to one of inputs of an AND gate 21. Since other structures are the same as those in the twelfth embodiment shown in FIGS. 51 to 53, description will be omitted.

In the seventeenth embodiment having such a structure, the FFDI <i> to the FFDI <i+4> can be caused to execute a data holding operation (HOLD state) by simple signal setting respectively in addition to the operation according to the twelfth embodiment.

More specifically, if SOALL="1", SMDIS="0", SMDIX="1" and a signal PFIN="1" are set, each FFDI < > can fetch its own Q output data at a D input in the same manner as in the sixteenth embodiment.

In the case in which the seventeenth embodiment is combined with the multiplexer section according to the thirteenth embodiment, the OR gates 95 to 99 and the OR gate ORM < > according to the thirteenth embodiment may be shared.

It is not necessary to always add the OR gate 95 used in an output signal PFOUT portion.

Others

While the redundancy-relieved data output XDO < > may be used directly as the output of the RAM subjected to the redundancy relief, the P output of the SFFC (SFFD, SFFE) < > may be used instead.

In the case in which the register REG for redundant control is provided, the Q output of the SFFC < > may be used (an FF in the SFFC is used as an output register).

In the case in which the P output and the Q output of the SFFC < > are used as the outputs of the RAM subjected to the redundancy relief, it is possible to obtain an advantage that a scan test can easily be carried out on a logic circuit connected thereto by using a scan path (from SIDO <i+4> to SODO <i>).

While the comparison suppressing functions to be controlled in response to the signal CMPE have been described in the embodiments of this specification, they are desirable but are not essential. In each of the embodiments, accordingly, the circuit may be changed to delete the comparison suppressing functions. More specifically, the gate circuit for the signal CMPE can be deleted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit comprising:
   a storing circuit for outputting output data having a first number of bits;
   a redundancy-relieved output selecting circuit for selecting output data having a second number of bits which are smaller than said first number of bits from said output data having said first number of bits in accordance with selection control data and for outputting redundancy-relieved output data having said second number of bits, said selection control data being switched based on a redundancy control signal during a redundancy relief operation; and
   a flip-flop group for inputting said redundancy-relieved output data having said second number of bits, said redundancy control signal being determined based on keeping data in said flip-flop group.

2. The semiconductor integrated circuit according to claim 1, further comprising:
   selection control data setting means for forcibly setting said selection control data of said redundancy-relieved output selecting circuit during a redundancy-relieved output selecting circuit test.

3. The semiconductor integrated circuit according to claim 2, wherein
   said flip-flop group includes a first number of flip-flops capable of executing a comparing operation for obtaining a result of comparison by comparing one of said redundancy-relieved output data and said output data having said first number of bits with expectation data,
   said first number of flip-flops includes a second number of flip-flops setting said redundancy-relieved output data having said second number of bits to said keeping data and a third number of flip-flops setting output data having a third number of bits out of said output data having said first number of bits to be said keeping data, and said third number of flip-flops has a number obtained by subtracting said second number of flip-flops from said first number of flip-flops.

4. The semiconductor integrated circuit according to claim 3, wherein
   said comparing operation is revoked during said redundancy-relieved output selecting circuit test in said third number of flip-flops.

5. The semiconductor integrated circuit according to claim 1, further comprising:
   switching information storing means provided between said flip-flop group and said redundancy-relieved output selecting circuit for storing a switching information.

6. The semiconductor integrated circuit according to claim 1, wherein
   said storing circuit has a first number of data input sections for fetching input data having said first number of bits,
   said semiconductor integrated circuit further comprising:
   a redundancy-relieved input selecting circuit for receiving redundancy-relieved input data having said second number of bits and for giving said redundancy-relieved input data having said second number of bits to a second number of data input sections out of said first number of data input sections based on said redundancy control signal during said redundancy relief operation.

7. The semiconductor integrated circuit according to claim 6, further comprising:
   selection control data setting means for forcibly setting said selection control data of said redundancy-relieved input selecting circuit during a redundancy-relieved input selecting circuit test.

8. The semiconductor integrated circuit according to claim 6, further comprising:
   a first number of data holding sections provided between said storing circuit and said redundancy-relieved input selecting circuit corresponding to said first number of data input sections, said first number of data holding sections being brought into a hold state in which said redundancy-relieved input selecting circuit holds redundancy-relieved input selecting circuit keeping data when said selection control data of said redundancy-relieved input selecting circuit is a predetermined selection control data.

9. The semiconductor integrated circuit according to claim 6, wherein said flip-flop group includes a first number of scan flip-flops provided corresponding to said output data having said first number of bits, said first number of scan flip-flops are connected in series from a first stage to a. last stage so that a shift operation of serial data can be carried out, said semiconductor integrated circuit further comprising:
a first number of data holding sections provided corresponding to said first number of data input sections and having a count function for counting said first number of data input sections by a serial operation; and control means for a storing circuit test for carrying out a 1-bit loop processing a first number of times in accordance with a count result obtained by said count function of said first number of data holding sections, in which test results of said output data having said first number of bits are held as keeping data of said first number of scan flip-flops and said first number of scan flip-flops are then caused to carry out said shift operation for 1-bit, thereby outputting serial output data of a scan flip-flop of said first number of scan flip-flops in said last stage to an outside and feeding back said serial output data as a serial data input of said scan flip-flop of said first number of scan flip-flops in said first stage during said storing circuit test.

10. The semiconductor integrated circuit according to claim 9, wherein a first number of data holding sections are brought into a hold state in which said redundancy-relieved input selecting circuit holds redundancy-relieved input selecting circuit keeping data, when said selection control data of said redundancy-relieved input selecting circuit is a predetermined selection control data.

11. The semiconductor integrated circuit according to claim 3, further comprising:

a first multiplexer section for classifying two or more output data of said first number of flip-flops having said first number of bits into a fourth number of first groups which is smaller than said second number and for outputting one of said output data of said flip-flops in said first groups as first selection output data based on a first selection signal obtained from an outside in said fourth number of said first groups, thereby outputting said first selection output data having a fourth number of bits.

12. The semiconductor integrated circuit according to claim 11, further comprising:

selection control data setting means for forcibly setting said selection control data of said redundancy-relieved output selecting circuit during a redundancy-relieved output selecting circuit test, wherein said selection control data setting means and said first multiplexer section partially sharing a component.

13. The semiconductor integrated circuit according to claim 11, further comprising:

a second multiplexer section for classifying two or more of said first selection output data having said fourth number of bits into a fifth number of second groups which is smaller than said fourth number and for outputting one of said first selection output data in said second groups as second selection output data based on a second selection signal obtained from said outside in said fifth number of said second groups, thereby outputting said second selection output data having a fifth number of bits.

* * * * *